United States Patent
Tang et al.

(10) Patent No.: US 10,844,163 B2
(45) Date of Patent: Nov. 24, 2020

(54) FUNCTIONAL SPIROCYCLIC POLYMERS AND METHODS OF PREPARATION THEREOF

(71) Applicant: The Hong Kong University of Science and Technology, Hong Kong (CN)

(72) Inventors: Benzhong Tang, Hong Kong (CN); Ting Han, Hong Kong (CN); Zijie Qiu, Hong Kong (CN)

(73) Assignee: The Hong Kong University of Science and Technology, Hong Kong (CN)

( * ) Notice: Subject to any disclaimer, the term of this patent is extended or adjusted under 35 U.S.C. 154(b) by 44 days.

(21) Appl. No.: 16/385,006

(22) Filed: Apr. 16, 2019

(65) Prior Publication Data

US 2019/0375886 A1    Dec. 12, 2019

Related U.S. Application Data

(60) Provisional application No. 62/763,283, filed on Jun. 11, 2018.

(51) Int. Cl.
*C08G 61/02* (2006.01)

(52) U.S. Cl.
CPC .......... *C08G 61/02* (2013.01); *C08G 2261/12* (2013.01); *C08G 2261/148* (2013.01); *C08G 2261/1426* (2013.01)

(58) Field of Classification Search
USPC ....................................................... 528/205
See application file for complete search history.

(56) References Cited

PUBLICATIONS

Meng Gao et. al. Stoichiometric imbalance-promoted synthesis of polymers containing highly substituted naphthalenes: rhodium-catalyzed oxidative polycoupling of arylboronic acids and internal diynes. Polym. Chem., 2013, 4, 1372-1380.

Meng Gao et.al. A new route to functional polymers: atom-economical synthesis of poly(pyrazolylnaphthalene)s by rhodium-catalyzed oxidative polycoupling of phenylpyrazole and internal diynes. Polym. Chem., 2013, 4, 2841-2849.

Ting Han et. al. Iridium-catalyzed polymerization of benzoic acids and internal diynes: a new route for constructing high molecular weight polynaphthalenes without the constraint of monomer stoichiometry. Polym. Chem., 2017, 8, 1393-1403.

Ting Han et. al. Monomer stoichiometry imbalance-promoted formation of multisubstituted polynaphthalenes by palladium-catalyzed polycouplings of aryl iodides and internal diynes. Polym. Chem., 2018, 9 ,885-893.

Songlin Gu et. al. Palladium(II)-Catalyzed Oxidative Dearomatization of Free Naphthols with Two Alkyne Units. Org. Lett. 2014, 16, 6132-6135.

*Primary Examiner* — Terressa Boykin
(74) *Attorney, Agent, or Firm* — Spruson & Ferguson (Hong Kong) Limited

(57) ABSTRACT

Provided herein are spirocyclic polymers that exhibit aggregation-enhanced emission properties and methods of preparation thereof. The spirocyclic polymers can be used in the construction of integrated silicon photonics and to prepare two-dimensional fluorescent photopatterns useful for the manufacture of biological sensing and probing systems, optical writing and reading, anti-counterfeiting applications and the construction of optical display devices.

20 Claims, 65 Drawing Sheets

Scheme 1.

Table 1.

| entry | catalyst | loading (%) | yield (%) | $M_w^b$ | $M_w/M_n^b$ |
|---|---|---|---|---|---|
| 1 | Pd(OAc)$_2$ | 10 | 25 | 4 300 | 1.2 |
| 2 | Pd(dppf)Cl$_2$·CH$_2$Cl$_2$ | 10 | 27 | 3 900 | 1.2 |
| 3 | Pd(PPh$_3$)$_2$Cl$_2$ | 10 | 30 | 4 300 | 1.2 |
| 4 | Pd(OAc)$_2$ | 5 | 4 | 3 300 | 1.1 |
| 5 | Pd(OAc)$_2$ | 20 | 44 | 5 400 | 1.4 |

FIG. 4

Table 2.

| entry | solvent | temp (°C) | yield (%) | $M_w^b$ | $M_w/M_n^b$ |
|---|---|---|---|---|---|
| 1$^c$ | DMSO | 120 | 44 | 5 400 | 1.4 |
| 2$^d$ | DMSO/H$_2$O$^d$ | 120 | 6 | 3 700 | 1.2 |
| 3 | DMF | 100 | 14 | 3 800 | 1.1 |
| 4 | NMP | 120 | 31 | 4 000 | 1.3 |
| 5 | o-xylene | 140 | 7 | 4 300 | 1.2 |

FIG. 5

Table 3.

| entry | [1a] : [2a] | yield (%) | $M_w^b$ | $M_w/M_n^b$ |
|---|---|---|---|---|
| 1 | 0.75:1 | 39 | 4 400 | 1.2 |
| 2$^c$ | 1:1 | 44 | 5 400 | 1.4 |
| 3 | 2:1 | 78 | 10 600 | 1.6 |
| 4 | 3:1 | 82 | 14 700 | 1.8 |
| 5 | 4:1 | 99 | 21 300 | 1.8 |

FIG. 6

Table 4.

| entry | [K$_2$CO$_3$] (M) | [Cu(OAc)$_2$·H$_2$O] (M) | yield (%) | $M_w^b$ | $M_w/M_n^b$ |
|---|---|---|---|---|---|
| 1 | 0 | 0.84 | 69 | 6 500 | 1.4 |
| 2 | 0.80 | 0.42 | 30 | 4 500 | 1.2 |
| 3$^c$ | 0.80 | 0.84 | 99 | 21 300 | 1.8 |
| 4 | 0.80 | 1.00 | 93 | 16 800 | 1.9 |

FIG. 7

Table 5.

| entry | [2a] (M) | yield (%) | $M_w^b$ | $M_w/M_n^b$ |
|---|---|---|---|---|
| 1 | 0.10 | 73 | 6 800 | 1.4 |
| 2$^c$ | 0.20 | 99 | 21 300 | 1.8 |
| 3 | 0.40 | 83 | 22 100 | 1.8 |

FIG. 8

Table 6.

| entry | time (h) | yield (%) | $M_w^b$ | $M_w/M_n^b$ |
|---|---|---|---|---|
| 1 | 0.25 | 76 | 21,000 | 2.2 |
| 2 | 0.75 | 87 | 22,500 | 2.4 |
| 3 | 1 | 88 | 20,700 | 2.1 |
| 4 | 3 | 89 | 25,300 | 2.3 |
| 5 | 6 | 92 | 23,200 | 2.2 |
| 6 | 12 | 96 | 20,800 | 1.9 |
| 7 | 18 | 96 | 19,700 | 1.8 |
| $8^c$ | 24 | 99 | 21,300 | 1.8 |

FIG. 9

Table 7.

| entry | monomer | yield (%) | $M_w^b$ | $M_w/M_n^b$ |
|---|---|---|---|---|
| $1^c$ | 1a+2a | 99 | 21300 | 1.8 |
| 2 | 1a+2b | 95 | 24400 | 1.9 |
| 3 | 1a+2c | 42 | 14300 | 1.5 |
| 4 | 1a+2d | 87 | 7300 | 1.5 |
| 5 | 1a+2e | 87 | 9900 | 1.7 |
| 6 | 1b+2a | 95 | 10300 | 1.9 |

FIG. 10

Table 8.

| no. | polymer | t (min) | $n_{632.8}$ | $n_{1550}$ | $v_D$ | $v_D'$ | $D$ | $D'$ |
|---|---|---|---|---|---|---|---|---|
| 1 | P1a/2a | 0 | 1.6526 | 1.6158 | 13.4 | 93.1 | 0.075 | 0.011 |
| 2 | P1a/2b | 0 | 1.6649 | 1.6338 | 13.9 | 129.7 | 0.072 | 0.008 |
| 3 | P1a/2c | 0 | 1.6407 | 1.5733 | 11.8 | 36.0 | 0.085 | 0.028 |
| 4 | P1a/2d | 0 | 1.6820 | 1.6288 | 10.0 | 64.5 | 0.100 | 0.016 |
| 5 | P1a/2e | 0 | 1.6896 | 1.6468 | 10.1 | 101.0 | 0.099 | 0.010 |
| 6 | P1b/2a | 0 | 1.6739 | 1.6311 | 14.2 | 72.5 | 0.071 | 0.014 |
| 7 | P1a/2a | 10 | 1.6337 | 1.6011 | 16.9 | 91.9 | 0.059 | 0.011 |
| 8 | P1a/2a | 20 | 1.6310 | 1.5913 | 15.9 | 69.2 | 0.063 | 0.014 |
| 9 | P1a/2a | 30 | 1.6232 | 1.5885 | 17.5 | 79.6 | 0.057 | 0.013 |
| 10 | P1a/2a | 40 | 1.6090 | 1.5790 | 17.5 | 97.2 | 0.057 | 0.010 |

FIG. 37

FUNCTIONAL SPIROCYCLIC POLYMERS AND METHODS OF PREPARATION THEREOF

CROSS-REFERENCE TO RELATED APPLICATIONS

This application claims the benefit of priority of U.S. Provisional Application No. 62/763,283, filed on Jun. 11, 2018, the contents of which being hereby incorporated by reference in their entirety for all purposes.

TECHNICAL FIELD

The present disclosure generally rates to a polymerization method for the synthesis of spirocyclic polymers and the products thereof. The polymers described herein exhibit good solubility, high thermal and morphological stability, aggregation-enhanced emission, and high and UV-tunable light refraction. The polymers described herein can be used in the construction of integrated silicon photonics and to prepare two-dimensional fluorescent photopatterns.

BACKGROUND

Step polymerizations are of great historical significance and have played an indispensable role in polymer synthesis research and development. While step polymerizations have enjoyed considerable use in industry, there are still two fundamental issues that continue to limit their application: (1) the need for difunctional monomers and (2) the need for strict control of monomer stoichiometric balance between two difunctional monomers ($A_2+B_2$, where A and B are mutually-reactive groups) to produce high molecular weight polymers with good performance.

In comparison to the ready commercial availability of varied monofunctional compounds, difunctional monomers are much more limited and more difficult to be prepared. The limited variety, high cost, and synthetic challenge of preparing difunctional monomers have made them a hindrance to the rapid development of new step polymerizations.

If readily available compounds with only one functional group could be employed two-component polymerizations, it would alleviate at least some of the problems of difunctional monomers to some extent. However, the fundamental reaction mechanism of step-polymerizations requires that the number of functional groups in one monomer must be at least two. One possible strategy to tackle this challenge is employing a "hidden" functional group in one monomer as the reactive site. As C—H bonds are ubiquitous in various organic molecules, it would be desirable if the C—H bond can serve as one reactive site or a "hidden" functional group in situ in a polymerization.

According to the classical Carothers-Flory theory, strict stoichiometric balance control of the two monomer components is a critical factor to achieving high molecular weight polymers in $A_2+B_2$ step polymerizations. This requirement is very hard to satisfy in practice due to side reactions, chain-transfer processes, impurities in monomers and solvents, evaporation or decomposition of monomers, precipitation of polymer segments, etc. Polymer scientists have devoted great endeavors to overcome this fundamental long-standing issue of step-wise polymerizations. One attractive strategy is to develop nonstoichiometric step polymerizations, which are tolerant to the mismatched functional group stoichiometry.

Improved step polymerizations could be used to prepare novel polymer materials with useful physical, chemical, and optical properties. Solution processable polymers with high refractive index and low chromatic dispersions are promising candidate materials in numerous applications, such as image sensors, windowpanes, lens, prisms, waveguides, and optical eyewear. Fluorescent conjugated polymers with good thin-film forming properties and photosensitivity are promising materials for use in the fabrication of fluorescent photopatterns using photolithography techniques.

There is thus a need to develop improved methods for step polymerizations that overcome at least some of the aforementioned problems and can be used in the preparation of functional polymers having useful physical, chemical, and optical properties.

SUMMARY

The present disclosure relates to a polymerization method of monofunctional monomers with diynes and the polymers prepared therefrom. The polymers described herein can exhibit good solubility, high thermal and morphological stability, aggregation-enhanced emission, and high and UV-tunable light refraction In a first aspect, provided herein is a polymer comprising at least one repeating unit selected from the group consisting of:

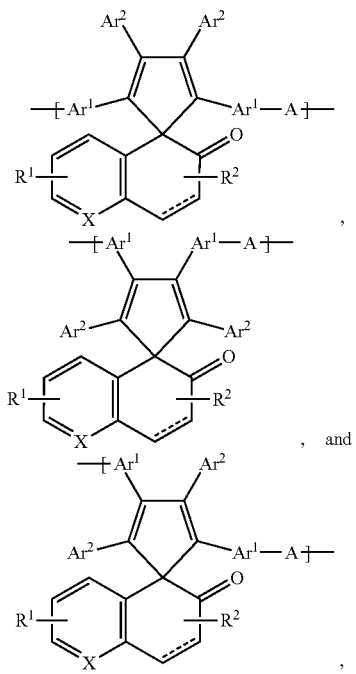

or a salt thereof, wherein A is selected from the group consisting of:

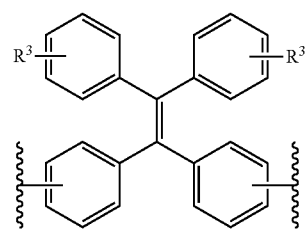

-continued
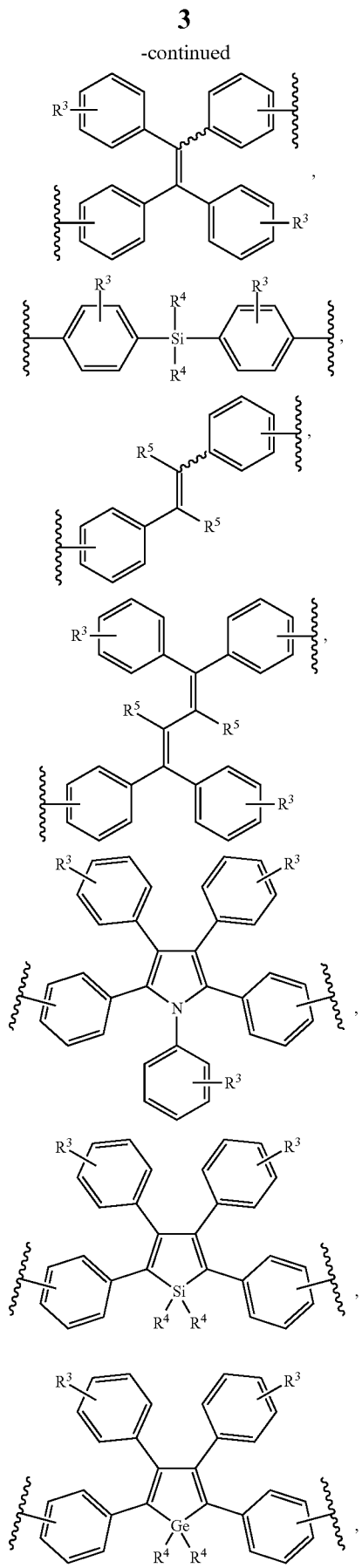
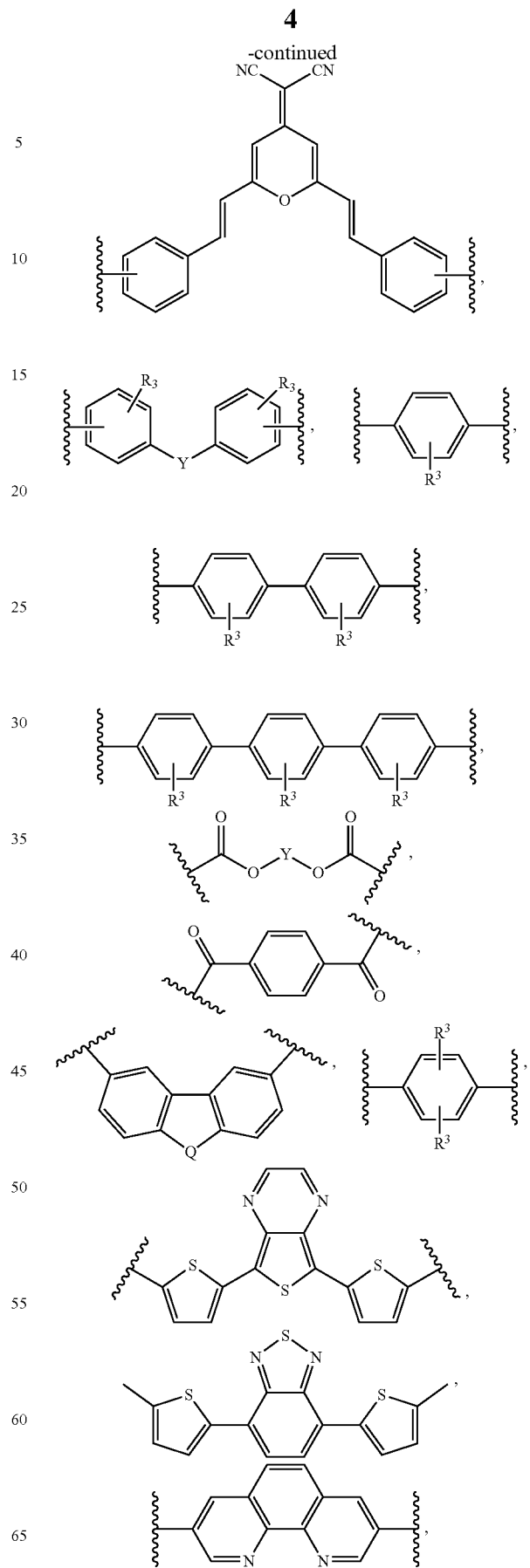

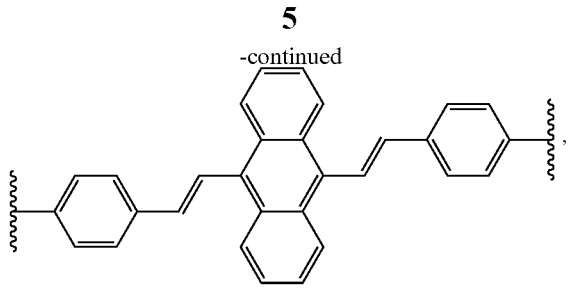

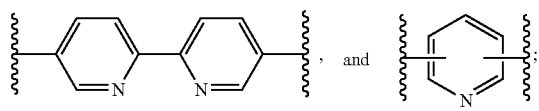

X is N or CR¹;

Y is —(CH$_2$)$_m$—, —(CH$_2$)$_m$O—, or —O(CH$_2$)$_m$O—, wherein m is a whole number selected from 1-10;

Q is —CH$_2$—, —O—, —S—, —(C═O)—, —N(R')—;

Ar¹ and Ar² are independently aryl or heteroaryl;

R¹ is selected from the group consisting of H, halide, nitro, cyano, —OR⁴, —SR⁴, —N(R⁴)$_2$, —CHO, —CO$_2$R⁴, —CON(R⁴)$_2$, alkyl, perhaloalkyl, alkene, alkyne, cycloalkyl, heterocyclyl, aryl, and heteroaryl;

R² is selected from the group consisting of H, halide, nitro, cyano, —OR⁴, —SR⁴, —N(R⁴)$_2$, —CHO, —CO$_2$R⁴, —CON(R⁴)$_2$, alkyl, perhaloalkyl, alkene, alkyne, cycloalkyl, heterocyclyl, aryl, and heteroaryl;

R³ for each instance is independently H, halide, nitro, cyano, —OR⁴, —SR⁴, —SO$_2$R⁴, —N(R⁴)$_2$, —CHO, —CO$_2$R⁴, —CON(R⁴)$_2$, alkyl, alkene, alkyne, cycloalkyl, heterocyclyl, aryl, heteroaryl, diphenylamine, 4-(4-diphenylamino)-phenyl; and R⁴ for each instance is independently H, alkyl, cycloalkyl, heterocyclyl, aryl, or heteroaryl; or 2 two instances of R⁴ taken together with the nitrogen to which they are attached form a 3-6 membered heterocyclyl.

In a first embodiment of the first aspect, provided herein is the polymer of the first aspect, wherein the at least one repeating unit is selected from the group consisting of:

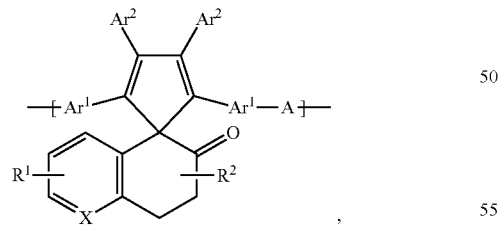

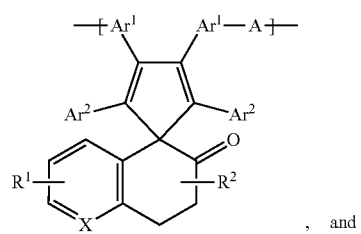

and

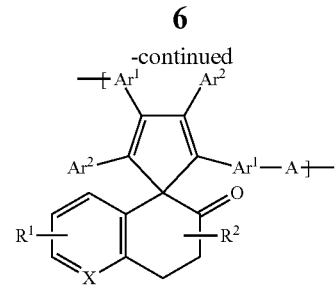

In a second embodiment of the first aspect, provided herein is the polymer of the first aspect, wherein Ar¹ and Ar² are independently aryl.

In a third embodiment of the first aspect, provided herein is the polymer of the first aspect, wherein R¹ is H, halide, nitro, cyano, —CO$_2$R⁴, alkyl, cycloalkyl, heterocyclyl, aryl, and heteroaryl.

In a fourth embodiment of the first aspect, provided herein is the polymer of the first aspect, wherein A is:

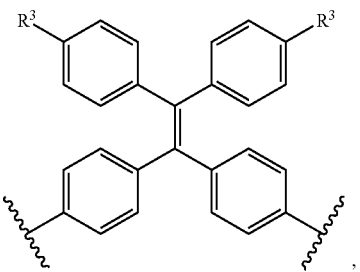

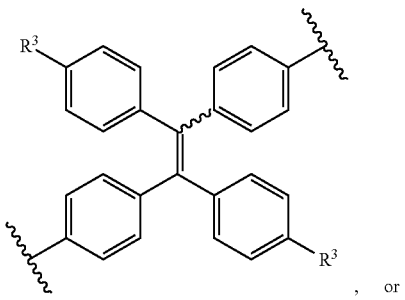, or

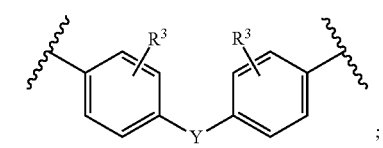;

and

R³ for each instance is independently selected from the group consisting of H, halide, nitro, cyano, —OR⁴, —SR⁴, —SO$_2$R⁴, —N(R⁴)$_2$, —CHO, —CO$_2$R⁴, alkyl, cycloalkyl, heterocyclyl, aryl, or heteroaryl.

In a fifth embodiment of the first aspect, provided herein is the polymer of the first aspect, wherein the polymer comprises the repeating unit:

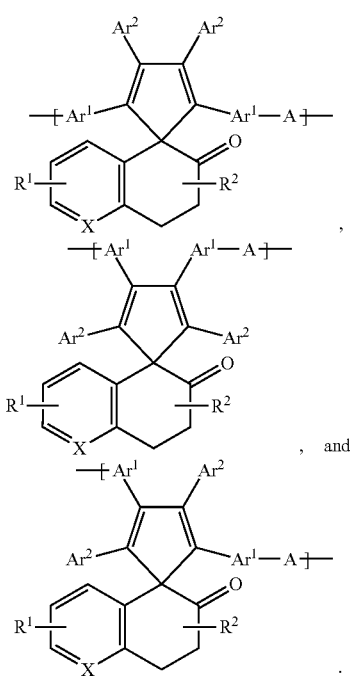

In a sixth embodiment of the first aspect, provided herein is the polymer of the fifth embodiment of the first aspect, wherein $R^2$ is H; A is:

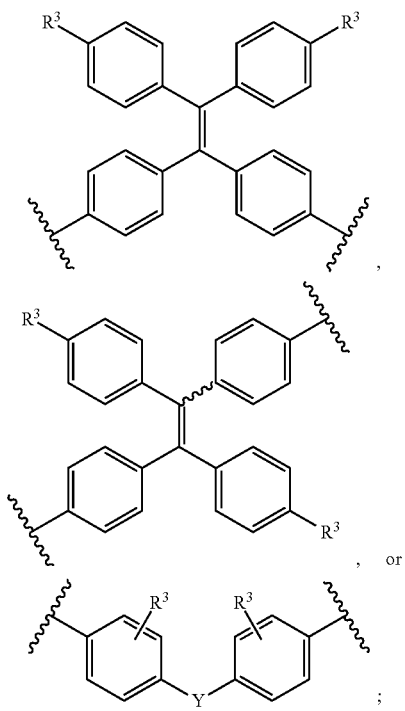

and $R^3$ for each instance is independently selected from the group consisting of H, halide, nitro, cyano, —OR$^4$, —SR$^4$, —SO$_2$R$^4$, —N(R$^4$)$_2$, —CHO, —CO$_2$R$^4$, alkyl, cycloalkyl, heterocyclyl, aryl, or heteroaryl.

In a seventh embodiment of the first aspect, provided herein is the polymer of the sixth embodiment of the first aspect, wherein Ar$^2$ is aryl and R$^1$ is H, halide, nitro, cyano, alkyl, cycloalkyl, heterocyclyl, aryl, and heteroaryl.

In an eighth embodiment of the first aspect, provided herein is the polymer of the first aspect, wherein the polymer comprises the repeating unit:

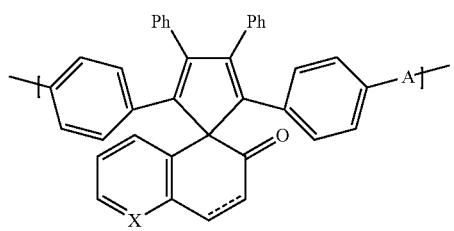

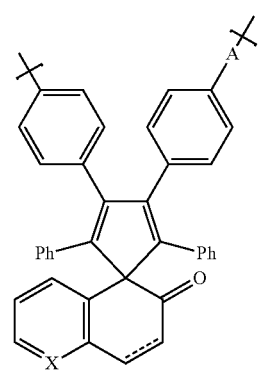

and

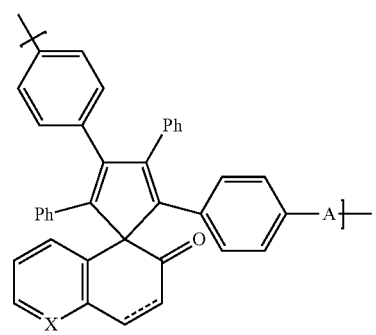

wherein X is N or CH;
A is

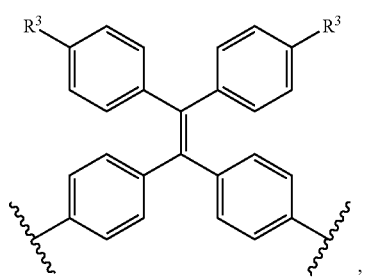

-continued

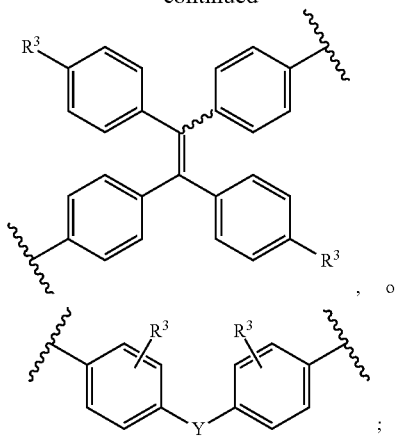
, or

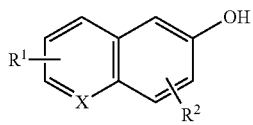
;

and

R³ for each instance is independently selected from the group consisting of H, halide, nitro, cyano, —OR⁴, —SR⁴, —SO₂R⁴, —N(R⁴)₂, —CHO, —CO₂R⁴, alkyl, cycloalkyl, heterocyclyl, aryl, or heteroaryl.

In a ninth embodiment of the first aspect, provided herein is the polymer of the eighth embodiment of the first aspect, wherein $R^3$ is H.

In a tenth embodiment of the first aspect, provided herein is the polymer of the first aspect, wherein the polymer has an average molecular weight of 2,000 to 100,000 amu.

In a second aspect, provided herein is a two-dimensional fluorescent photopattern comprising at least one polymer of the first aspect.

In a third aspect, provided herein is a method of preparing a polymer of the first aspect comprising:

a. contacting a compound of Formula IA:

$$\text{IA}$$

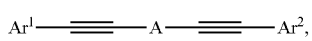

or a conjugate salt thereof, wherein

X is N or CR¹;

R¹ is selected from the group consisting of H, halide, nitro, cyano, —OR⁴, —SR⁴, —N(R⁴)₂, —CHO, —CO₂R⁴, —CON(R⁴)₂, alkyl, alkene, alkyne, cycloalkyl, heterocyclyl, aryl, and heteroaryl;

R² is selected from the group consisting of H, halide, nitro, cyano, —OR⁴, —SR⁴, —N(R⁴)₂, —CHO, —CO₂R⁴, —CON(R⁴)₂, alkyl, perhaloalkyl, alkene, alkyne, cycloalkyl, heterocyclyl, aryl, and heteroaryl; and R⁴ for each instance is independently H, alkyl, cycloalkyl, heterocyclyl, aryl, or heteroaryl; or 2 two instances of R⁴ taken together with the nitrogen to which they are attached form a 3-6 membered heterocyclyl;

with a compound of Formula IB:

$$\text{Ar}^1-\!\!\equiv\!\!-A-\!\!\equiv\!\!-\text{Ar}^2, \quad \text{IB}$$

wherein

A is selected from the group consisting of:

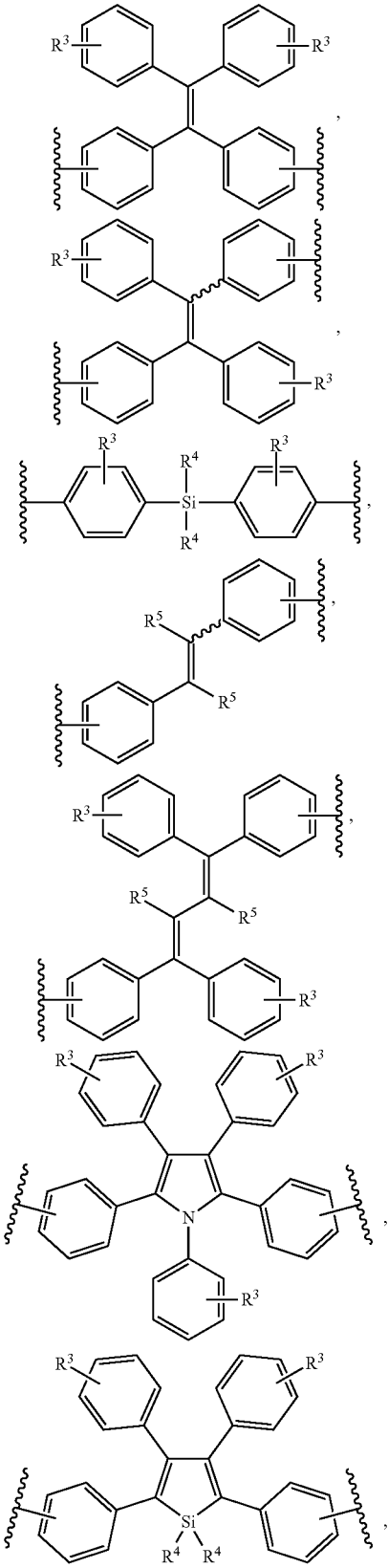

-continued

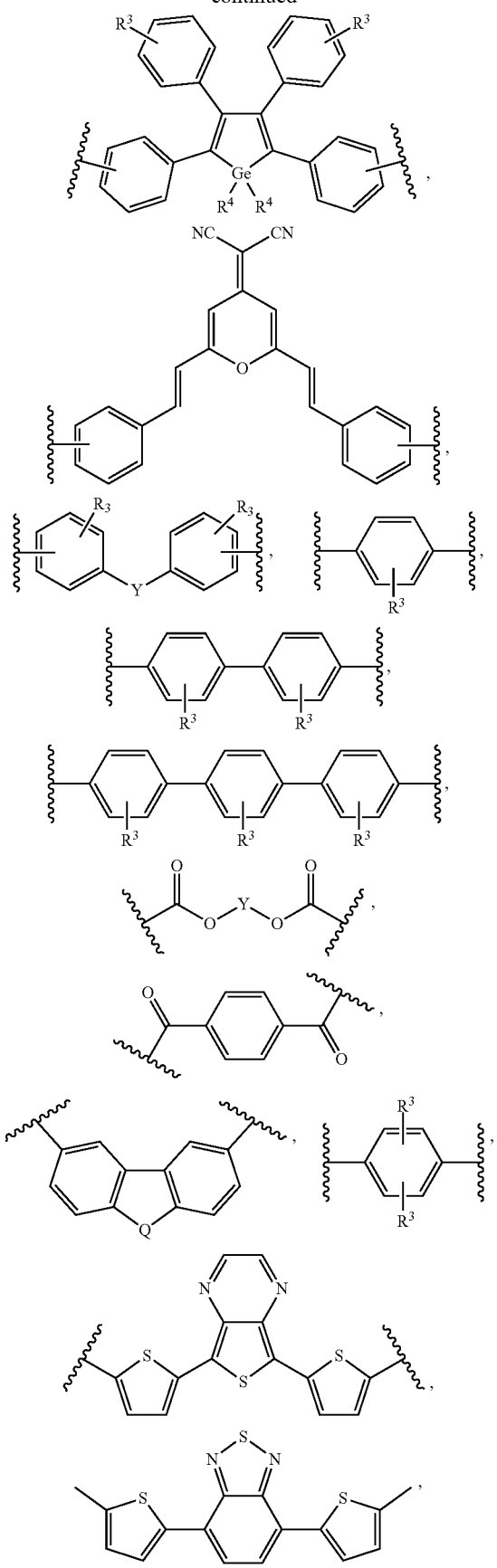

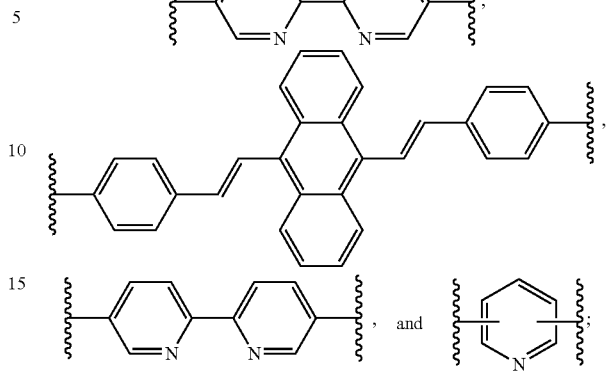

Y is —(CH$_2$)$_m$—, —(CH$_2$)$_m$O—, or —O(CH$_2$)$_m$O—, wherein m is a whole number selected from 2-10;

Ar$^1$ and Ar$^2$ are independently aryl or heteroaryl; and

R$^3$ for each instance is independently H, halide, nitro, cyano, —OR$^4$, —SR$^4$, —SO$_2$R$^4$, —N(R$^4$)$_2$, —CHO, —CO$_2$R$^4$, —CON(R$^4$)$_2$, alkyl, alkene, alkyne, cycloalkyl, heterocyclyl, aryl, heteroaryl, diphenylamine, 4-(4-diphenylamino)-phenyl; and a palladium species thereby forming an unsaturated spirocyclic polymer; and b. optionally contacting the unsaturated spirocyclic polymer with a reducing agent thereby forming a polymer of the first aspect.

In a first embodiment of the third aspect, provided herein is the method of the third aspect, wherein A is:

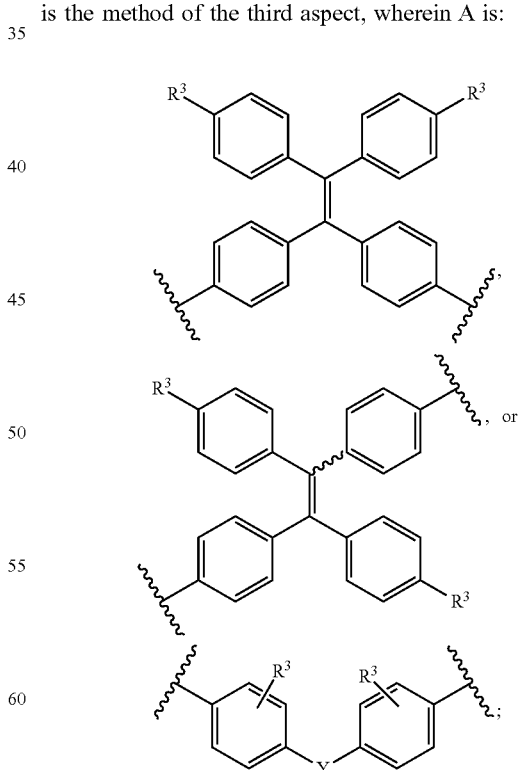

and

R$^3$ for each instance is independently selected from the group consisting of H, halide, nitro, cyano, —OR$^4$, —SR$^4$, —$SO_2R^4$, —$N(R^4)_2$, —CHO, —$CO_2R^4$, alkyl, cycloalkyl, heterocyclyl, aryl, or heteroaryl.

In a second embodiment of the third aspect, provided herein is the method of the third aspect, wherein $Ar^1$ and $Ar^2$ are independently aryl.

In a third embodiment of the third aspect, provided herein is the method of the first embodiment of the third aspect, wherein the compound of Formula IB is 2-naphthol or 6-hydroxyquinoline or a conjugate salt thereof.

In a fourth embodiment of the third aspect, provided herein is the method of the third aspect, wherein the step of contacting the compound of Formula IA, Formula IB, and the palladium species occurs in the presence of a base.

In a fifth embodiment of the third aspect, provided herein is the method of the third aspect, wherein the palladium species is present in a catalytic amount and the step of contacting the compound of Formula IA, Formula IB, and the palladium species occurs in the presence of an oxidant.

In a sixth embodiment of the third aspect, provided herein is the method of the third aspect, wherein the compound of Formula IA is present in a molar excess relative to the compound of Formula IB.

In a seventh embodiment of the third aspect, provided herein is the method of the sixth embodiment of the third aspect, wherein the compound of Formula IA and the compound of Formula IB are present in a molar ratio of 2:1 to 10:1.

The present disclosure generally relates to a monomer non-stoichiometry-favored polymerization method of monofunctional monomers with diynes for the synthesis of functional spirocyclic polymers through C—H functionalization [Scheme 2 (FIG. 2)]. The polymerizations of free naphthols and internal diynes can proceed smoothly in DMSO at 120° C. in the presence of Pd(OAc)$_2$, Cu(OAc)$_2$.H$_2$O and K$_2$CO$_3$, producing spirocyclic polymers with high molecular weights of up to 24,400 in high yields (isolation yield up to 99%). The polymerization efficiency can be significantly improved by adding excess naphthol monomers.

The obtained polymers can be thermally and morphologically stable, and can show good solubility and film-forming properties. Their thin films can exhibit high and UV-tunable refractive indices in a wavelength region of 380-890 nm. The polymers described herein can show aggregation-enhanced emission properties and their solid powder exhibit obvious fluorescence under UV irradiation.

By taking advantage of the good photosensitivity and unique fluorescent properties of the polymers described herein, well-resolved two-dimensional fluorescent photopatterns with different modes can be readily fabricated from the polymer thin films.

BRIEF DESCRIPTION OF FIGURES

The above and other objects and features of the present disclosure will become apparent from the following description of the present invention, when taken in conjunction with the accompanying drawings, in which:

FIG. 4 depicts Table 1 that provides data for the effect of the catalyst on the polymerization$^a$ of 1a and 2a. $^a$Carried out in DMSO under nitrogen at 120° C. for 24 h in the presence of palladium catalyst, Cu(OAc)$_2$.H$_2$O and K$_2$CO$_3$. [1a]=[2a]=0.20 M, [Cu]=0.84 M, [K$_2$CO$_3$]=0.80 M. $^b$Determined by GPC in THF on the basis of a linear polystyrene calibration.

FIG. 5 depicts Table 2 that provides data for the effect of solvent on the polymerization$^a$ of 1a and 2a. $^a$Carried out under nitrogen at 120° C. for 24 h in the presence of Pd(OAc)$_2$, Cu(OAc)$_2$.H$_2$O and K$_2$CO$_3$. [1a]=[2a]=0.20 M, [Pd]=0.04 M, [Cu]=0.84 M, [K$_2$CO$_3$]=0.80 M. DMSO=dimethyl sulfoxide; DMF=dimethylformamide; NMP=N-methyl-2-pyrrolidone. $^b$ Determined by GPC in THF on the basis of a linear polystyrene calibration. $^c$Data taken from Table 1 (FIG. 4), entry 5. $^d$4:1 by volume.

FIG. 6 depicts Table 3 that provides data for the effect of monomer ratio on the polymerization$^a$ of 1a and 2a. $^a$Carried out in DMSO under nitrogen at 120° C. for 24 h in the presence of Pd(OAc)$_2$, Cu(OAc)$_2$.H$_2$O and K$_2$CO$_3$. [2a]=0.20 M, [Pd]=0.04 M, [Cu]=0.84 M, [K$_2$CO$_3$]=0.80 M. $^b$Determined by GPC in THF on the basis of a linear polystyrene calibration. $^c$Data taken from Table 1 (FIG. 4), entry 5.

FIG. 7 depicts Table 4 that provides data for the effect of additive and oxidant loading on the polymerization$^a$ of 1a and 2a. $^a$Carried out in DMSO under nitrogen at 120° C. for 24 h in the presence of Pd(OAc)$_2$, Cu(OAc)$_2$.H$_2$O. [1a]=0.80 M, [2a]=0.20 M, [Pd]=0.04 M. $^b$Determined by GPC in THF on the basis of a linear polystyrene calibration. $^c$Data taken from Table 3 (FIG. 6), entry 5.

FIG. 8 depicts Table 5 that provides data for the effect of monomer concentration on the polymerization$^a$ of 1a and 2a. $^a$Carried out in DMSO under nitrogen at 120° C. for 24 h in the presence of Pd(OAc)$_2$, Cu(OAc)$_2$.H$_2$O and K$_2$CO$_3$. [1a]=4[2a], [Pd]=0.2[2a], [Cu]=4.2[2a], [K$_2$CO$_3$]=4[2a]. $^b$Determined by GPC in THF on the basis of a linear polystyrene calibration. $^c$Data taken from Table 3 (FIG. 6), entry 5.

FIG. 9 depicts Table 6 that provides data for the time course on the polymerization$^a$ of 1a and 2a. $^a$Carried out in DMSO under nitrogen at 120° C. in the presence of Pd(OAc)$_2$, Cu(OAc)$_2$.H$_2$O and K$_2$CO$_3$. [1]=0.80 M, [2]=0.20 M, [Pd]=0.04 M, [Cu]=0.84 M, [K$_2$CO$_3$]=0.80 M. $^b$Determined by GPC in THF on the basis of a linear polystyrene calibration. $^c$Data taken from Table 3 (FIG. 6), entry 5.

FIG. 10 depicts Table 7 that provides data for the polymerizations' of different monomer combinations. $^a$Carried out in DMSO under nitrogen at 120° C. for 24 h in the presence of Pd(OAc)$_2$, Cu(OAc)$_2$.H$_2$O and K$_2$CO$_3$. [1]=0.80 M, [2]=0.20 M, [Pd]=0.04 M, [Cu]=0.84 M, [K$_2$CO$_3$]=0.80 M. $^b$Determined by GPC in THF on the basis of a linear polystyrene calibration. $^c$Data taken from Table 3 (FIG. 6), entry 5.

FIG. 37 depicts Table 8 that shows refractive indices and chromatic dispersions of P1/2. $^a$Samples taken from Table 1, entries 6-11. Abbreviation: t=UV irradiation time, n=refractive index, $v_D$=Abbé number=$(n_D-1)/(n_F-n_C)$, where $n_D$, $n_F$, and $n_C$ are then values at wavelengths of Fraunhofer D, F, and C spectral lines of 589.2, 486.1, and 656.3 nm, respectively; $v_D'$=modified Abbé number=$(n_{1319}-1)/(n_{1064}-n_{1550})$, where $n_{1319}$, $n_{1064}$, and $n_{1550}$ are the n values at 1319, 1064, and 1550 nm, respectively. The wavelengths of 1319 and 1064 nm are chosen in view of the practical interest of a commercial laser wavelength (Nd:YAG), while 1550 nm is chosen due to its telecommunication importance. D=chromatic dispersion in the visible region=$1/v_D$. D'=chromatic dispersion in the IR region=$1/v_D'$.

FIG. 47 depicts the IR spectra of exemplary polymers: (A) telechelic polymer P1a/2a, (B) 1c, and (C) P1ac/2a.

FIG. 50 depicts the IR spectra of exemplary polymers: (A) telechelic polymer P1a/2a, (B) 1d, and (C) P1ad/2a.

DETAILED DESCRIPTION

Figure 1:
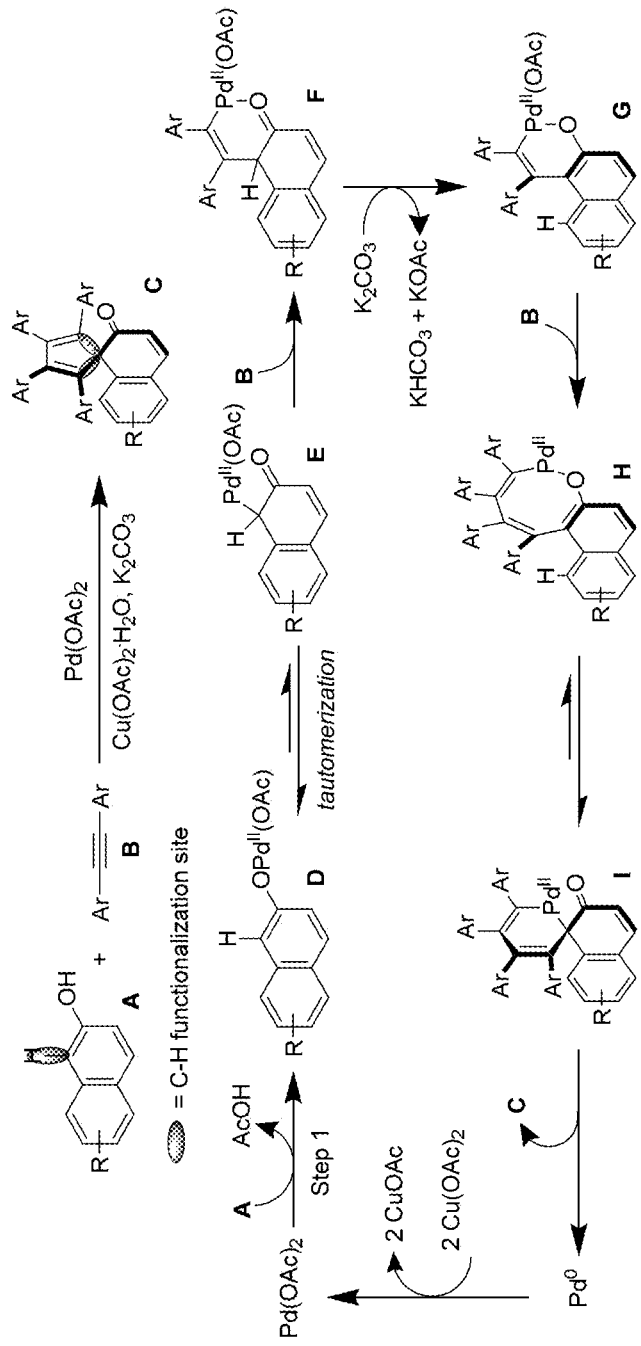
FIG. 1 depicts Scheme 1 that shows an exemplary reaction scheme for the palladium(II)-catalyzed oxidative spiroannulations of naphthols and diarylacetylenes and a possible mechanism.

The following detailed description is provided to aid those skilled in the art in practicing the present invention. However, the following detailed description should not be constructed to unduly limit the present invention. Variations and modifications in the embodiments discussed may be made by these of ordinary skill in the art without departing from the scope of the present inventive discovery.

Definitions

The definitions of terms used herein are meant to incorporate the present state-of-the-art definitions recognized for each term in the chemical and semiconductor fields. Where appropriate, exemplification is provided. The definitions apply to the terms as they are used throughout this specification, unless otherwise limited in specific instances, either individually or as part of a larger group.

The term "heteroatom" is art-recognized and refers to an atom of any element other than carbon or hydrogen. Illustrative heteroatoms include boron, nitrogen, oxygen, phosphorus, sulfur and selenium.

The term "alkyl" is art-recognized, and includes saturated aliphatic groups, including straight-chain alkyl groups, branched-chain alkyl groups, and cycloalkyl substituted alkyl groups. In certain embodiments, a straight chain or branched chain alkyl has about 30 or fewer carbon atoms in its backbone (e.g., $C_1$-$C_{30}$ for straight chain, $C_3$-$C_{30}$ for branched chain), and alternatively, about 20 or fewer.

The term "cycloalkyl" as used by itself or as part of another substituent means, unless otherwise stated, a monocyclic hydrocarbon having between 3-12 carbon atoms in the ring system and includes hydrogen, straight chain, branched chain, and/or cyclic substituents. Exemplary cycloalkyls include cyclopropyl, cyclobutyl, cyclopentyl, cyclohexyl, cycloheptyl, and the like.

Unless the number of carbons is otherwise specified, "lower alkyl" refers to an alkyl group, as defined above, but having from one to about ten carbons, alternatively from one to about six carbon atoms in its backbone structure. Likewise, "lower alkenyl" and "lower alkynyl" have similar chain lengths.

The term "aralkyl" is art-recognized and refers to an alkyl group substituted with an aryl group (e.g., an aromatic or heteroaromatic group).

The terms "alkenyl" and "alkynyl" are art-recognized and refer to unsaturated aliphatic groups analogous in length and possible substitution to the alkyls described above, but that contain at least one double or triple bond respectively.

The term "aryl" is art-recognized and refers to 5-, 6- and 7-membered single-ring aromatic groups that may include from zero to four heteroatoms, for example, benzene, naphthalene, anthracene, pyrene, and the like. Those aryl groups having heteroatoms in the ring structure may also be referred to as "heteroaryls" or "heteroaromatics." The aromatic ring may be substituted at one or more ring positions with such substituents as described above, for example, halogen, azide, alkyl, aralkyl, alkenyl, alkynyl, cycloalkyl, hydroxyl, alkoxyl, amino, nitro, sulfhydryl, imino, amido, phosphonate, phosphinate, carbonyl, carboxyl, silyl, ether, alkylthio, sulfonyl, sulfonamido, ketone, aldehyde, ester, heterocyclyl, aromatic or heteroaromatic moieties, —$CF_3$, —CN, or the like. The term "aryl" also includes polycyclic ring systems having two or more cyclic rings in which two or more carbons are common to two adjoining rings (the rings are "fused rings") wherein at least one of the rings is aromatic, e.g., the other cyclic rings may be cycloalkyls, cycloalkenyls, cycloalkynyls, aryls and/or heterocyclyls.

The terms ortho, meta and para are art-recognized and refer to 1,2-, 1,3- and 1,4-disubstituted benzenes, respectively. For example, the names 1,2-dimethylbenzene and ortho-dimethylbenzene are synonymous.

The terms "heterocyclyl", "heteroaryl", or "heterocyclic group" are art-recognized and refer to 3- to about 10-membered ring structures, alternatively 3- to about 7-membered rings, whose ring structures include one to four heteroatoms. Heterocycles may also be polycycles. Heterocyclyl groups include, for example, thiophene, thianthrene, furan, pyran, isobenzofuran, chromene, xanthene, phenoxanthene, pyrrole, imidazole, pyrazole, isothiazole, isoxazole, pyridine, pyrazine, pyrimidine, pyridazine, indolizine, isoindole, indole, indazole, purine, quinolizine, isoquinoline, quinoline, phthalazine, naphthyridine, quinoxaline, quinazoline, cinnoline, pteridine, carbazole, carboline, phenanthridine, acridine, pyrimidine, phenanthroline, phenazine, phenarsazine, phenothiazine, furazan, phenoxazine, pyrrolidine, oxolane, thiolane, oxazole, piperidine, piperazine, morpholine, lactones, lactams such as azetidinones and pyrrolidinones, sultams, sultones, and the like. The heterocyclic ring may be substituted at one or more positions with such substituents as described above, as for example, halogen, alkyl, aralkyl, alkenyl, alkynyl, cycloalkyl, hydroxyl, amino, nitro, sulfhydryl, imino, amido, phosphonate, phosphinate, carbonyl, carboxyl, silyl, ether, alkylthio, sulfonyl, ketone, aldehyde, ester, a heterocyclyl, an aromatic or heteroaromatic moiety, —CF$_3$, —CN, or the like.

The term "optionally substituted" refers to a chemical group, such as alkyl, cycloalkyl aryl, and the like, wherein one or more hydrogen may be replaced with a with a substituent as described herein, for example, halogen, azide, alkyl, aralkyl, alkenyl, alkynyl, cycloalkyl, hydroxyl, alkoxyl, amino, nitro, sulfhydryl, imino, amido, phosphonate, phosphinate, carbonyl, carboxyl, silyl, ether, alkylthio, sulfonyl, sulfonamido, ketone, aldehyde, ester, heterocyclyl, aromatic or heteroaromatic moieties, —CF$_3$, —CN, or the like The terms "polycyclyl" or "polycyclic group" are art-recognized and refer to two or more rings (e.g., cycloalkyls, cycloalkenyls, cycloalkynyls, aryls and/or heterocyclyls) in which two or more carbons are common to two adjoining rings, e.g., the rings are "fused rings". Rings that are joined through non-adjacent atoms are termed "bridged" rings. Each of the rings of the polycycle may be substituted with such substituents as described above, as for example, halogen, alkyl, aralkyl, alkenyl, alkynyl, cycloalkyl, hydroxyl, amino, nitro, sulfhydryl, imino, amido, phosphonate, phosphinate, carbonyl, carboxyl, silyl, ether, alkylthio, sulfonyl, ketone, aldehyde, ester, a heterocyclyl, an aromatic or heteroaromatic moiety, —CF3, —CN, or the like.

The term "nitro" is art-recognized and refers to —NO$_2$; the term "halogen" is art-recognized and refers to —F, —Cl, —Br or —I; the term "sulfhydryl" is art-recognized and refers to —SH; the term "hydroxyl" means —OH; and the term "sulfonyl" and "sulfone" is art-recognized and refers to —SO$_2$—. "Halide" designates the corresponding anion of the halogens.

The representation

as used herein in connection to chemical a group or moiety is intended to represent a covalent bond that the aforementioned chemical group or moiety is covalently bonded to another chemical group or moiety.

The phrase "aggregation-enhanced emission" or "AEE" as used herein refers to the enhancement of light-emission by a fluorescent compound upon aggregation in the amorphous or crystalline (solid) states of the fluorescent compound, whereas the fluorescent compound exhibits weak emission in dilute solutions or exhibits less emission in dilute solution relative to the solid state.

The term "λex" as used herein refers to the excitation wavelength.

The term "λem" as used herein refers to the emission wavelength.

The polymer described herein can comprise one, two, or three repeating units selected from the group consisting of:

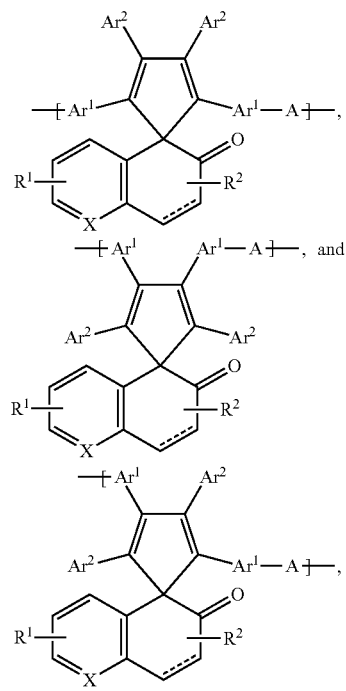

or a salt thereof, wherein

A is selected from the group consisting of:

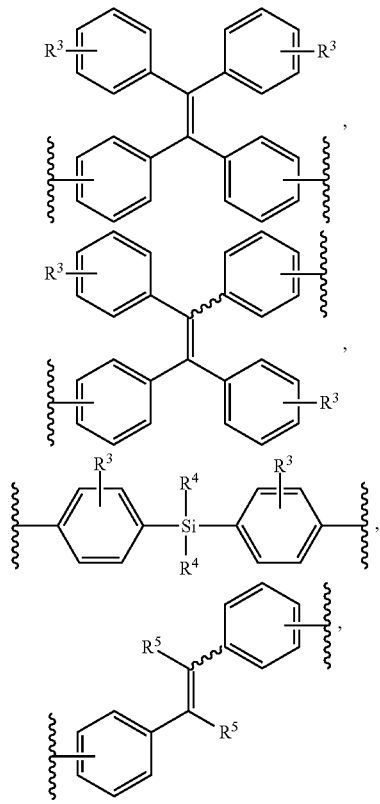

-continued

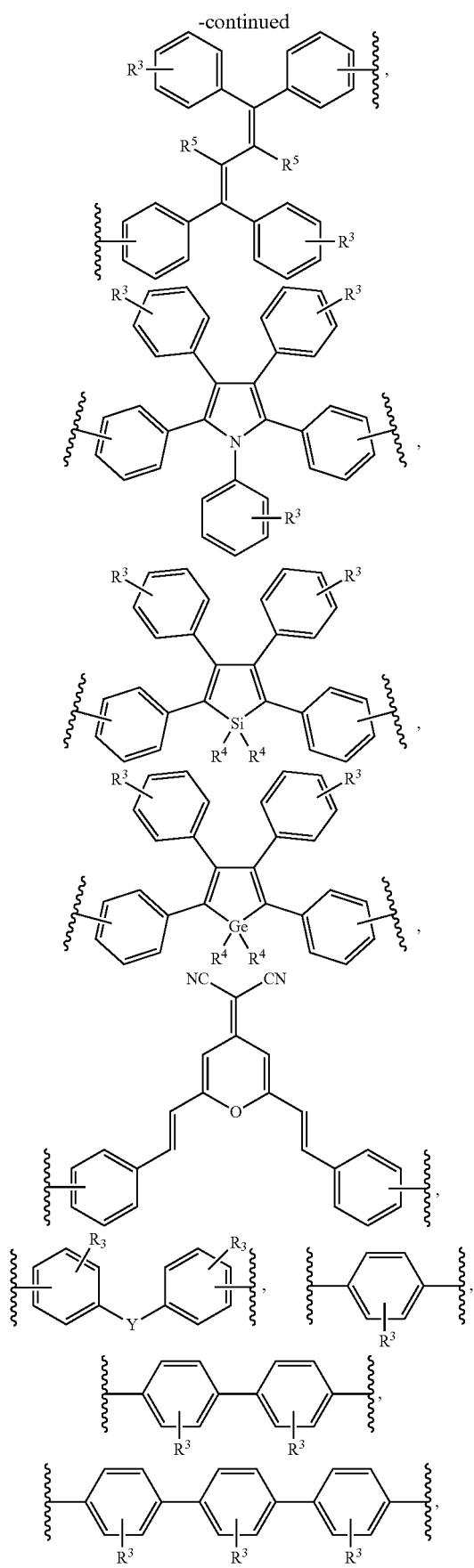

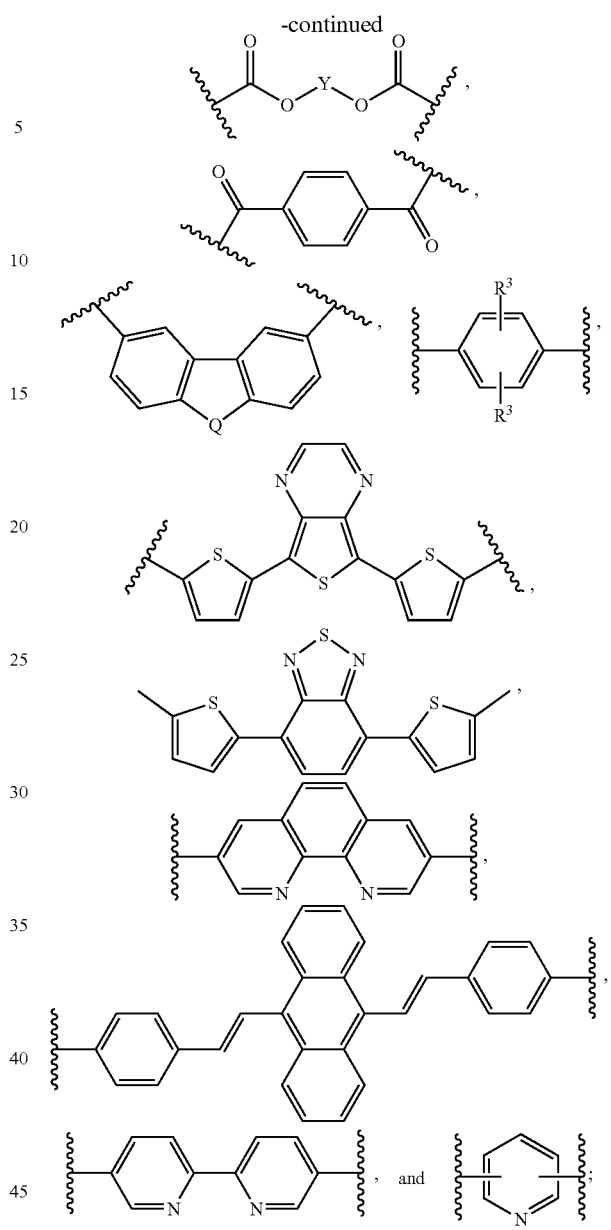

X is N or $CR^1$;
Y is $-(CH_2)_m-$, $-(CH_2)_mO-$, or $-O(CH_2)_mO-$, wherein m is a whole number selected from 1-10;
Q is $-CH_2-$, $-O-$, $-S-$, $-(C=O)-$, $-N(R')-$;
$Ar^1$ and $Ar^2$ are independently aryl or heteroaryl;
$R^1$ is selected from the group consisting of H, halide, nitro, cyano, $-OR^4$, $-SR^4$, $-N(R^4)_2$, $-CHO$, $-CO_2R^4$, $-CON(R^4)_2$, alkyl, perhaloalkyl, alkene, alkyne, cycloalkyl, heterocyclyl, aryl, and heteroaryl;
$R^2$ is selected from the group consisting of H, halide, nitro, cyano, $-OR^4$, $-SR^4$, $-N(R^4)_2$, $-CHO$, $-CO_2R^4$, $-CON(R^4)_2$, alkyl, perhaloalkyl, alkene, alkyne, cycloalkyl, heterocyclyl, aryl, and heteroaryl;
$R^3$ for each instance is independently H, halide, nitro, cyano, $-OR^4$, $-SR^4$, $-SO_2R^4$, $-N(R^4)_2$, $-CHO$, $-CO_2R^4$, $-CON(R^4)_2$, alkyl, alkene, alkyne, cycloalkyl, heterocyclyl, aryl, heteroaryl, diphenylamine, 4-(4-diphenylamino)-phenyl; and
$R^4$ for each instance is independently H, alkyl, cycloalkyl, heterocyclyl, aryl, or heteroaryl; or 2 two instances of $R^4$ taken together with the nitrogen to which they are attached form a 3-6 membered heterocyclyl.

The polymers described herein can include the annotation "", which represents a carbon carbon double bond, a carbon carbon single bond, or both a carbon carbon double bond and a carbon carbon single bond.

The polymers described herein can include carbon carbon double bonds represented by the annotation

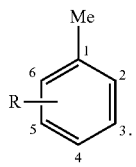

The wavy Dona is intended to represent the (E) stereoisomer, the (Z) stereoisomer, or both of the (E) stereoisomer and the (Z) stereoisomer at the carbon carbon double bond.

The polymers described herein can encompass different positional isomers indicated by a bond that is not attached to the vertex of a chemical structure, such as illustrated using the model structure below:

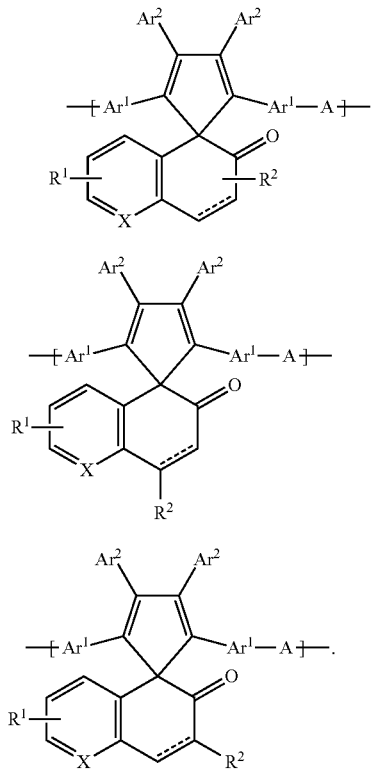

In this model structure, the group R can be connected to any atom on the ring structure, valency permitting, i.e., carbons 2, 3, 4, 5, or 6 in the structure above. For example, $R^2$ shown in the repeating unit below can be present in two positions: Position A or Position B:

Position A

Position B

In instances in which the polymer comprises two or three repeating units, the polymer can be a random copolymer, a block copolymer, an alternating copolymer, a periodic copolymer, and combinations thereof. In certain embodiments, the polymer comprises two or three repeating units and is a random copolymer.

The polymers described herein can have an average molecular weight between 2,000 to 1,000,000 amu. In certain embodiments the molecular weight of the polymer is 2,000 to 1,000,000; 2,000 to 750,000; 2,000 to 500,000; 2,000 to 250,000; 2,000 to 100,000; 2,000 to 80,000; 2,000 to 60,000; 10,000 to 60,000; or 10,000 to 50,000 amu.

The polymers described herein can exhibit AEE properties as result of incorporating a linker A that exhibits AEE properties, such as:

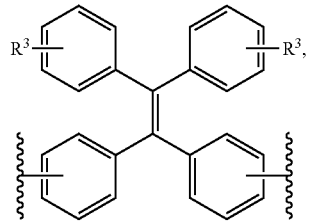

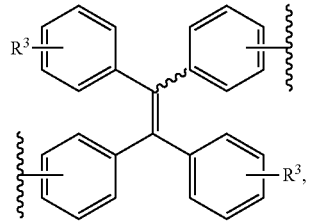

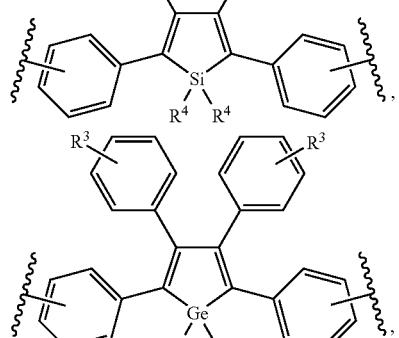

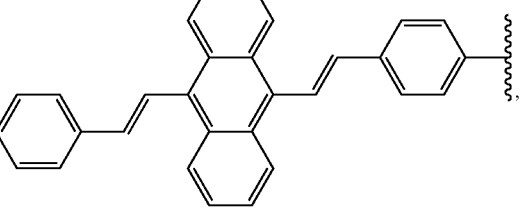

-continued

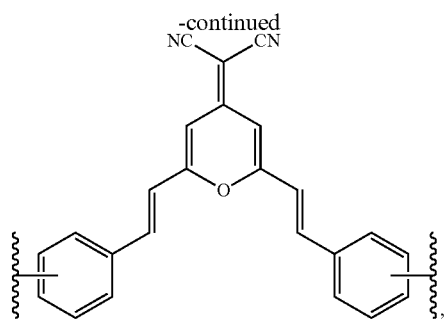

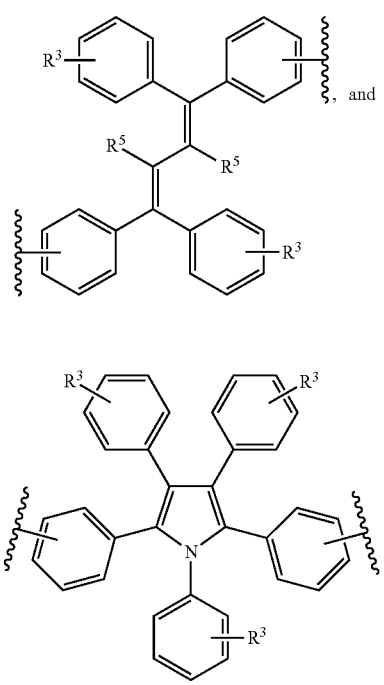

Advantageously, the polymers described herein can also exhibit AEE properties, even when the linker A does not exhibit AEE properties, when the polymer comprises repeating units in which the α,β unsaturated ketone is present in the reduced state as shown in the structures below:

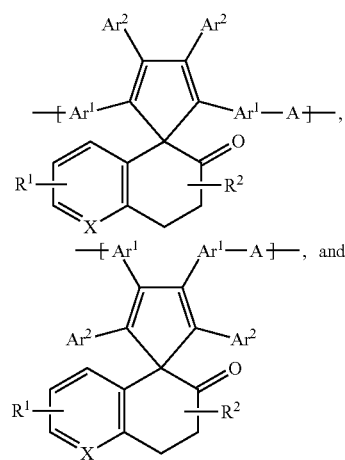

-continued

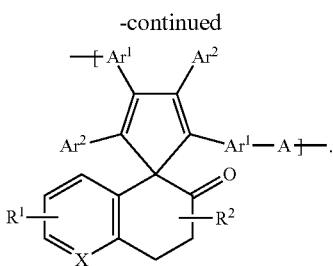

Such repeating units in which the α,β unsaturated ketone is present in the reduced state can be prepared from the corresponding the α,β unsaturated ketone by reduction under the suitable conditions, e.g., by reaction with LiAlH$_4$.

In certain embodiments, A is selected from the group consisting of:

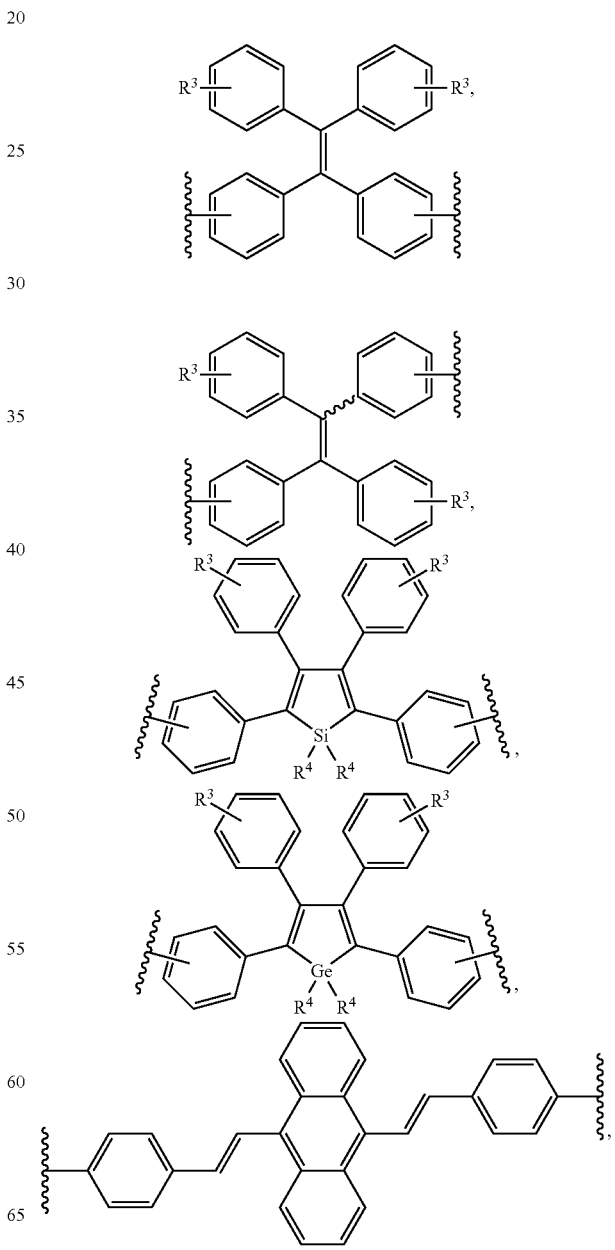

In certain embodiments, A is selected from the group consisting of:

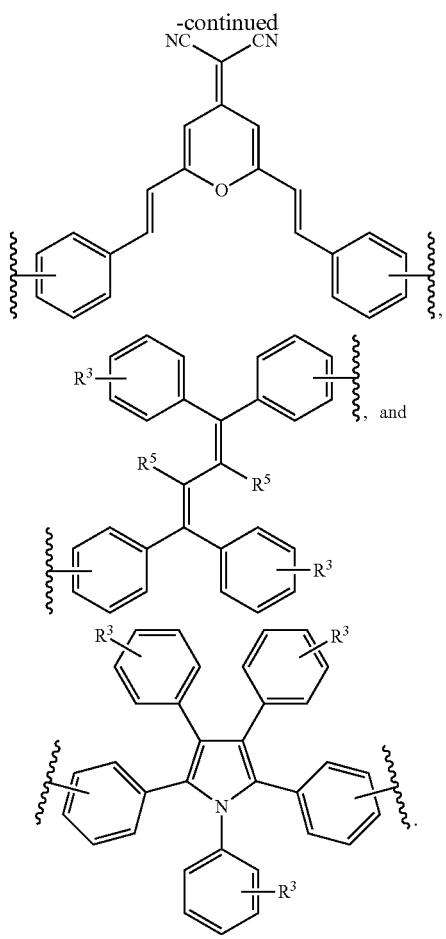

Y can be —(CH$_2$)$_m$—, —(CH$_2$)$_m$O—, or —O(CH$_2$)$_m$O—, wherein m is a whole number selected from 1-10, 2-10, 2-9, 2-8, 2-7, 2-6, or 2-4.

In certain embodiments, Ar$^1$ and Ar$^2$ are independently optionally substituted aryl or optionally substituted heteroaryl. In certain embodiments, Ar$^1$ and Ar$^2$ are independently phenyl substituted at the para position with R$^3$.

In certain embodiments, R$^1$ is selected from the group consisting of H, halide, nitro, cyano, —CHO, —CO$_2$R$^4$, —CON(R$^4$)$_2$, alkyl, perhaloalkyl, cycloalkyl, heterocyclyl, aryl, and heteroaryl. In certain embodiments, R$^1$ is selected from the group consisting of H, halide, nitro, cyano, alkyl, perhaloalkyl, aryl, heteroaryl, —OR$^4$, —CHO, —CO$_2$R$^4$, and —CON(R$^4$)$_2$, wherein each instance of R$^4$ is independently C$_1$-C$_6$ alkyl or aralkyl. In certain embodiments, R$^1$ is H, alkyl, aryl, heteroaryl, —CO$_2$R$^4$, wherein R$^4$ is alkyl or aralkyl.

In certain embodiments, R$^2$ is selected from the group consisting of H, —CO$_2$R$^4$, —CON(R$^4$)$_2$, alkyl, perhaloalkyl, cycloalkyl, heterocyclyl, aryl, and heteroaryl. In certain embodiments, R$^2$ is selected from the group consisting of H, alkyl, perhaloalkyl, —CO$_2$R$^4$, and —CON(R$^4$)$_2$, wherein each instance of R$^4$ is independently H or C$_1$-C$_6$ alkyl. In certain embodiments, R$^2$ is H, —OR$^4$, or —CO$_2$R$^4$, wherein R$^4$ is C$_1$-C$_6$ alkyl.

In certain embodiments, R$^3$ for each instance is independently H, halide, nitro, cyano, —OR$^4$, —SR$^4$, —SO$_2$R$^4$, —N(R$^4$)$_2$, —CHO, —CO$_2$R$^4$, —CON(R$^4$)$_2$, aryl, heteroaryl, diphenylamine, 4-(4-diphenylamino)-phenyl, wherein each instance of R$^4$ is independently H, alkyl, aralkyl, aryl, heteroaryl. In certain embodiments, R$^3$ is H.

In certain embodiments, R$^4$ for each instance is independently H, C$_1$-C$_6$ alkyl, C$_3$-C$_6$ cycloalkyl, heterocyclyl, aryl, or heteroaryl; or 2 two instances of R$^4$ taken together with the nitrogen to which they are attached form a 3-6 membered heterocyclyl.

In certain embodiments, the polymer is a random copolymer comprising three repeating units:

or a salt thereof, wherein
A is selected from the group consisting of:

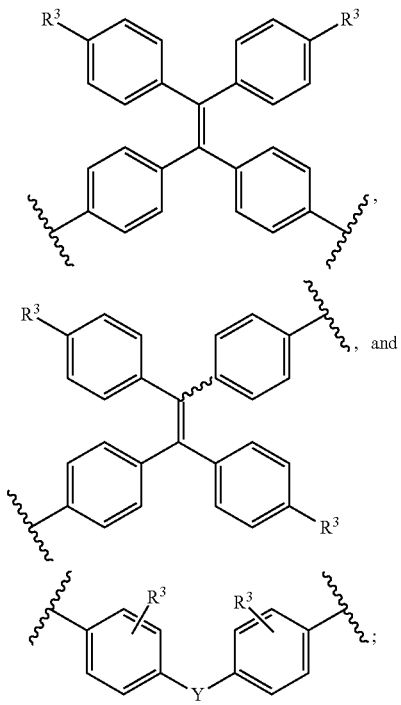

X is N or CR$^1$;

Y is —O(CH$_2$)$_m$O—, wherein m is a whole number selected from 4-10;

Ar$^1$ and Ar$^2$ are independently optionally substituted phenyl;

R$^1$ is selected from the group consisting of H, —CO$_2$R$^4$, aryl, and heteroaryl;

R$^2$ is selected from the group consisting of H, —OR$^4$, and —CO$_2$R$^4$;

R$^3$ for each instance is independently H, halide, nitro, cyano, —OR$^4$, —SR$^4$, —SO$_2$R$^4$, —N(R$^4$)$_2$, —CHO, —CO$_2$R$^4$, —CON(R$^4$)$_2$, alkyl, alkene, alkyne, cycloalkyl, heterocyclyl, aryl, heteroaryl, diphenylamine, or 4-(4-diphenylamino)-phenyl; and R$^4$ for each instance is independently H, alkyl, cycloalkyl, heterocyclyl, aryl, or heteroaryl; or 2 two instances of R$^4$ taken together with the nitrogen to which they are attached form a 3-6 membered heterocyclyl.

In certain embodiments, the polymer is a random copolymer comprising three repeating units:

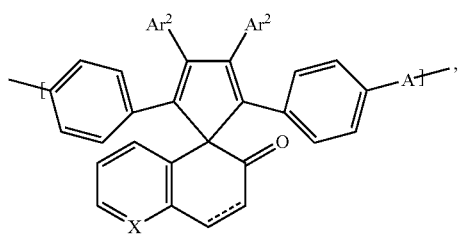

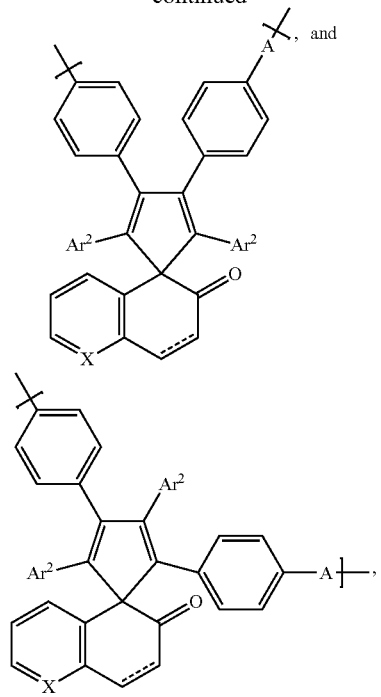

wherein
A is selected from the group consisting of:

X is CH or N;

Y is —O(CH$_2$)$_m$O—, wherein m is a whole number selected from 4-10;

Ar$^2$ is an optionally para-substituted phenyl; and

R$^3$ for each instance is independently H, halide, nitro, cyano, —OR$^4$, —SR$^4$, —SO$_2$R$^4$, —N(R$^4$)$_2$, —CHO, —CO$_2$R$^4$, —CON(R$^4$)$_2$, alkyl, alkene, alkyne, cycloalkyl, heterocyclyl, aryl, heteroaryl, diphenylamine, or 4-(4-diphenylamino)-phenyl.

In certain embodiments, the polymer is a random copolymer comprising three repeating units:

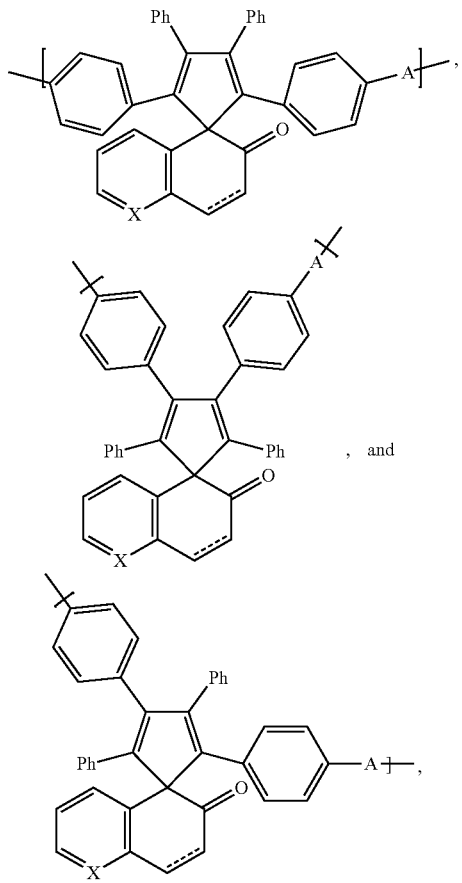

, and

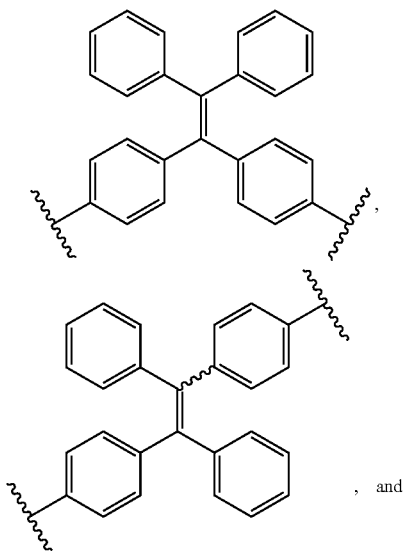

wherein
A is selected from the group consisting of:

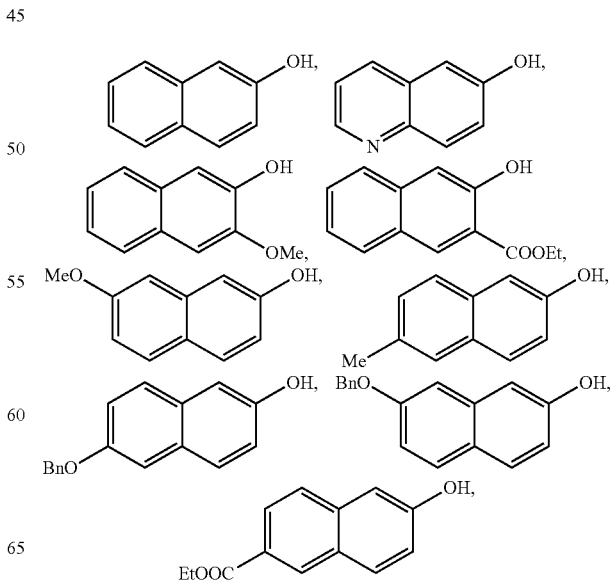

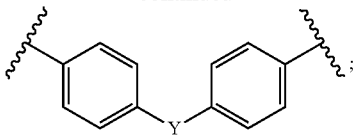

X is CH or N; and
Y is —O(CH$_2$)$_m$O—, wherein m is a whole number selected from 4-10.

The polymers described herein can be prepared by a method comprising the steps of:

a. contacting a compound of Formula IA:

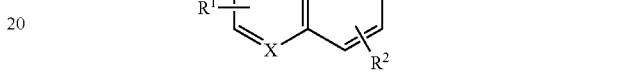

or a conjugate salt thereof, with a compound of Formula IB:

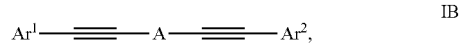

wherein A, X, R$^1$, R$^2$, Ar$^1$, and Ar$^2$ are as defined in any embodiment described herein; and a palladium species thereby forming an unsaturated spirocyclic polymer; and b. optionally contacting the unsaturated spirocyclic polymer with a reducing agent thereby forming the polymer described herein.

Conjugate salts of the compound of Formula IA can comprise lithium, sodium, potassium, rubidium, cesium, magnesium, calcium, strontium, or an ammonium species, such as an alkyl ammonium species.

Exemplary compounds of the Formula IA that can be used in the method for preparing the polymers described herein includes, but are not limited to:

-continued

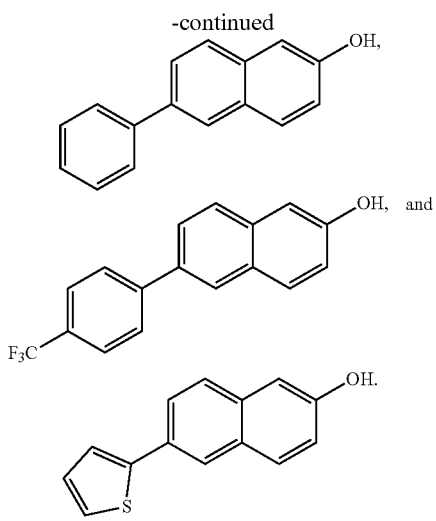

Exemplary compounds of the Formula IB that can be used in the method for preparing the polymers described herein includes, but are not limited to:

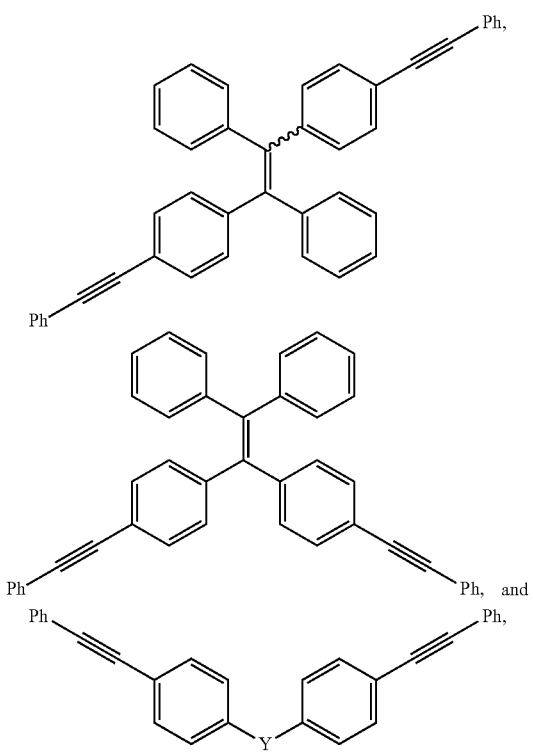

wherein is —O(CH$_2$)$_4$O—, —O(CH$_2$)$_6$O—, —O(CH$_2$)$_{10}$O—.

Advantageously, the method described herein can be improved by increasing the number of equivalence of the compound of Formula IA. As detailed in Table 3, the yield of the reaction can increase from 39% to 99% when the equivalents of the compound of Formula IA is increased from 0.75 to 4 equivalents relative to the compound of Formula IB. In certain embodiments, the compound of Formula IA is presence in molar excess relative to the compound of Formula IB. For example, the molar ratio of the compound of Formula IA relative to the compound of Formula IB can be 1.1:1 to 10:1, 2:1 to 10:1, 2:1 to 9:1, 2:1 to 8:1, 2:1 to 7:1, 2:1 to 6:1, 3:1 to 6:1, or 4:1 to 6:1. In instances in which a molar excess of the compound of Formula IA is used relative to the compound of Formula IB, unreacted compound of Formula IA can advantageously be isolated after the reaction using conventional purification techniques, such as column chromatography and/or aqueous extraction, e.g., under basic or acid conditions.

The palladium species can be any palladium (II) species known to those of skill in the art. Exemplary palladium species include, but are not limited to, palladium(II) acetate, palladium(II) chloride, dichlorobis(acetonitrile)palladium (II), dichlorobis(benzonitrile)palladium(II), allylpalladium chloride dimer, palladium(II) acetyl acetonate, palladium(II) bromide, bis(2-methylallyl)palladium(II) chloride dimer, crotylpalladium chloride dimer, dichloro(1,5-cyclooctadiene)palladium(II), dichloro(norbornadiene)palladium(II), palladium(II) trifluoroacetate, palladium(II) benzoate, palladium(II) trimethylacetate, palladium(II) oxide, palladium (II) cyanide, palladium(II) hexafluoroacetylacetonate, cis-dichloro(N,N,N',N'-tetramethylethylenediamine)palladium (II), cyclopentadienyl[(1,2,3-n)-1-phenyl-2-propenyl] palladium(II), 1,1'-bis(diphenylphosphino)ferrocene] dichloropalladium(II), [1,3-bis(2,6-diisopropylphenyl) imidazol-2-ylidene](3-chloropyridyl)palladium(II) dichloride, (1,3-bis(2,6-diisopropylphenyl)imidazolidene) (3-chloropyridyl) palladium(II) dichloride, and a mixture of two or more thereof.

The palladium species can be present in a stoichiometric amount or in excess relative to the compound of Formula IA or compound of Formula IB. In the alternative the palladium species can be present in a catalytic amount. In such instances the palladium species can be present at 0.01-50 mol % relative to the compound of Formula IA or compound of Formula IB. In certain embodiments the palladium species is present at 5-30, 5-25, 10-25, 15-25, or 17 to 23 mol % relative to the compound of Formula IA or the compound of Formula IB.

In instances in which a catalytic amount of the palladium species is used in the methods described herein, an oxidant that is capable of oxidizing the palladium (IV) to palladium (II) can be used. Exemplary oxidants include, but are not limited to copper (II) salts, such as Cu(OAc)$_2$H$_2$O, Cu(OAc)$_2$, CuO, AgOAc, Ag$_2$O, Ag$_2$CO$_3$, etc.

In certain embodiments, the method for preparing the polymers described herein is conducted in the presence of the base. In such instances the compound of Formula IA, the compound of Formula IB, and the palladium species are contacted in the presence of the base. The base can be any Brønsted base known to those of skill in the art. In certain embodiments, the base is a metal carbonate (e.g., Li$_2$CO$_3$, Na$_2$CO$_3$, K$_2$CO$_3$, Rb$_2$CO$_3$, Cs$_2$CO$_3$, and the like), metal bicarbonate (e.g., LiHCO$_3$, NaHCO$_3$, KHCO$_3$, Cs(HCO$_3$)$_2$, and the like), metal hydroxide (e.g., LiOH, NaOH, KOH, RbOH, CsOH, and the like), metal alkoxide (e.g., LiOR$_0$, NaOR$_0$, KOR$_0$, RbOR$_0$, CsOR$_0$, and the like, wherein R$_0$ is alkyl), and combinations thereof.

The method of preparing the polymers described herein can be conducted in many solvents. These solvents include, but are not limited to, acetonitrile, dimethylformamide (DMF), dimethylacetamide (DMA), dimethylsulfoxide (DMSO), DMSO/water, N-methylpyrrolidinone (NMP), hexamethylphosphoramide (HMPA), tetrahydrofuran (THF), tetrahydropyran (THP), dimethoxyethane (DME), dichlormethane diglyme, dichloromethane (DCM), dichloroethane (DCE), o-xylene, and mixtures thereof.

The method for preparing the polymers described herein can be conducted at a temperature of 20 to 300° C. In certain embodiments, the method for preparing the polymers described herein can be conducted at a temperature of 20 to 300, 20 to 250, 20 to 200, 50 to 200, 70 to 200, 90 to 200, 100 to 200, 100 to 180, 100 to 170, 100 to 150, 100 to 140, 110 to 140, 110 to 130, 110 to 170, 120 to 170, 120 to 160, or 120 to 150° C.

Figure 3:
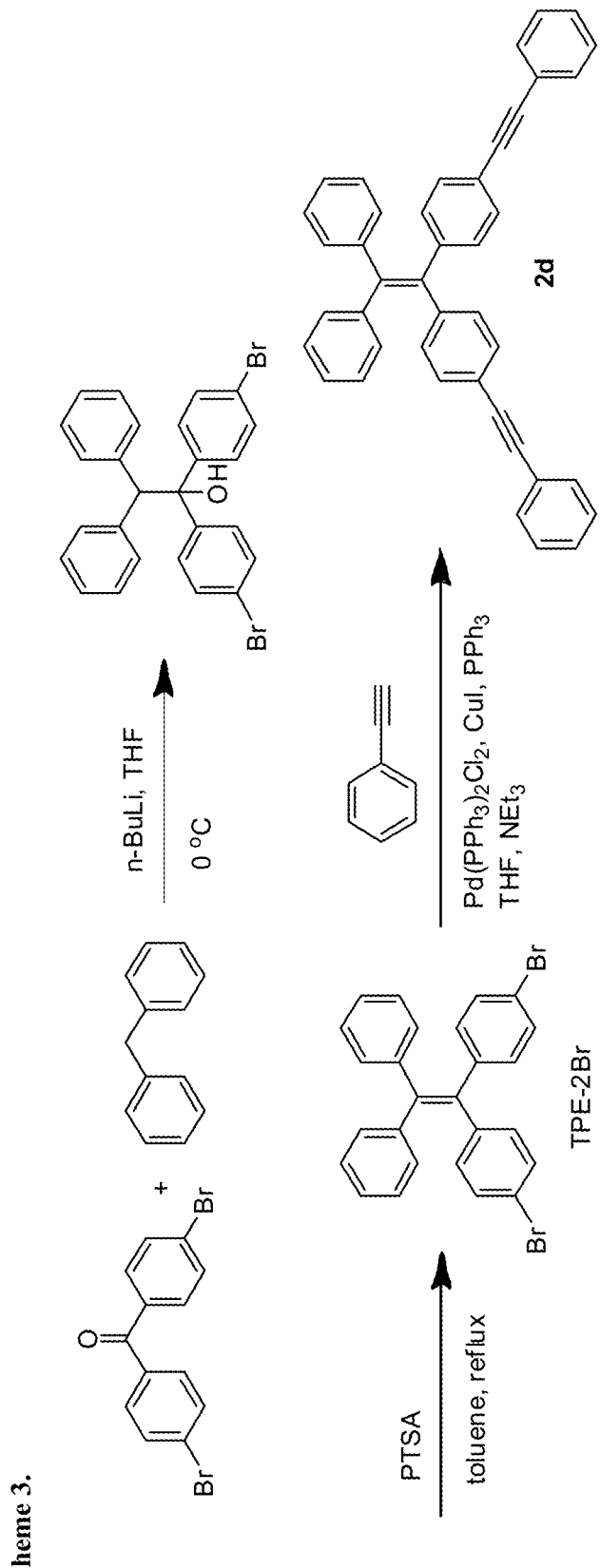
FIG. 3 depicts Scheme 3 showing a representative synthetic route to monomer 2d.

A series of exemplary monomers was designed and synthesized. Internal diynes 2a-c and 2e were prepared according to the reported procedures, [Y. J. Liu, M. Gao, Z. Zhao, J. W. Y. Lam, B. Z. Tang. Polym. Chem. 2016, 7, 5436; M. Gao, J. W. Y. Lam, Y. J. Liu, J. Li, B. Z. Tang. Polym. Chem. 2013, 4, 2841]. Monomer 2d was obtained by the synthetic route as shown in Scheme 3 (FIG. 3). Commercially available 2-naphthol (1a) and quinolin-6-ol (1b) were used without further purification. The synthetic procedures and characterization data of monomer 2d were provided as follows.

4,4'-(2,2-Diphenylethene-1,1-diyl)bis(bromobenzene) (TPE-2Br) was synthesized according to a previous report. [X. Zhou, H. Y. Li, Z. G. Chi, X. Q. Zhang, J. Y. Zhang, B. J. Xu, Y. Zhang, S. W. Liu, J. R. Xu. New J. Chem. 2012, 36, 685.] To a 250 mL two-necked round-bottom flask were added Pd(PPh$_3$)$_3$Cl$_2$ (700 mg, 1.0 mmol), CuI (381 mg, 2.0 mmol), PPh$_3$ (525 mg, 2.0 mmol), TPE-2Br (4.9 g, 10.0 mmol), and a solvent mixture of THF/triethylamine (30 mL/60 mL) under a nitrogen atmosphere. After these solid substrates were completely dissolved, phenylacetylene (4.39 mL, 40.0 mmol) was then injected into the flask through a syringe under stirring and the reaction mixture was heated to 80° C. After refluxing overnight, the reaction mixture was cooled down to room temperature. The formed solid was removed by filtration and washed with THF for several times. The filtrate was dried by blowing with condensed air and then extracted with dichloromethane. The organic layers were combined and dried over anhydrous sodium sulfate. After filtration and solvent evaporation, the resulting crude product was purified on a silica gel column chromatography using hexane/ethyl acetate as the eluent. Pure product was obtained as a pale yellow solid; yield 73.5%. $^1$H NMR (400 MHz, CD$_2$Cl$_2$), δ (ppm): 7.54-7.52 (m, 4H), 7.39-7.28 (m, 10H), 7.17-7.15 (m, 6H), 7.10-7.04 (m, 8H). $^{13}$C NMR (100 MHz, CD$_2$Cl$_2$), δ (ppm): 143.71, 143.39, 142.50, 139.74, 131.70, 131.57, 131.45, 131.19, 128.47, 128.36, 128.00, 126.98, 123.41, 121.42, 89.90, 89.63. HRMS (MALDI-TOF): m/z 532.2180 (M$^+$, calcd 532.2191).

In certain embodiments, the methods described herein optionally include the step of reacting the unsaturated spirocyclic polymer with a reducing agent. The selection of suitable reducing agents is well within the skill of a person of ordinary skill in the art. Exemplary reducing agents include, but not limited to, metal borohydrides (such as NaBH$_4$ and LiBH$_4$), metal aluminum hydrides (such as LiAlH$_4$), dialkylaluminum hydrides (such as diisobutylaluminum hydride), metal trialkylborohydrides (such as NaBHEt$_3$), trialkoxy aluminumhydride (such as lithium tri-t butoxyaluminum hydride) and the like. In other embodiments, the reducing agent comprises a transition metal mediated reduction using, e.g., hydrogen or another hydrogen source. Transition metals that can be used for affecting the reduction of the unsaturated spirocyclic polymer include, but are not limited to, palladium, platinum, rhodium, ruthenium, iridium, nickel, and the like. In other embodiments, the reducing agent comprises lithium metal in ammonia.

To obtain polymers with high molecular weights in high yields, different reaction parameters using 1a and 2a as the model monomers were systematically optimized. The effect of catalyst type and loading on the polymerization was first investigated at the theoretical monomer ratio of [1a]:[2a]=1:1 [Table 1 (FIG. 4)]. In an initial trial, the polymerization was conducted in the presence of 10% equivalent of Pd(OAc)$_2$. Oligomers with a molecular weight (M$_w$) of 4,300 were obtained in a low yield of 25%. No improvement of polymerization efficiency was achieved when the catalyst was changed to Pd(1,1'-bis(diphenylphosphino)ferrocene)Cl$_2$—CH$_2$Cl$_2$ or PdCl$_2$(PPh$_3$)$_2$. The catalyst loading was then altered in the polymerizations. The results indicated that an increased amount of palladium catalyst led to an increase in both the molecular weight of the polymer and the reaction yield.

The solvent effect was examined by conducting the polymerizations in different solvent systems at different temperatures [Table 2 (FIG. 5)]. Without wishing to be bound by theory, it was believed that in view of the proposed reaction mechanism, that the solubility of the K$_2$CO$_3$ in the solvent system might be important for the reaction as it promotes the dearomatization process from F to G [Scheme 1 (FIG. 1)]. Since K$_2$CO$_3$ shows better solubility in water, the polymerization in a DMSO/H$_2$O mixture was explored. However, neither the molecular weight nor the reaction yield was improved, presumably due to the poorer solubility of the products in this solvent system. The polymerizations conducted in DMF, NMP, and o-xylene afforded oligomeric species in low yields. Among the tested solvents, the polymerization in DMSO afforded polymeric products with the highest M$_w$ (5,400) in the highest yield (44%). Therefore, DMSO was chosen for the following investigation.

The molar ratio of 1a and 2a was investigated. The results in Table 3 (FIG. 6) indicated that monomer ratio had a large influence on the polymerization reaction. While the addition of an excess amount of internal diyne (2a) decreased both of the yield and average molecular weight of the polymer product under the tested conditions [Table 3 (FIG. 6), entry 1], the presence of an excess amount of 2-naphthol (1a) significantly improved the polymerization efficiency. When the monomer ratio of 1a and 2a was increased to 2:1, P1a/2a with a much higher molecular weight (10,600) was generated in a higher yield (78%). Further increase of the monomer ratio to [1a]:[2a]=3:1 improved the M$_w$ of the polymer and isolated yield to 14,700 and 82%, respectively. The best result was obtained at [1a]:[2a]=4:1, producing P1a/2a with a high M$_w$ of 21,300 in an excellent yield of 99%.

Without wishing to be limited by theory, a proposed mechanism is depicted in Scheme 1 (FIG. 1) in which the naphthol substrate is first converted in to a palladium enolate (E), which then reacts with the alkyne. In this regard, intermediate E is believed to be the key active species to directly react with monomer 2 in the derived polymerizations. The stoichiometric balance between E and 2 was thus crucial for generating polymers with high M$_w$. However, monomer 1 is hard to be completely converted into the reactive intermediate E via step 1 and the subsequent tautomerization process. Therefore, the effective molar ratio of E and 2 was less than 1:1 when [1]:[2] was 1:1 or 0.75:1, which explains the poor polymerization results under these conditions.

By employing the monomer ratio of [1a]:[2a]=4:1, the effect of additive and oxidant loading on the polymerization was investigated. As shown in Table 4 (FIG. 7), the polymerization efficiency decreased dramatically in the absence of K$_2$CO$_3$, merely affording oligomers (M$_w$=6,500) in a moderate yield. This result suggested that K$_2$CO$_3$ may be necessary for the formation of higher molecular weight polymers. With respect to the oxidant, 0.84 M of Cu(OAc)$_2$.H$_2$O was found to be the optimal oxidant concentration. Increasing the amount of $Cu(OAc)_2.H_2O$ to 1.0 M led to a slight decrease in both the $M_w$ and the yield, while decreasing the oxidant loading to 0.42 M only gave oligomeric products. Table 5 (FIG. 8) summarizes the effect of monomer concentration on the polymerization of 1a and 2a with a fixed monomer ratio of 4:1. When the monomer concentration of 2a was reduced from 0.20 M to 0.10 M, a polymeric product with a much lower $M_w$ of 6,800 was produced in a lower yield (73%). On the other hand, increasing [2a] to 0.40 M slightly improve the $M_w$ of polymer but the isolation yield was somehow decreased. Thus, 0.20 M was adopted as the preferred monomer concentration. The time course on the polymerization was then followed by GPC measurement of a small amount of mixture extracted from the reaction system using a syringe at a particular time. The results shown in Table 6 (FIG. 9) indicated the good polymerization efficiency of 1a and 2a. A polymer with a $M_w$ of 12,000 can be furnished after reaction for 5 h. The molecular weight of the obtained polymer was gradually increased by prolonging the reaction time to 16 h and 24 h. Further extending the reaction time to 28 h showed no significant improvement in the polymerization result. We thus chose 24 h as the optimized reaction time.

Figure 2:
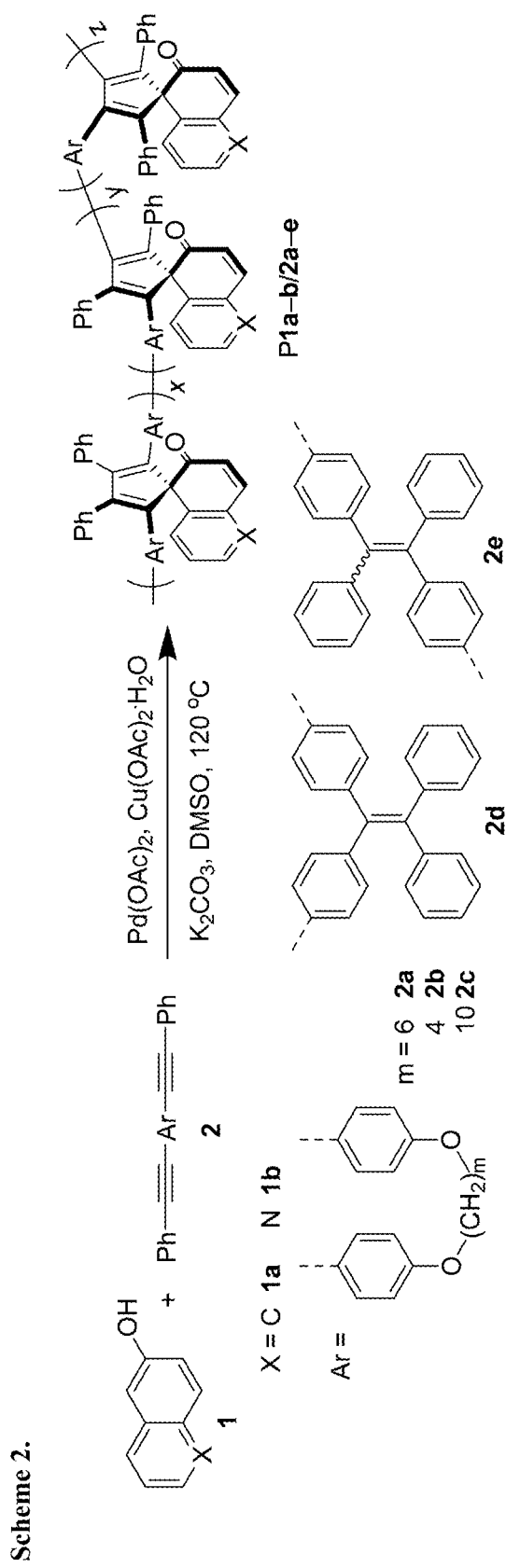
FIG. 2 depicts Scheme 2 that shows an exemplary polymerization routes to spirocyclic polymers using exemplary monomer units.

A series of spirocyclic polymers were synthesized using different monomer combinations [Table 7 (FIG. 10) in view of FIG. 2] using the methods described herein. Various internal diynes, including monomer 2b-2c with different alkyl chain lengths and 2d-2e with the tetraphenylethene (TPE) luminophore, were employed in place of 2a to polymerize with 2-naphthol. The results showed that the internal diyne with a shorter alkyl chain (2b) gave a comparable result with that of 2a, affording P1b/2a with a high $M_w$ of 24,400 in a high yield of 95%. On the other hand, the internal diyne with a longer alkyl chain (2c) produced a polymer with an acceptable $M_w$ (14,300) in a lower reaction yield (42%). The polymerization of 1a with the TPE-containing monomers 2d and 2e generated polymeric products with a moderate $M_w$ of 7,300 and 9,900, respectively, in a yield of 87%. The relatively lower polymerization efficiency of 2c-2e is possibly due to their large steric hindrance, which is unfavorable for the smooth progress of this polymerization. The scope of monomer 1 was also investigated. When 2-naphthol was replaced with quinolin-6-ol (1b) to polymerize with 2a, P1b/2a with a $M_w$ of 10,300 can be formed in a high yield of 95%.

Figure 14:
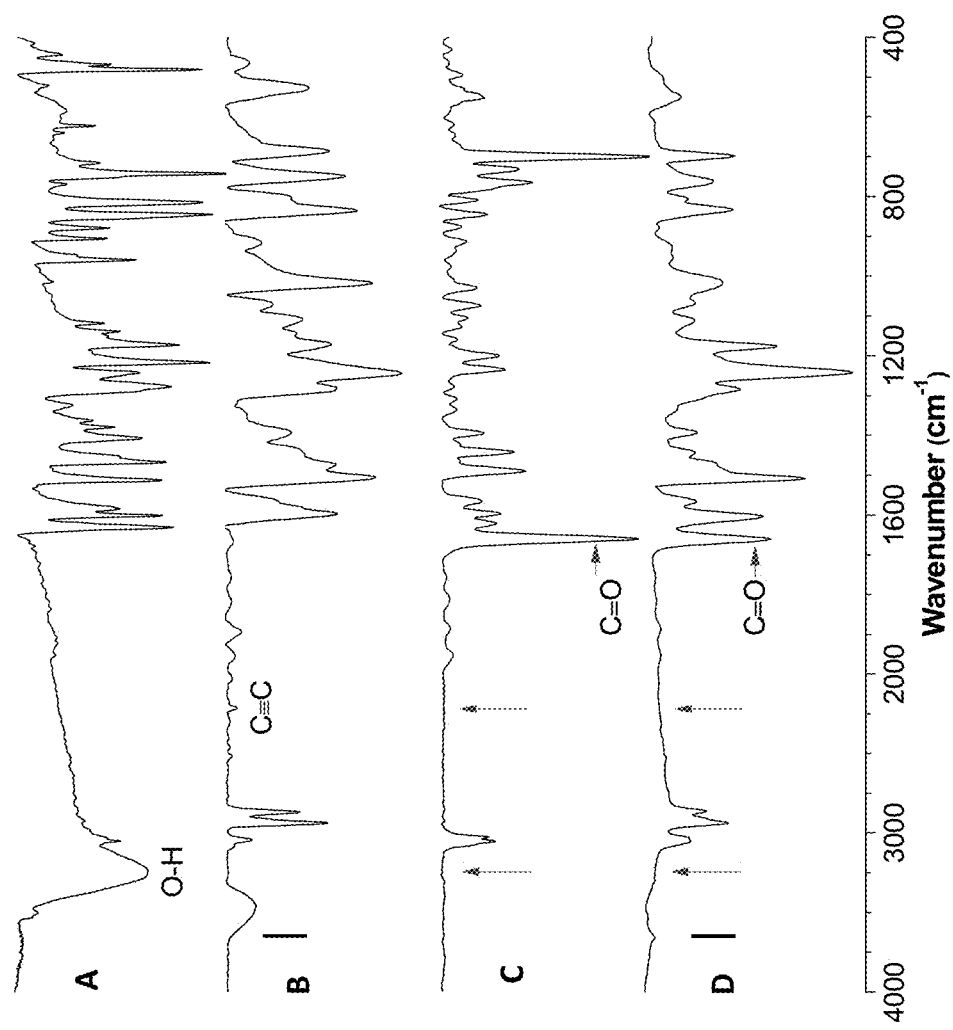
FIG. 14 the IR spectra of (A) 1a, (B) 2a, (C) 4, and (D) P1a/2a [sample taken from Table 3 (FIG. 6), entry 5].

The polymer structures were fully verified by comparing their characterization results with those of the corresponding monomers and model compounds. The IR and NMR results of P1a/2a [sample taken from Table 3 (FIG. 6), entry 5] are presented here as an example. As depicted in FIG. 14, a wide absorption band associating with the stretching vibration of O—H group was observed at 3,250 cm$^{-1}$ in the IR spectrum of monomer 1a. The diyne monomer 2a showed a characteristic peak at 2,214 cm$^{-1}$ due to the stretching vibration of CC group. However, these two bands completely disappeared in the IR spectra of P1a/2a. These observations implied the occurrence of the polymerization. On the other hand, a new absorption band at 1,661 cm$^{-1}$ emerged after the model reaction and polymerization, which revealed the formation of C=O in the product structure.

Figure 15:
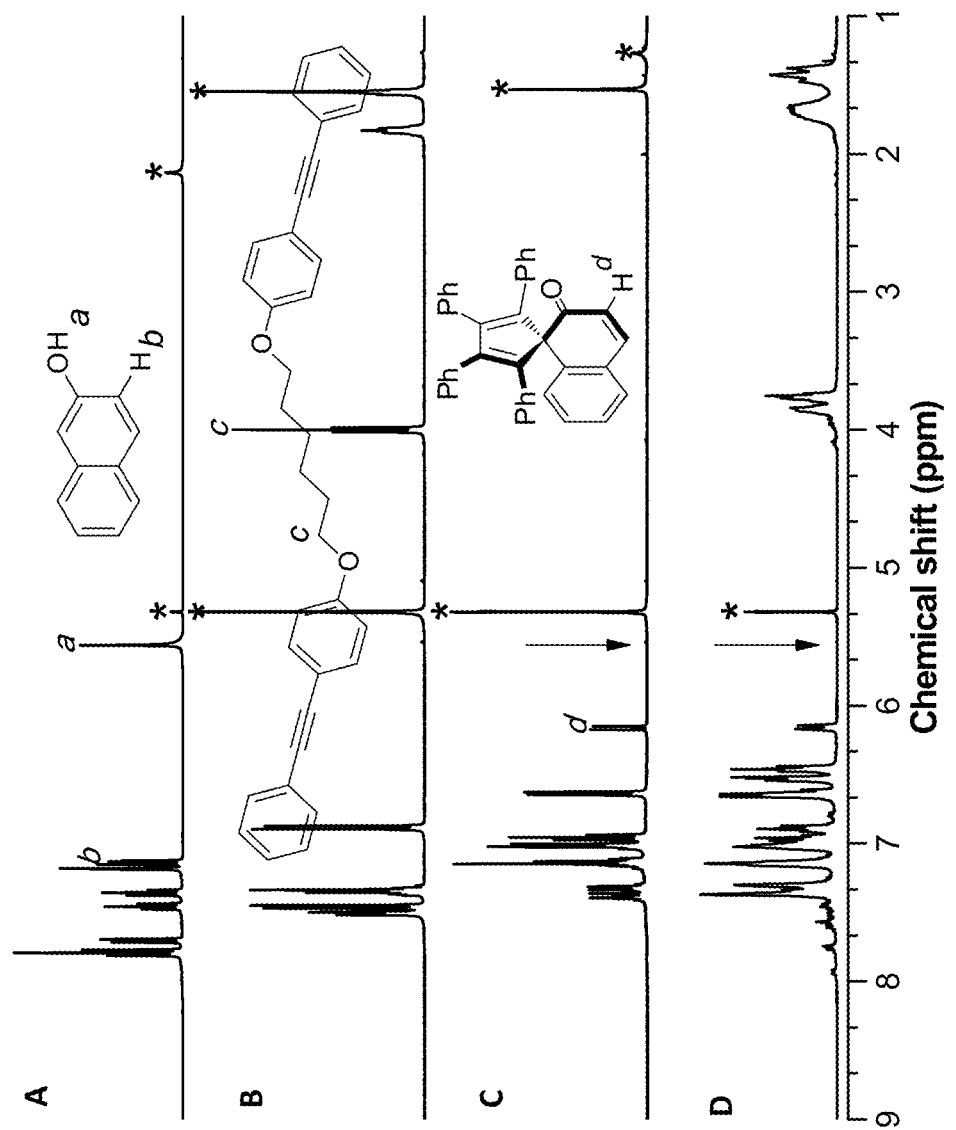
FIG. 15 the $^1$H NMR spectra of (A) 1a, (B) 2a, (C) 4 and (D) P1a/2a [sample taken from Table 3 (FIG. 6), entry 5] in CD$_2$Cl$_2$.
Figure 16:
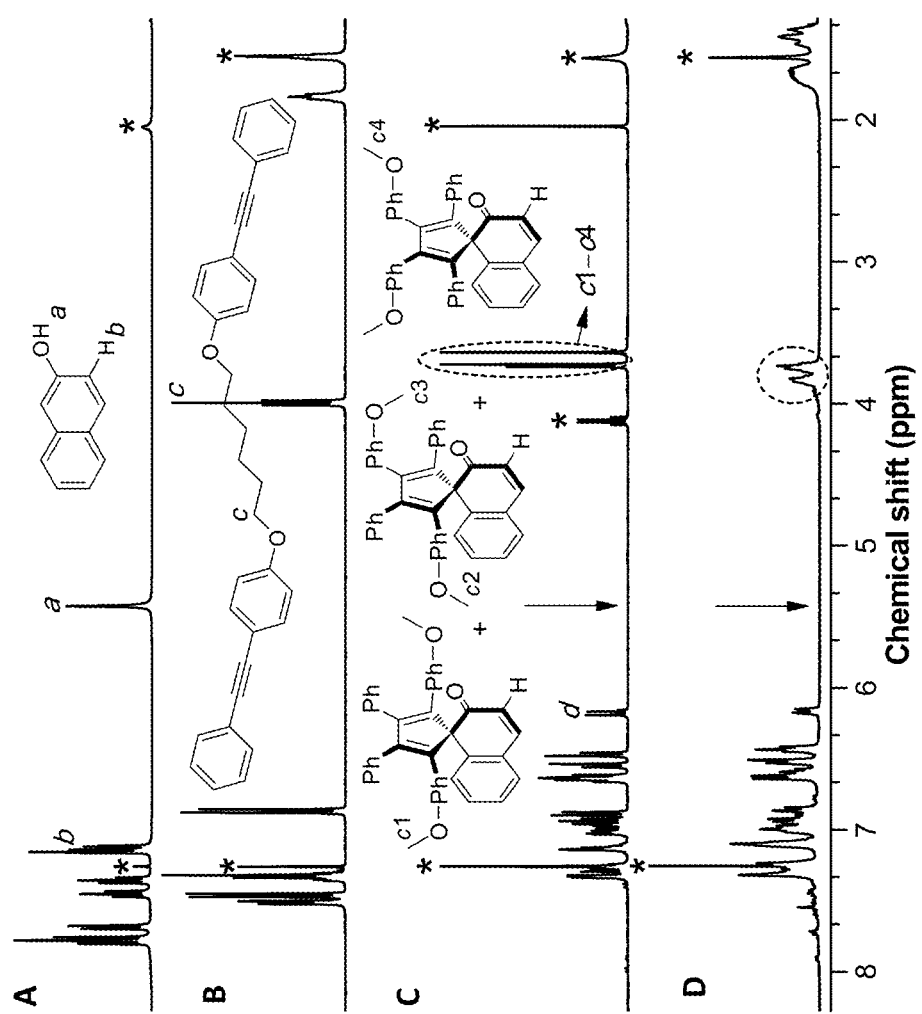
FIG. 16 depicts the $^1$H NMR spectra of (A) 1a, (B) 2, (C) 6 and (D) P1a/2a [sample taken from Table 3 (FIG. 6), entry 5] in CDCl$_3$.

The $^1$H NMR results of 1a, 2a, 4, and P1a/2a were compared in FIG. 15. The spectrum of P1a/2a shows no hydroxyl hydrogen resonance of 1a at δ 5.56. The signals related to the aromatic proton in "b" position of 1a shifted to the down field at δ of around 6.16 after the polymerization. The resonance peak of the methylene protons in "c" position of 2a at δ 4.00 changed to different regions at δ 3.84-3.76 in the polymer spectrum. The comparison results of the $^1$H NMR spectrum of 6 and P1a/2a suggested that the polymer structure simultaneously contains different isomeric units (FIG. 16), although the similar resonance signals of 6a-c hinders the evaluation of the molar ratios of these isomeric structures.

Figure 17:
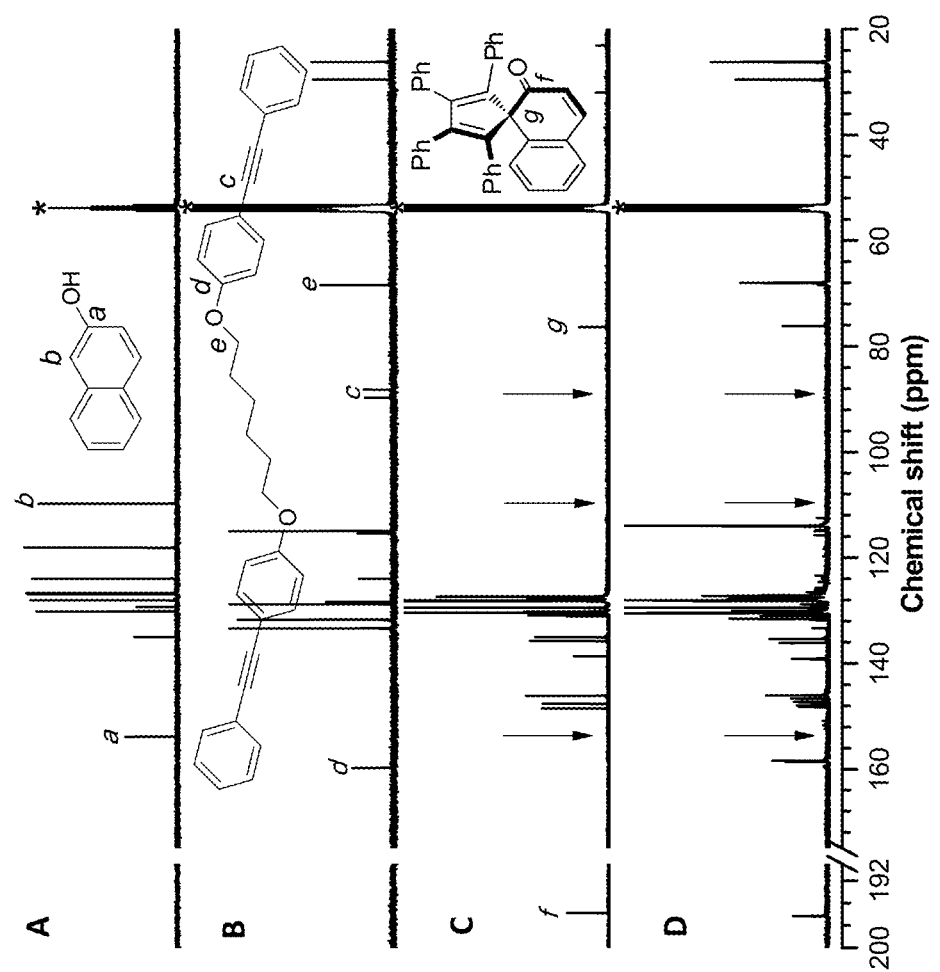
FIG. 17 depicts the $^{13}C$ NMR spectra of (A) 1a, (B) 2a, (C) 4 and (D) P1a/2a [sample taken from Table 3 (FIG. 6), entry 5] in $CD_2Cl_2$.
Figure 18:
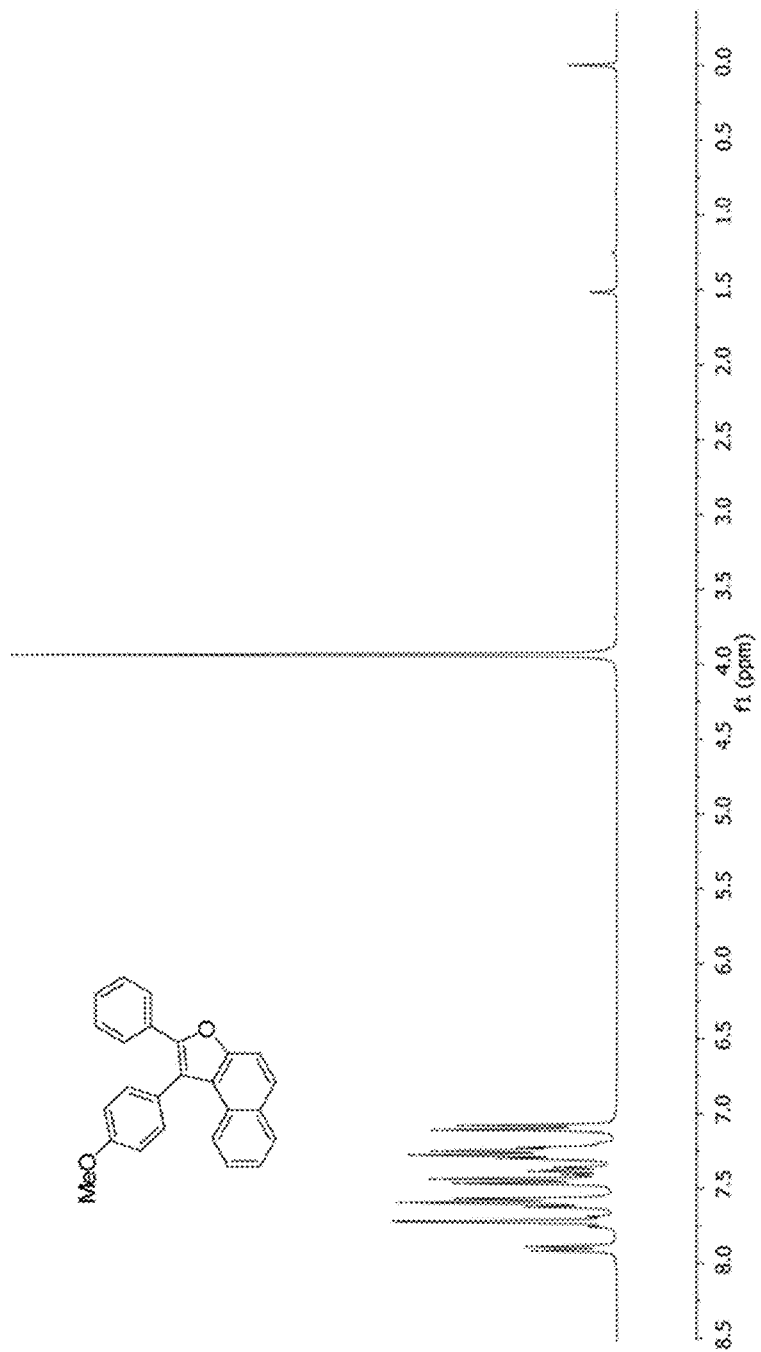
FIG. 18 depicts the (A) $^1H$ NMR spectrum of the possible terminal group structure in $CDCl_3$. (B) the $^1H$ NMR spectrum of P1a/2a [sample taken from Table 3 (FIG. 6), entry 5] in $CD_2Cl_2$. The circled areas are corresponding to the terminal group signals.
Figure 18:
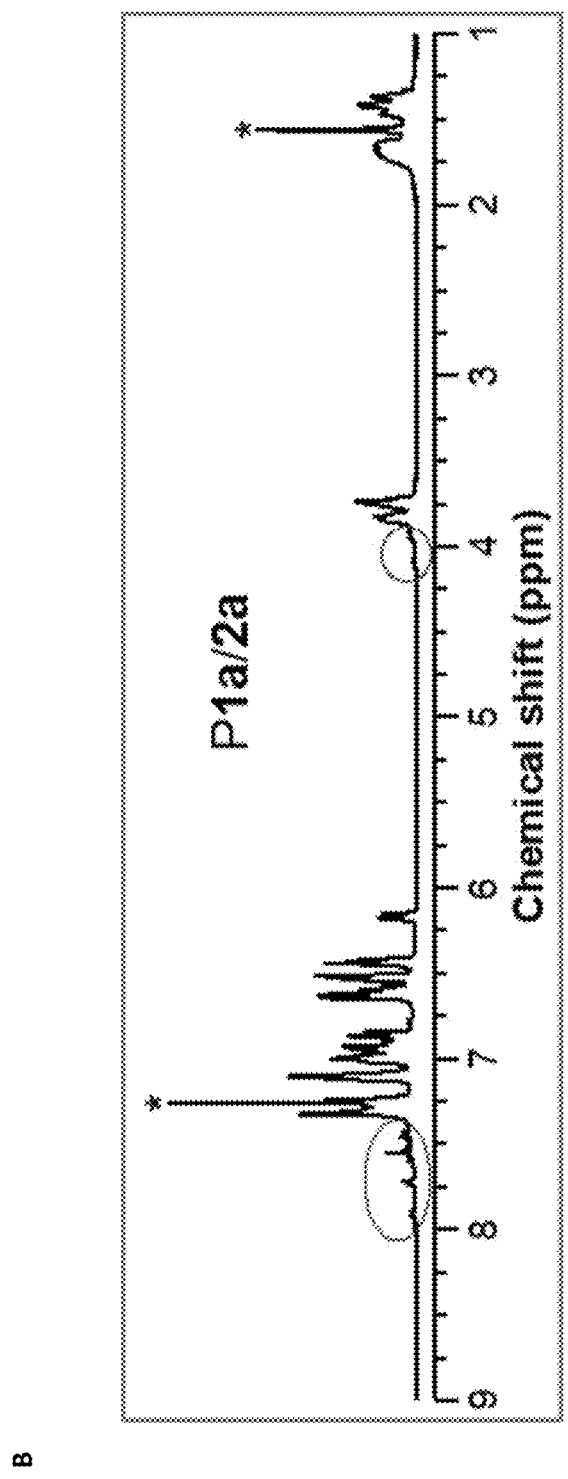
Figure 19:
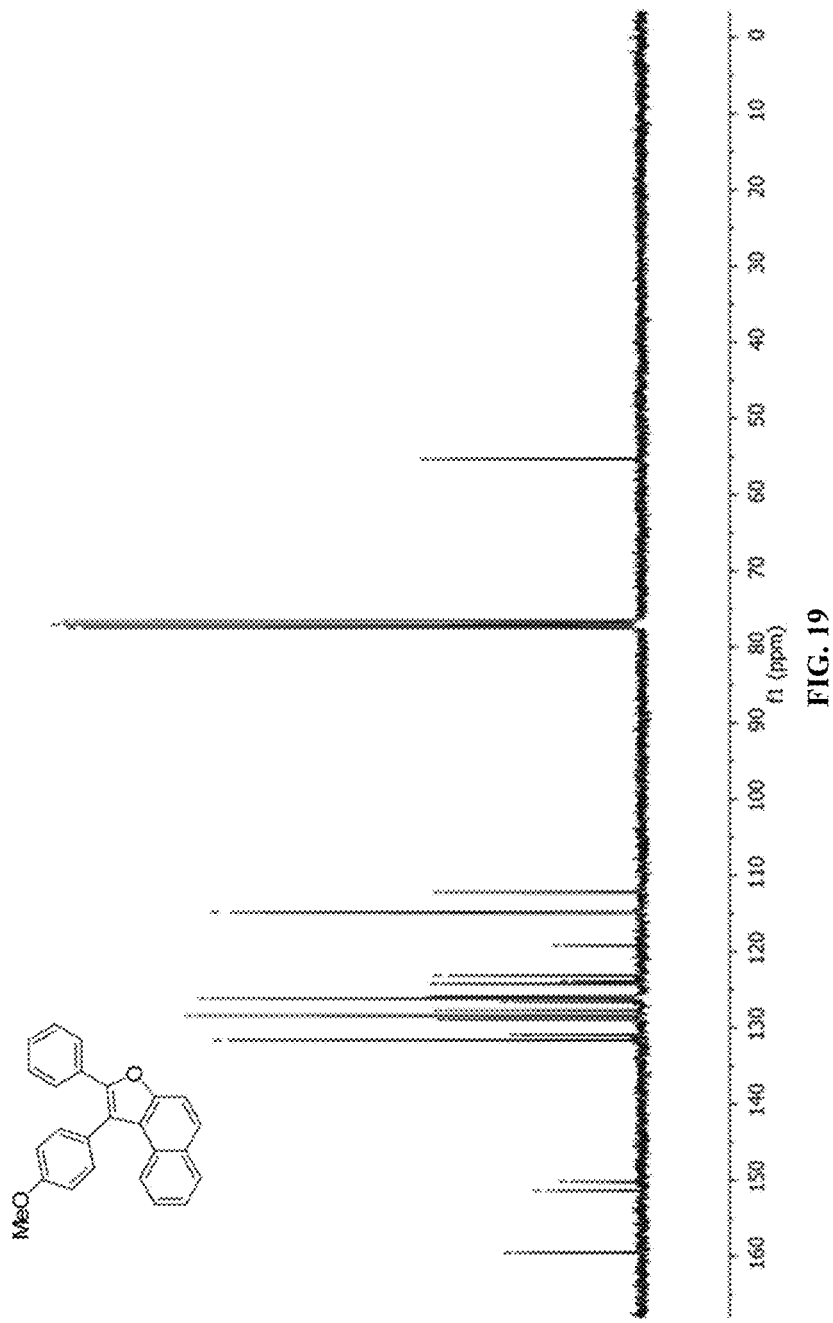
FIG. 19 depicts the (A) $^{13}C$ NMR spectrum of the possible terminal group structure in $CDCl_3$. (B) depicts the $^{13}C$ NMR spectrum of P1a/2a [sample taken from Table 3 (FIG. 6), entry 5] in $CD_2Cl_2$. The circled areas are corresponding to the terminal group signals.
Figure 19:
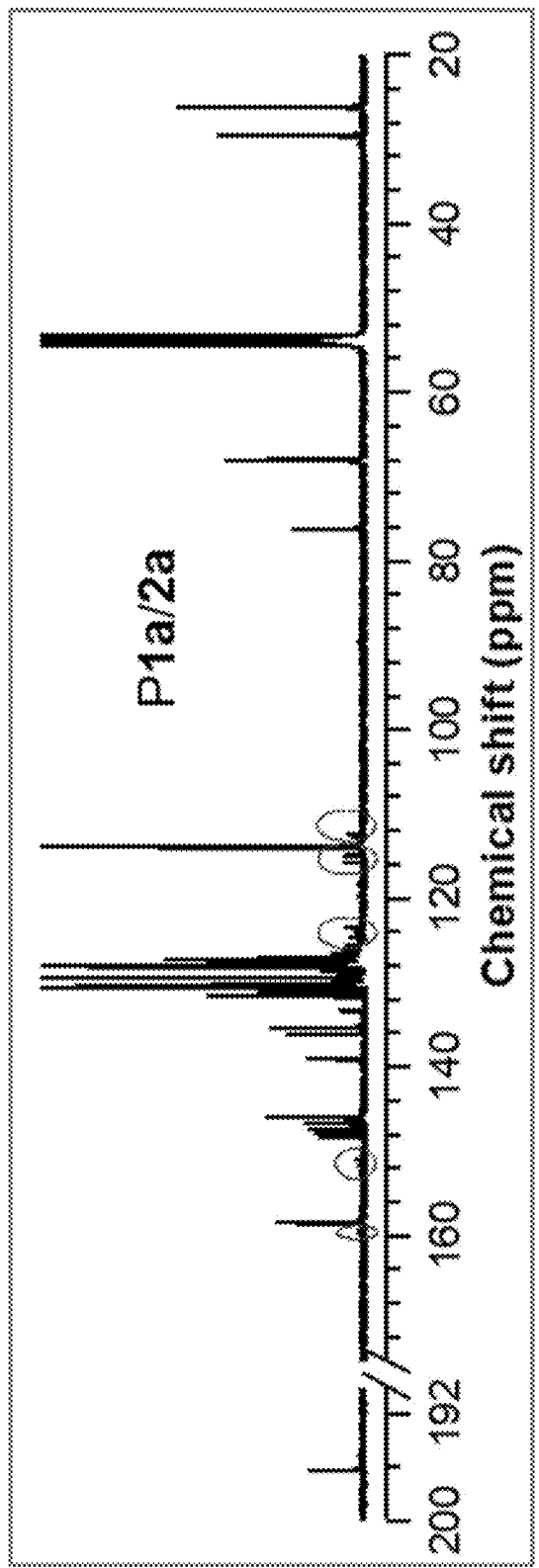
Figure 20:
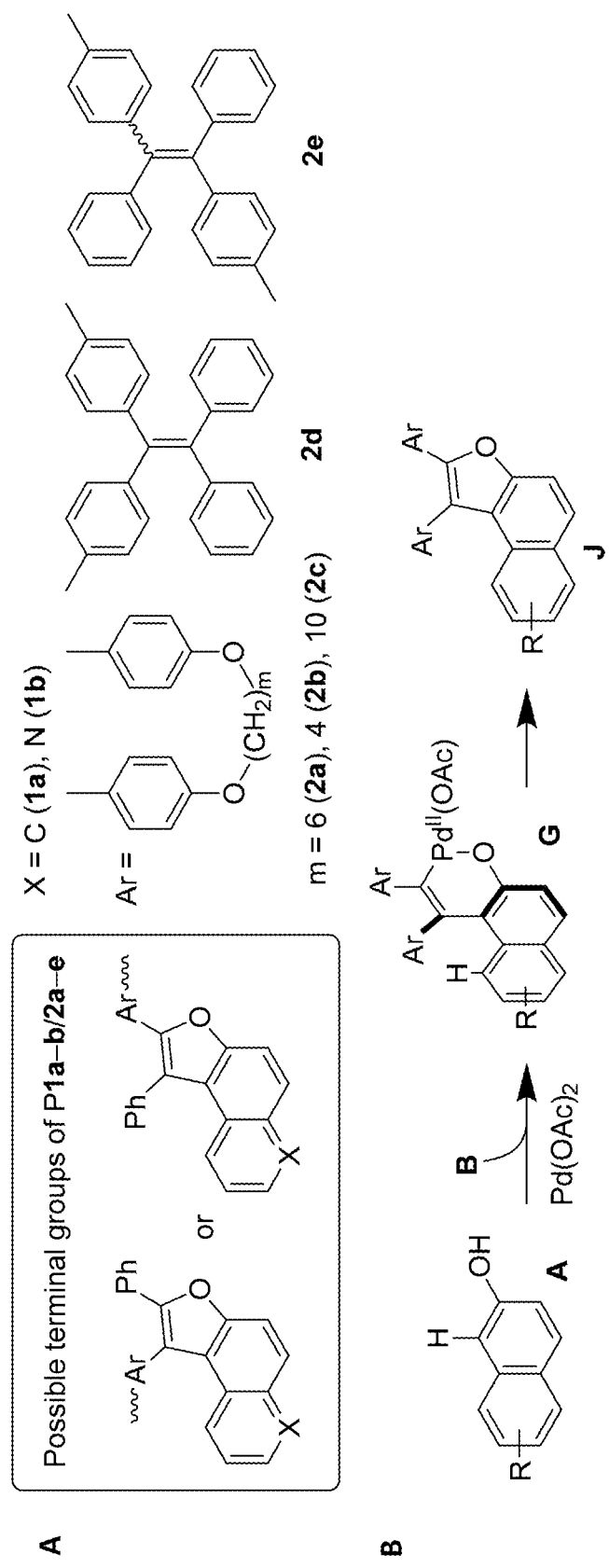
FIG. 20 depicts Scheme 5 that shows (A) the structures of the terminal groups of P1a-b/2a-e and (B) the possible mechanism for their formation.

More detailed information of the polymer structure can be gained from the $^{13}$C NMR analysis (FIG. 17). After the polymerization, the resonance peaks assigned to the acetylenic carbon atoms at δ 89.71 and 88.20 and the carbon atom adjacent to the hydroxyl group ("a" position) at δ 153.86 all disappeared in the $^{13}$C NMR spectrum of P1a/2a. Instead, a new peak at 196.23 was observed in the polymer spectrum due to the formation of the carbonyl group. Meanwhile, the aromatic carbon atom in "b" position of 1a, which resonanced at δ 109.79, was transformed into a quaternary carbon atom with peak located at δ 76.16 after reaction. The IR and NMR spectra of the polymers largely resembled those of the model compounds. By carefully investigating the reaction mechanism and comparing the NMR spectra of the obtained polymers with the reported characterization data of the possible end group structure (FIGS. 18 and 19), we found that the obtained polymers could possess addressable terminal groups with structures shown in Scheme 5A (FIG. 20). The possible formation mechanism was proposed in Scheme 5B (FIG. 20). In general, all these characterization results demonstrated that we indeed obtained polymers with the desired spirocyclic units as shown in Scheme 2 (FIG. 2).

Figure 21:
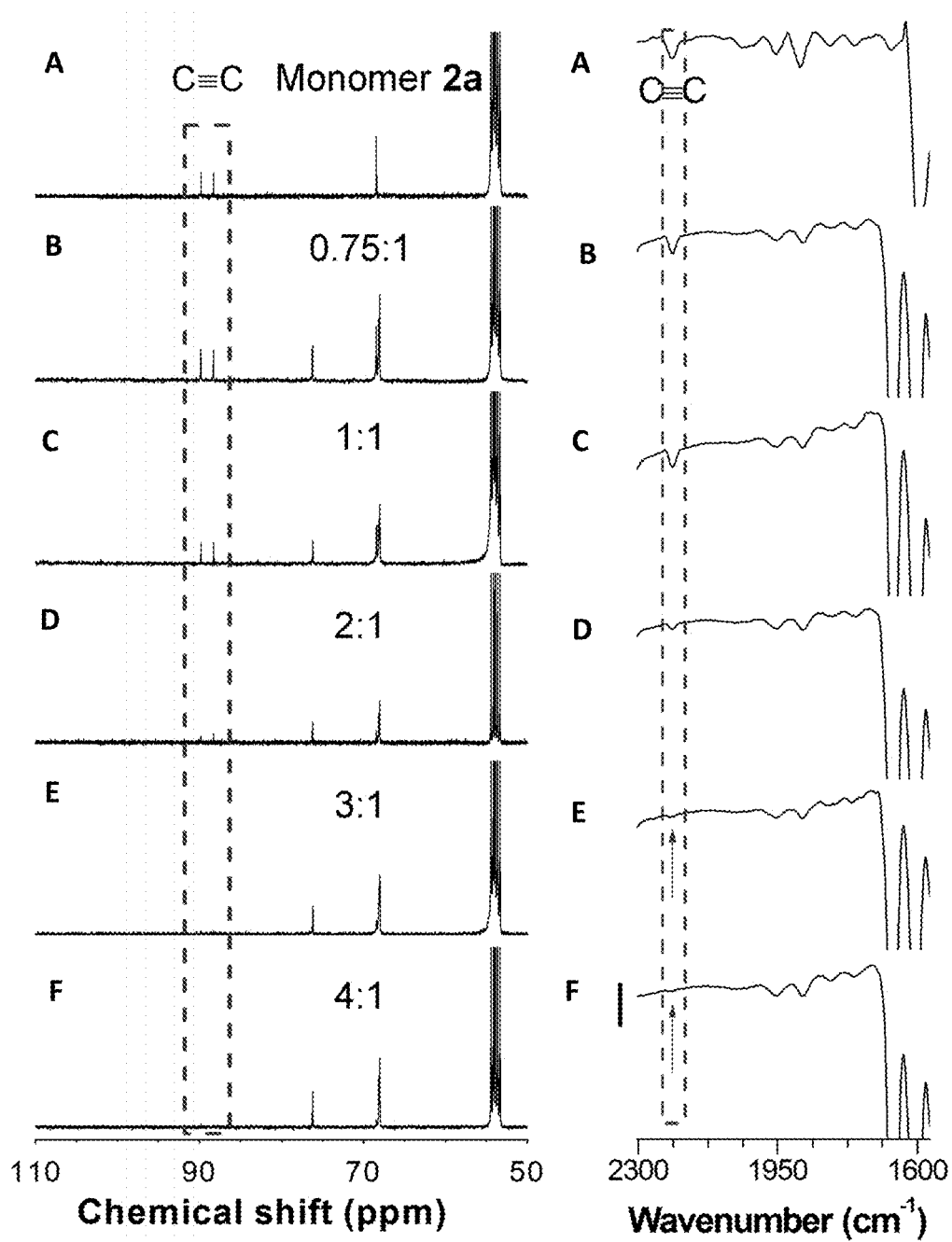
FIG. 21 depicts the $^{13}C$ NMR spectra in $CD_2Cl_2$ (left) and IR spectra (right) of (A) monomer 2a, (B-F) P1a/2a [sample takens from Table 3 (FIG. 6), entries 1-5, respectively].
Figure 22:
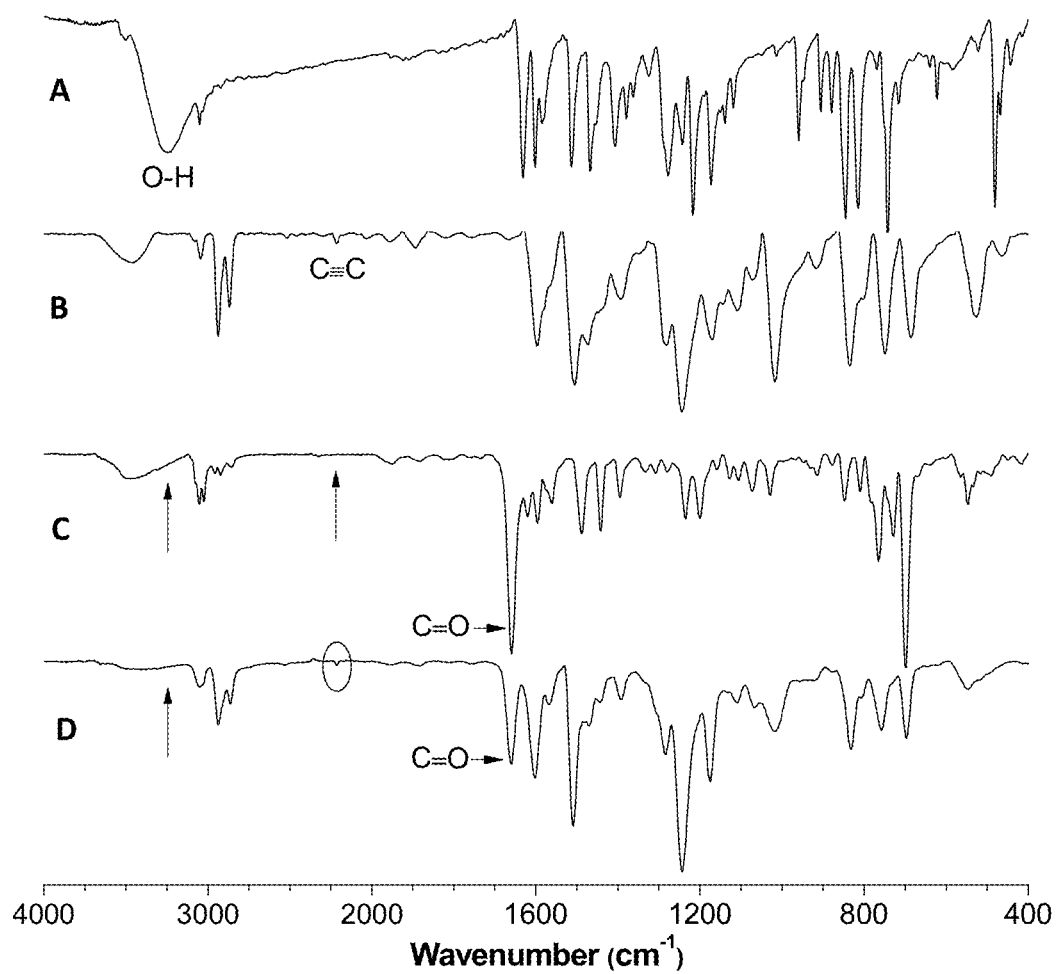
FIG. 22 depicts the IR spectra of (A) 1a, (B) 2a, (C) 4, and (D) P1a/2a [sample taken from Table 3 (FIG. 6), entry 2].
Figure 23:
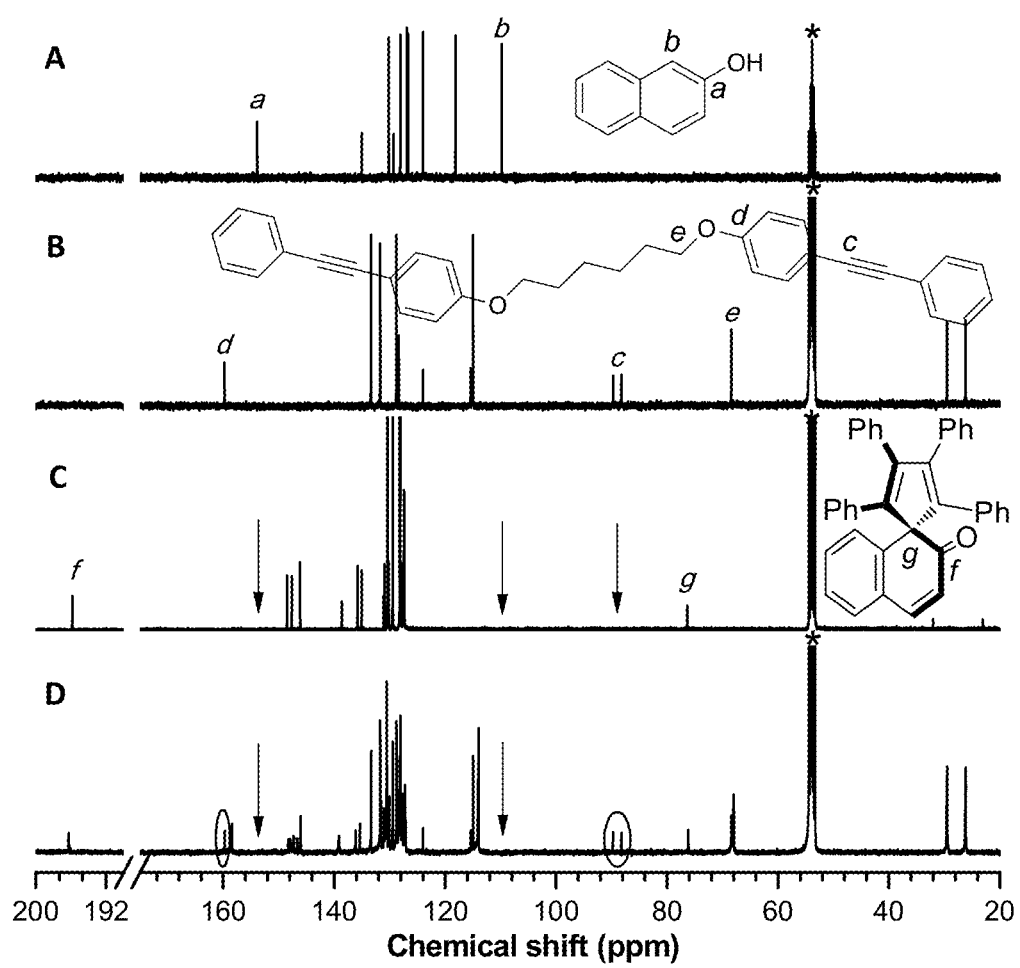
FIG. 23 depicts the $^{13}C$ NMR spectra of (A) 1a, (B) 2a, (C) 4 and (D) P1a/2a [sample taken from Table 3 (FIG. 6), entry 2] in $CD_2Cl_2$.
Figure 24:
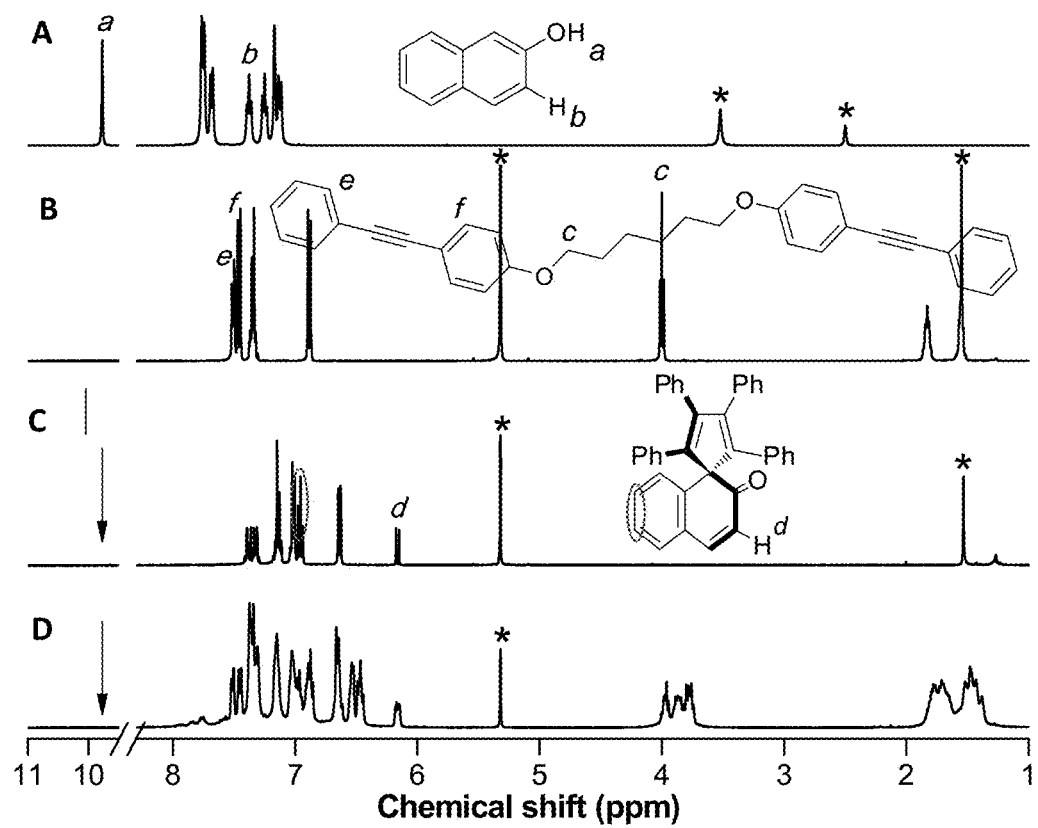
FIG. 24 depicts the $^1H$ NMR spectra of (A) 1a, (B) 2a, (C) 4 and (D) P1a/2a [sample taken from Table 3 (FIG. 6), entry 2] in $CD_2Cl_2$.
Figure 25:
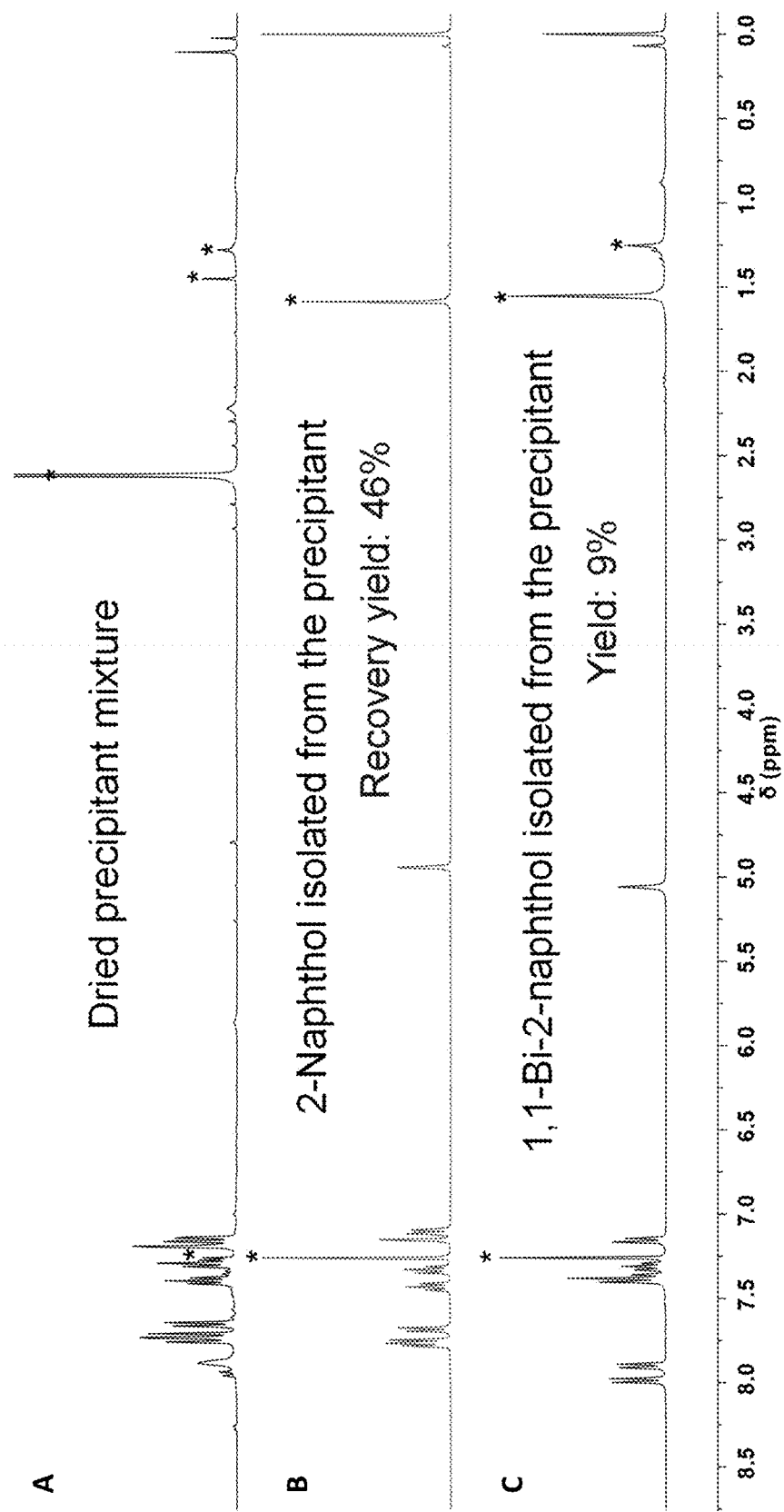
FIG. 25 depicts the $^1H$ NMR spectra of the (A) dried precipitant mixture, (B) 2-napthol isolated from the percipient, (C) 1,1-bi-2-napthol isolated from the percipient in $CDCl_3$, (D) $^1H$ NMR spectra of the 2-naphthol product isolated from the precipitant in $CDCl_3$, (E) $^{13}C$ NMR spectra of the 2-naphthol product isolated from the precipitant in $CDCl_3$, (F) HRMS (MALDI-TOF) spectrum of the 2-naphthol product isolated from the precipitant, (G), $^1H$ NMR spectra of the 1,1-bi-2-naphthol product isolated from the precipitant in $CDCl_3$, (H) $^{13}C$ NMR spectra of the 1,1-bi-2-naphthol product isolated from the precipitant in $CDCl_3$, (I) HRMS (MALDI-TOF) spectrum of the 1,1-bi-2-naphthol product isolated from the precipitant, and (J) a possible mechanism for the formation of 1,1-bi-2-naphthol.
Figure 25:
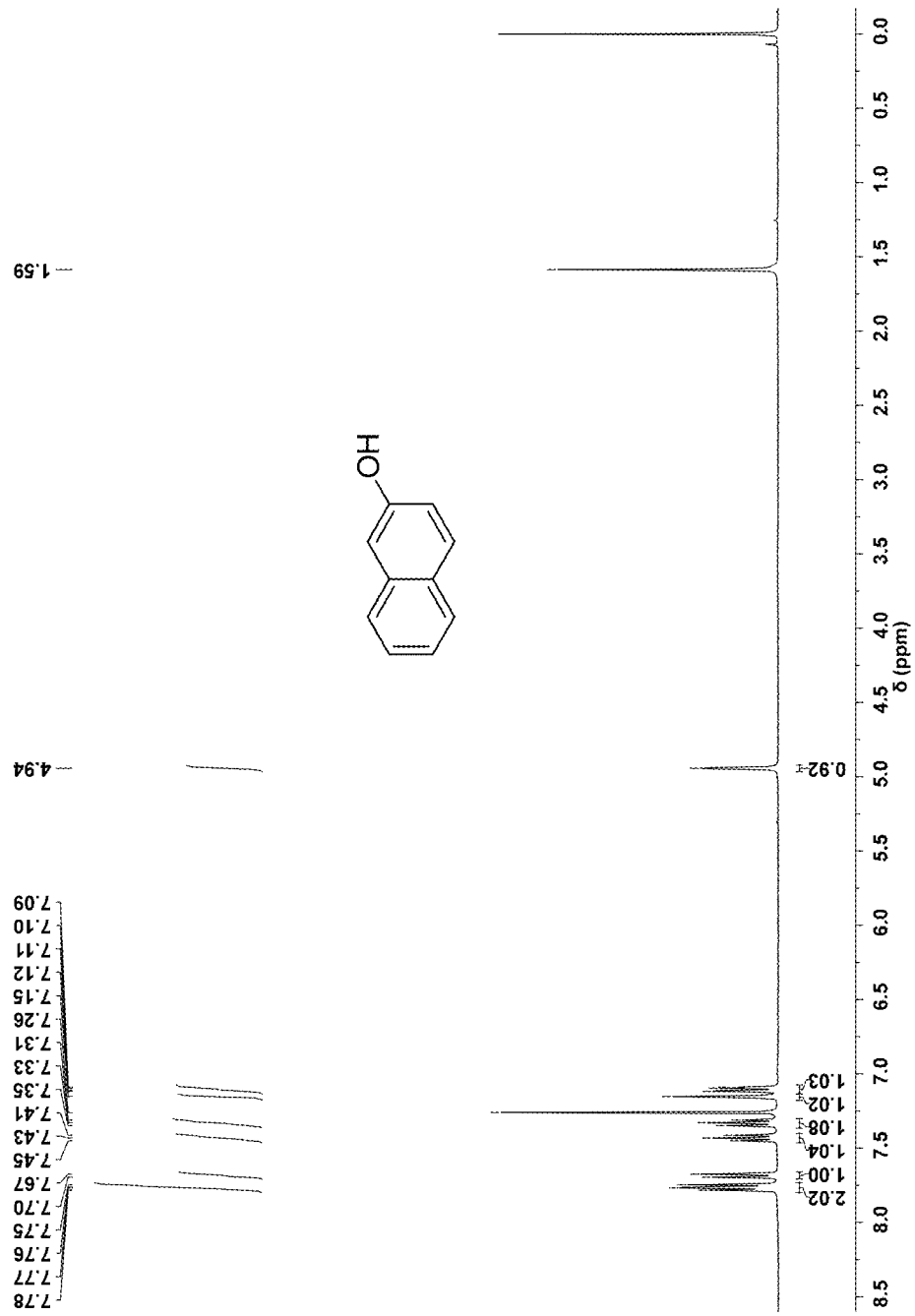
Figure 25:
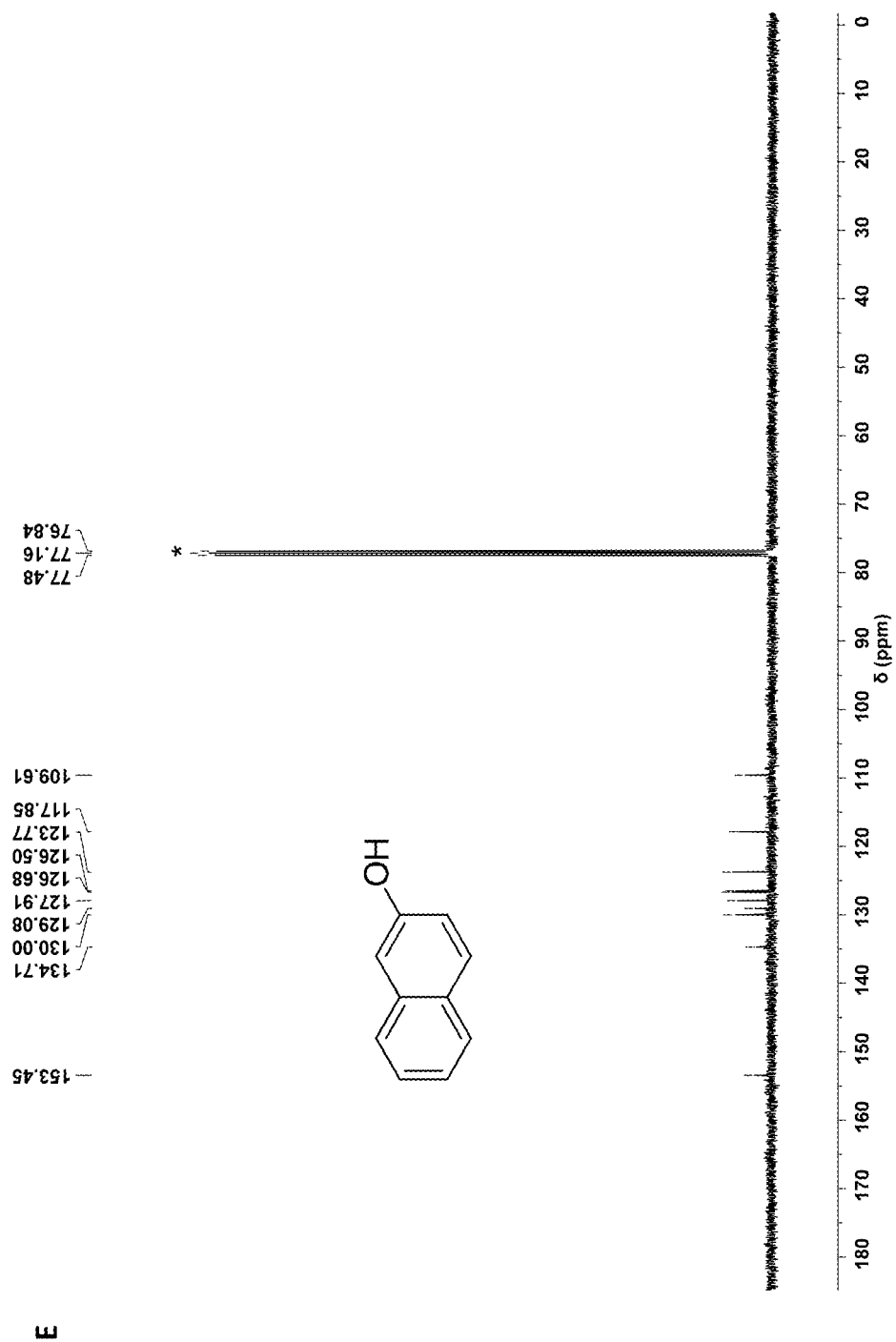
Figure 25:
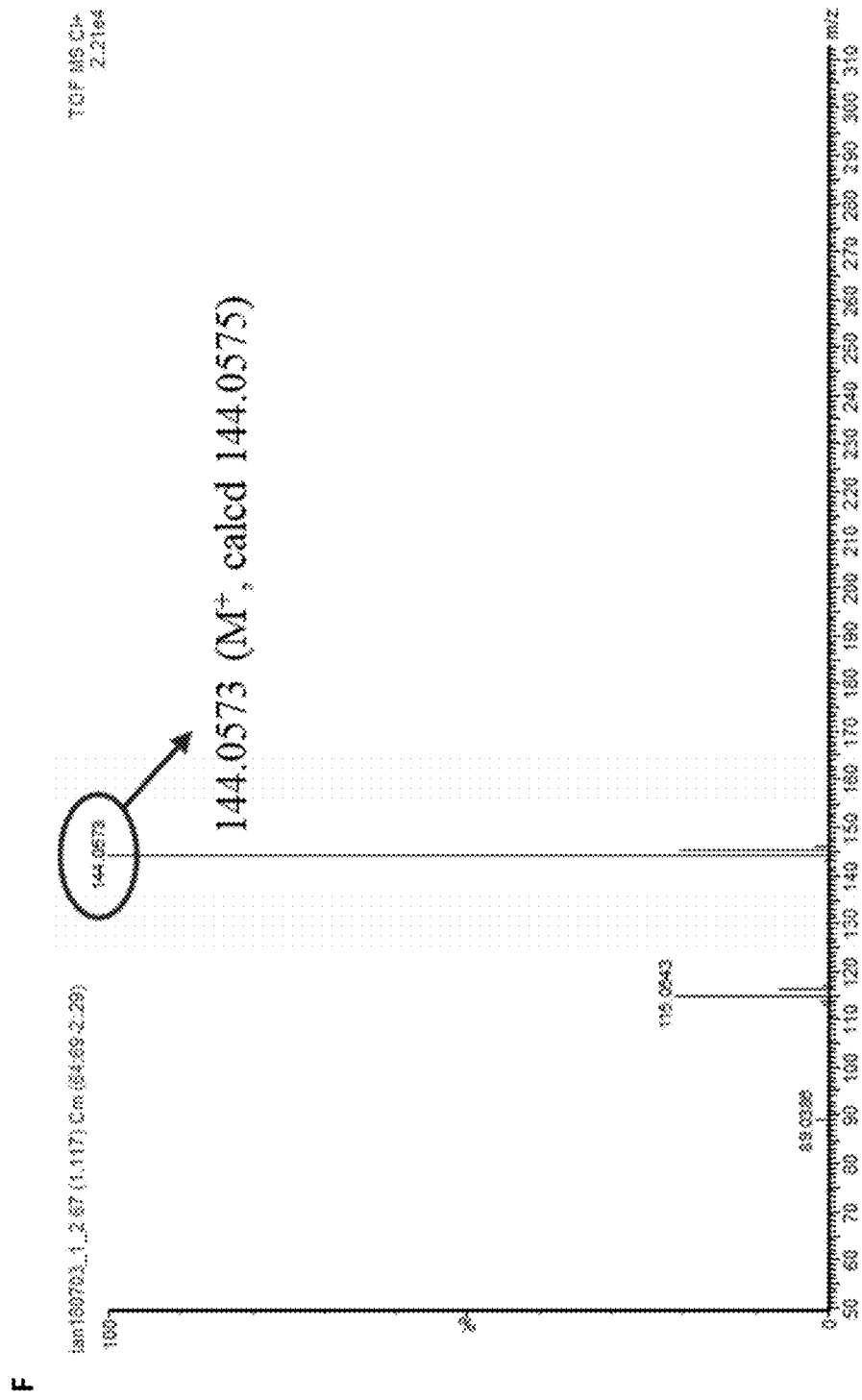
Figure 25:
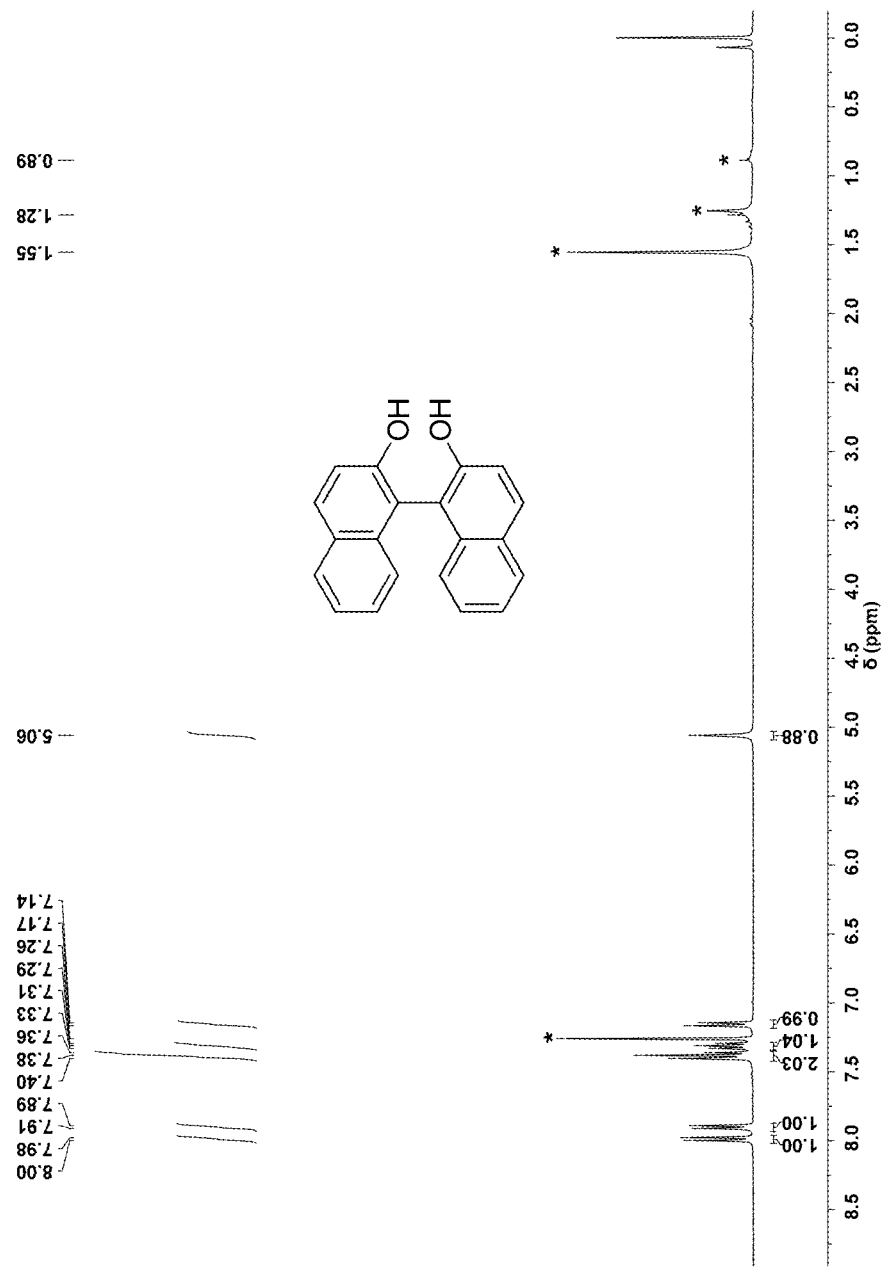
Figure 25:
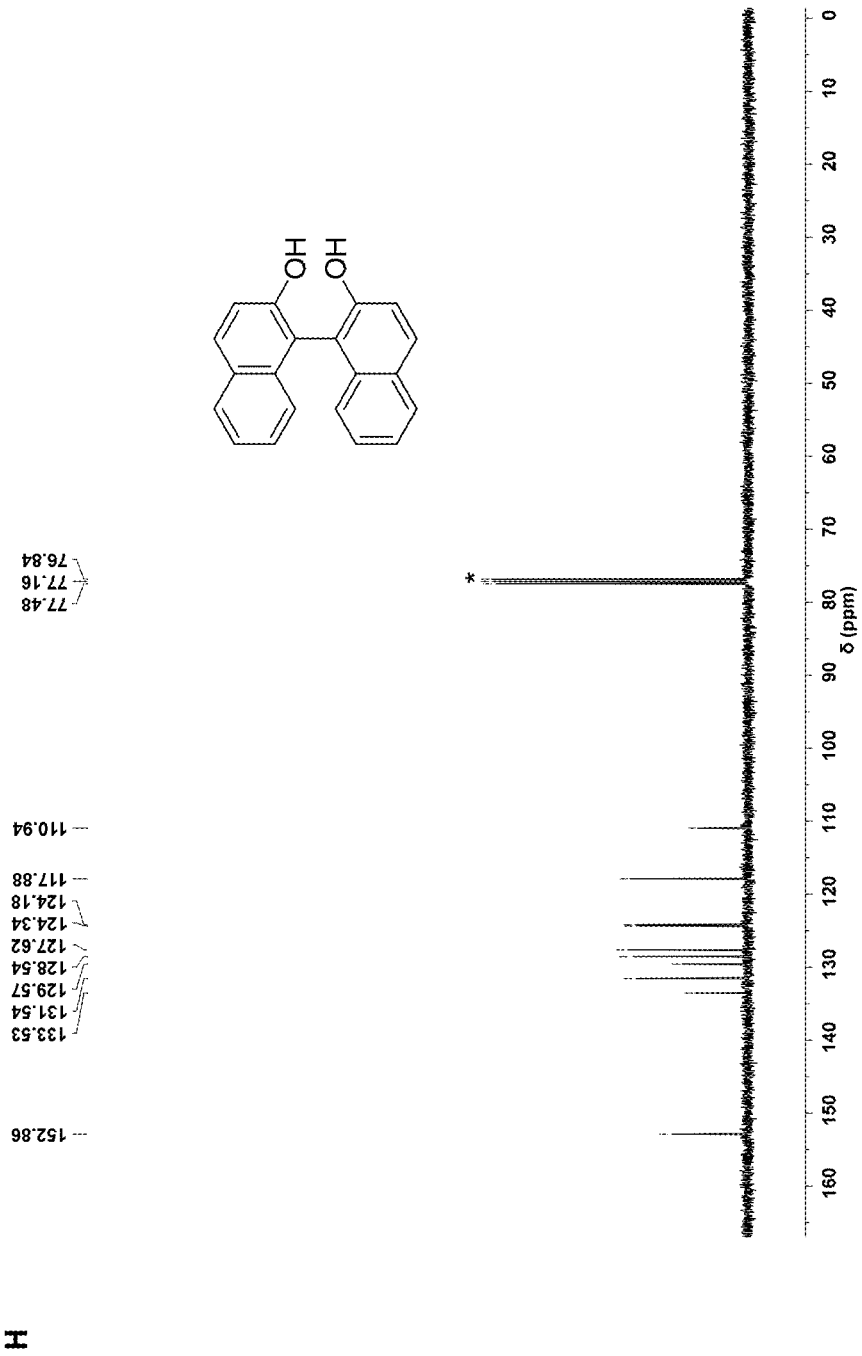
Figure 25:
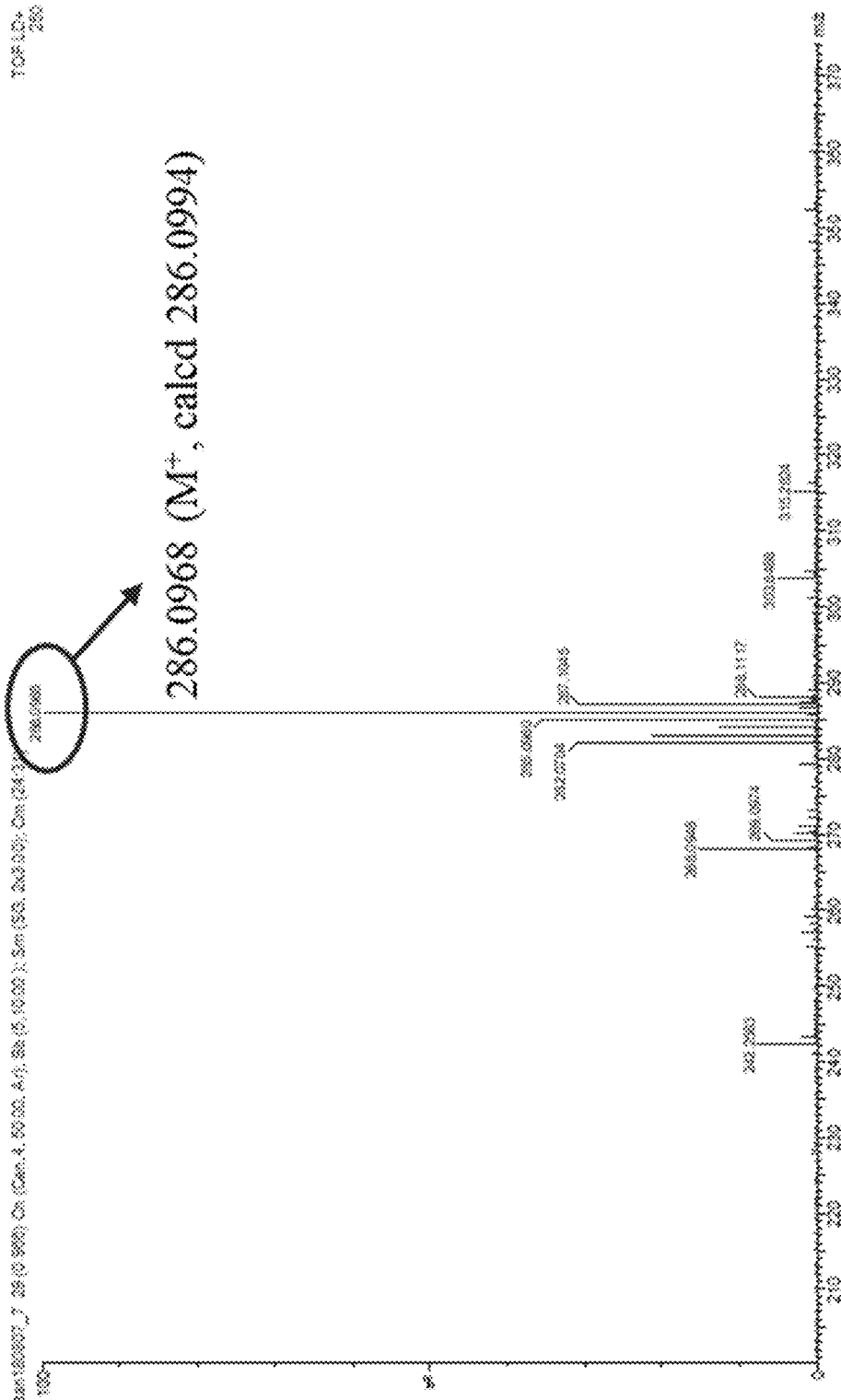
Figure 25:
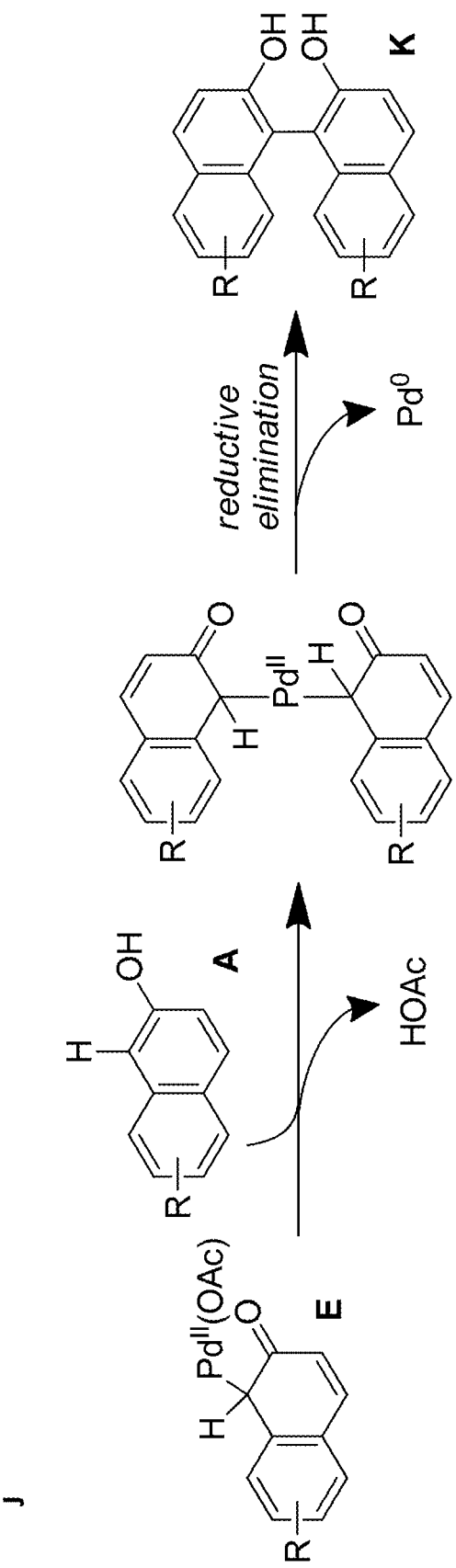

In addition to the GPC results shown in Table 3 (FIG. 6), the structural characterization data of the polymers generated from different monomer ratios further supported the monomer non-stoichiometry-favored effect of this polymerization. As illustrated in FIG. 21-23, the signals assignable to the CC group are obviously observed in the IR and $^{13}$C NMR spectra of polymeric products obtained at [1a]:[2a]=0.75:1 or 1:1. Besides, the peaks associated with the resonances of the protons in monomer 2a at δ 4.00 and 7.52-7.45 are also detected in the $^1$H NMR spectra of these polymers (FIG. 24). The results implied the presence of triple-bond containing species such as the unreacted internal diynes or the end groups embedded in the oligomeric products. However, the aforementioned spectral signals become weaker and weaker as the monomer feed ratio of 1a and 2a gradually increases and are almost absent when the ratio reaches 4:1. This tendency suggested that adding an excess amount of 2-naphthol (1a) can promote the consumption of the diyne monomer (2a) and thus improve the polymerization efficiency. These characterization results provide a strong proof for our proposed "reactive intermediate" mechanism.

Analysis of the Filtrate Composition: To investigate what happened to the excess 1a, the filtrate was purified and analyzed after the filtration treatment process of the polymerization between 2-naphthol (173.0 mg, 1.2 mmol) and internal diyne 2a (141.2 mg, 0.3 mmol). Two pure compounds were isolated from the precipitant mixture by evaporation of the solvents in vacuo and the subsequent column chromatography on silica gel using DCM as eluent. The structures of the isolated products were verified to be 2-naphthol and 1,1-bi-2-naphthol, respectively, by HRMS, $^1$H NMR and $^{13}$C NMR (FIG. 25D-I). The recovery yield of 2-naphthol (59.0 mg) was calculated to be 46% and the yield of 1,1-bi-2naphthol (11.7 mg) was determined to be 9%. A possible mechanism for the formation of 1,1-bi-2-naphthol is provided in FIG. 25J. These results may explain the low conversion efficiency of the 2-naphthol monomer.

Figure 26:
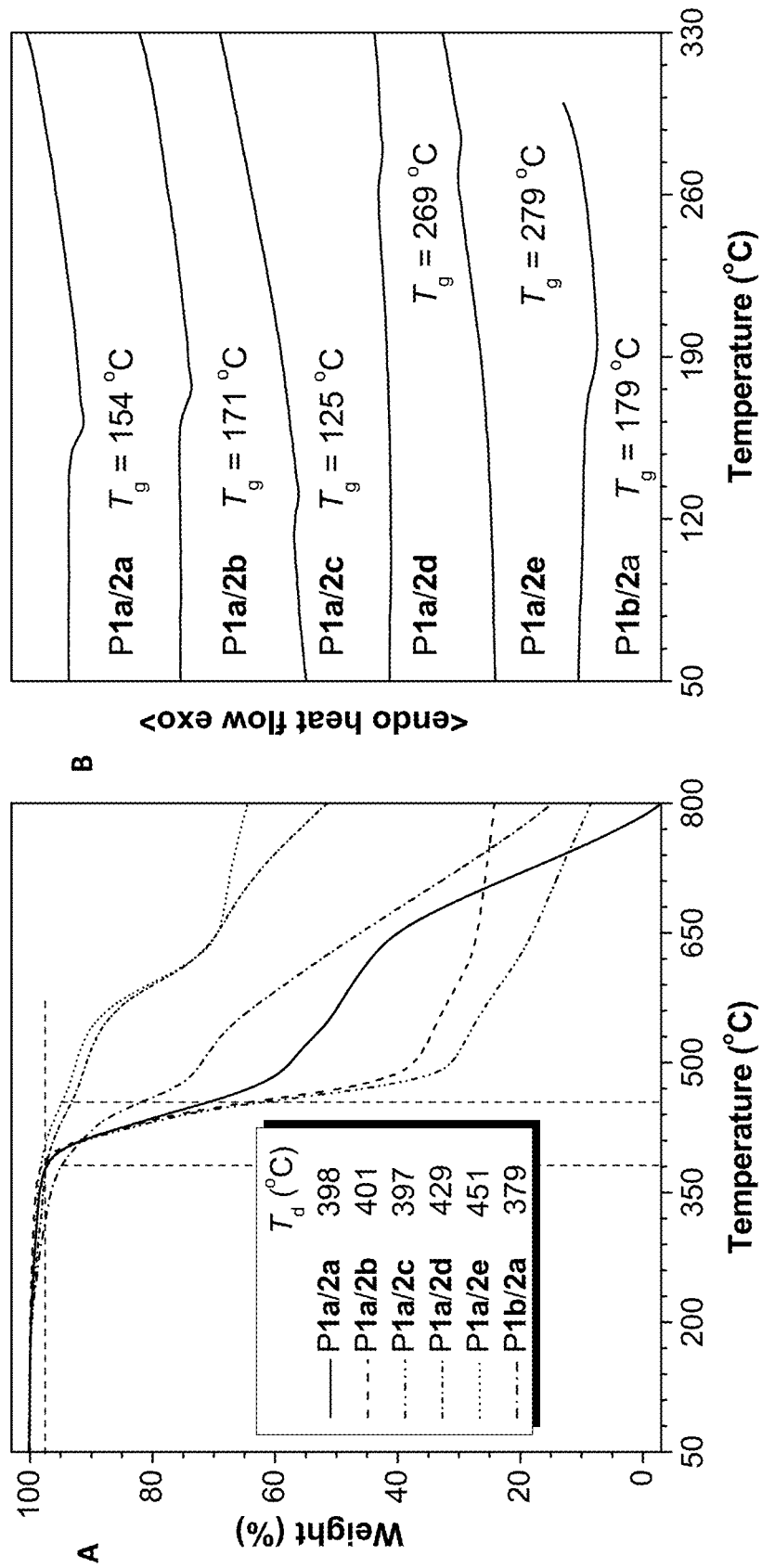
FIG. 26 depicts the (A) thermal gravimetric analysis (TGA) curves and (B) differential scanning calorimetry (DSC) thermograms during the second heating cycle of P1a-e/2a-b [samples taken from Table 7 (FIG. 10)] recorded under nitrogen at a heating rate of 10° C./min.

The thermal properties of the obtained polymers were evaluated by the thermogravimetric analysis (TGA) and differential scanning calorimetry (DSC) measurement under nitrogen. As shown in FIG. 26A, the decomposition temperature ($T_d$) at the point of 5% weight loss of P1a-b/2a-e was as high as 379-451° C. Thanks to the conjugated structures, the TPE-containing polymers P1a/2d-e exhibited a high char yield of 52% and 65%, respectively, when they are heated to 800° C. The high thermal stability allows these polymers to serve as potential heat-resistant materials. It has been reported that spirocyclic compounds are generally characterized with high glass transition temperatures ($T_g$) due to their bulky structure. Therefore, the spirocyclic polymers prepared in this work are also expected to possess high $T_g$ values. Indeed, the DSC results shown in FIG. 26B revealed that all polymers possessed good morphologial stability with $T_g$ located in the range of 125-279° C. In addition, these spirocyclic polymers can be well dissolved in common organic solvents, such as THF, dichloromethane, chloroform, 1,2-dichloroethane, etc., presumably due to the presence of flexible ether linkages or the twisted conformation of TPE units in their structures. They also possessed good film-forming ability and can be readily fabricated into uniform thin films by the facile spin-coating process. Combining with their good thermal and morphological stabilities, the obtained polymers are promising to be applied in organic optoelectronics.

Figure 27:
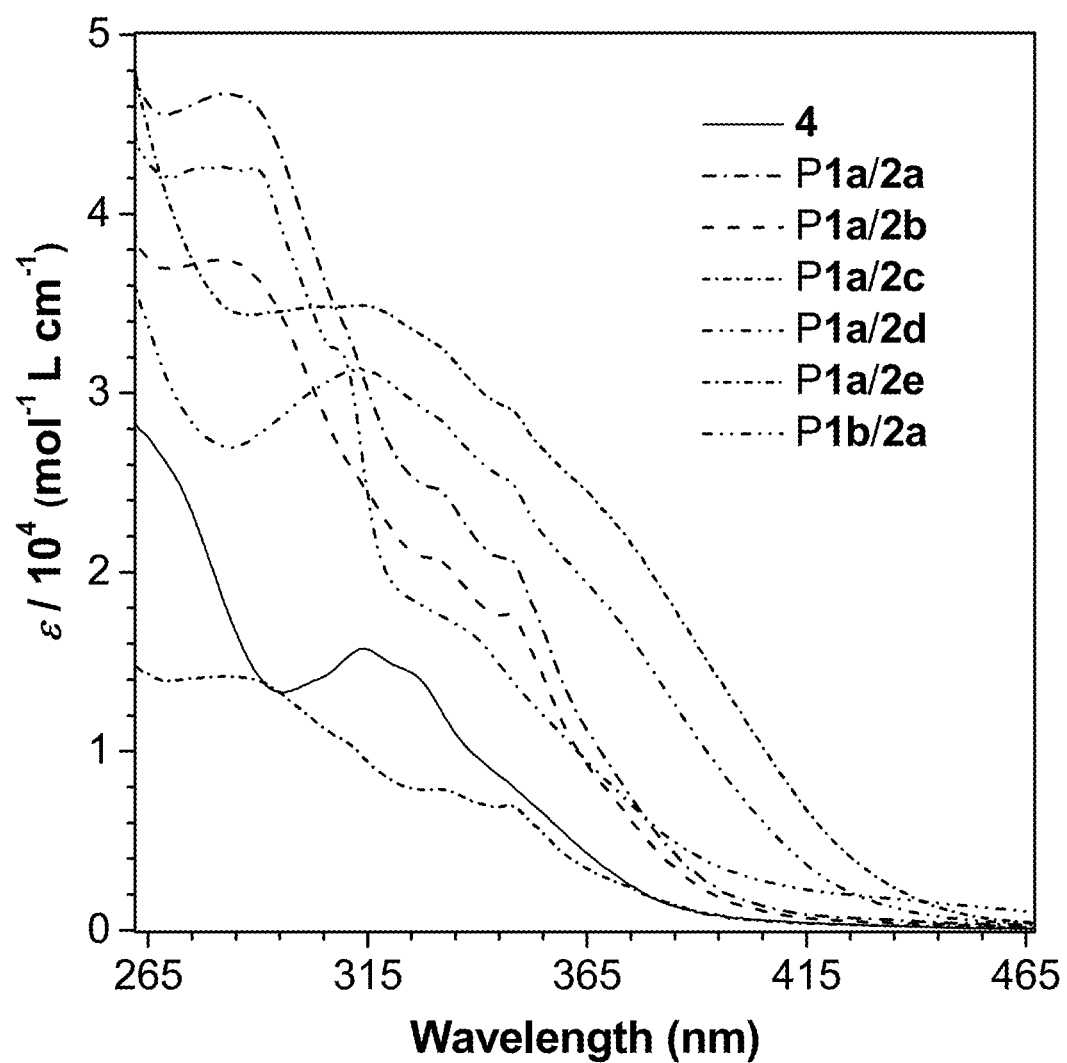
FIG. 27 depicts the absorption spectra of P1/2 [samples taken from Table 7 (FIG. 10)] in THF solutions. Solution concentration: 10 µM.

As depicted in FIG. 27, the onset absorption wavelength ($\lambda_{onset}$) of the polymers fell in the range of 392-433 nm, which is longer than that of 4 ($\lambda_{onset}$=382 nm). This result may be indicative of the larger electronic conjugation of the polymer structures than the model compound. Among the polymers, the TPE-containing P1a/2d-e absorb at the reddest region due to their conjugated structures. The spacer length and heteroatom have little effect on the ground-state electronic transitions of this polymer system as the absorption spectra of the P1a-b/2a-c show similar $\lambda_{onset}$ at ~392 nm.

Figure 28:
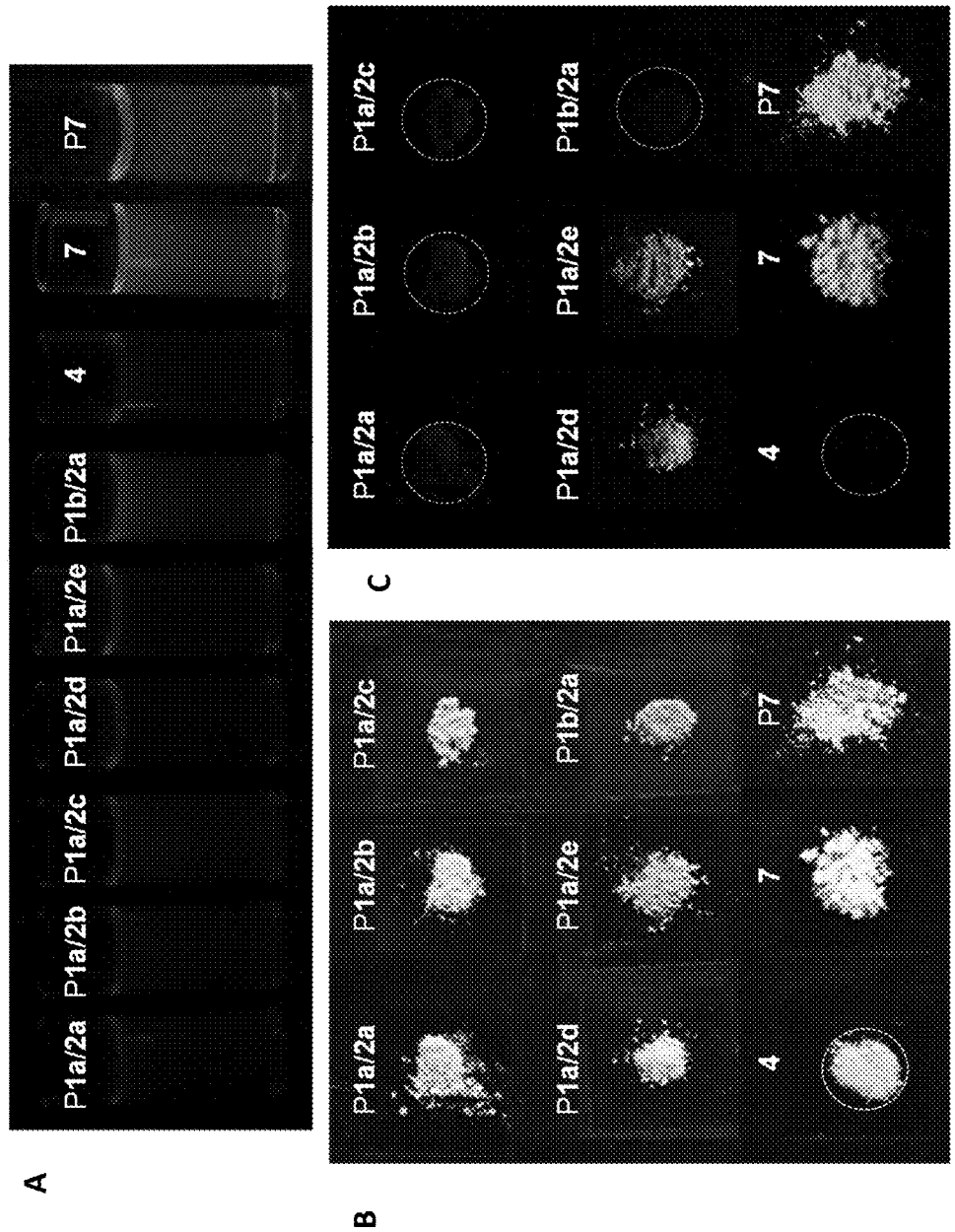
FIG. 28 depicts photos of (A) a THF solution of the exemplary polymers and model compounds, (B) powder of polymers and model compounds taken under natural light and (C) powder of polymers and model compounds taken under UV irradiation at 365 nm from a hand-held UV lamp.
Figure 29:
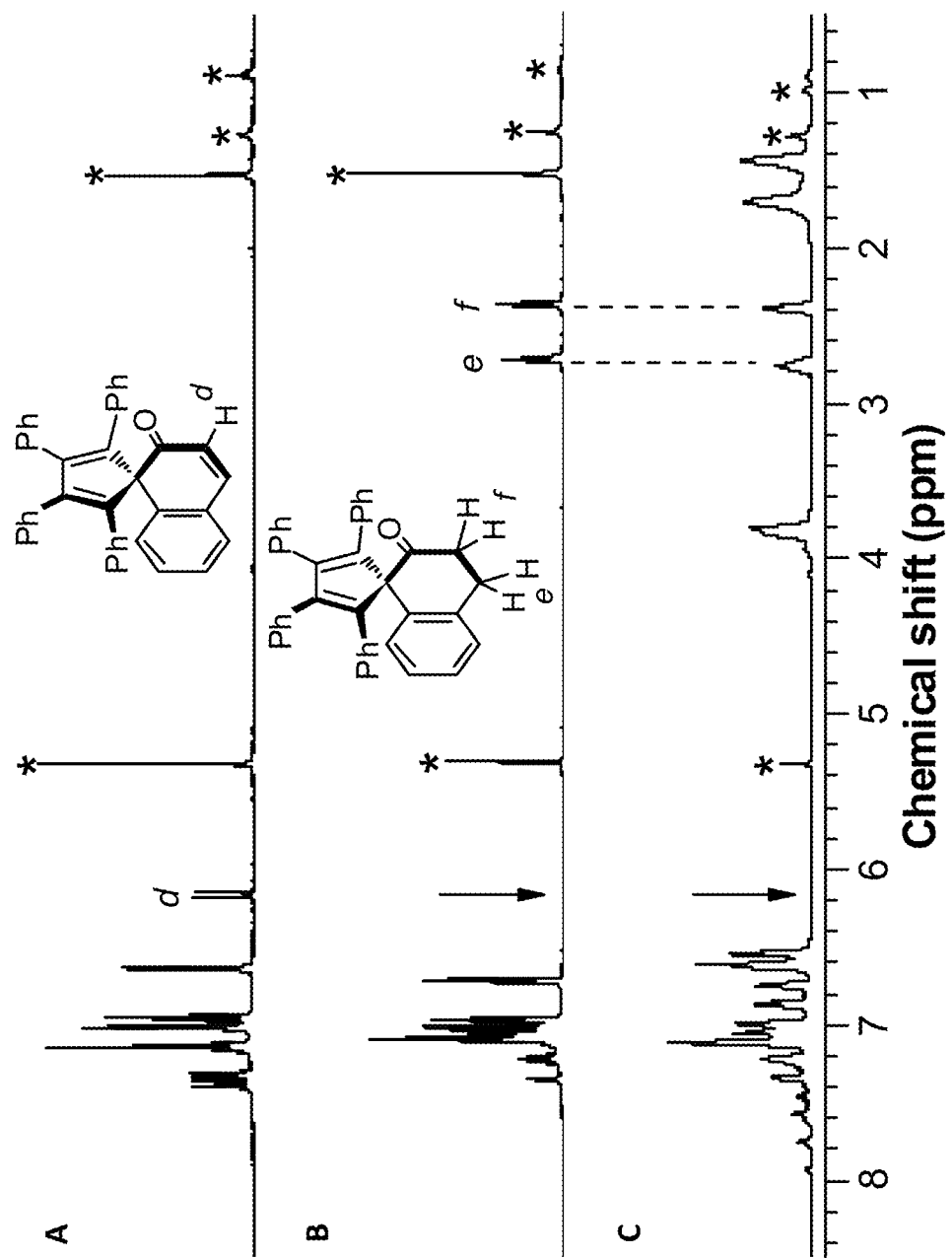
FIG. 29 depicts the $^1H$ NMR spectrum of (A) 4, (B) 7, and (C) P7 in $CD_2Cl_2$.
Figure 30:
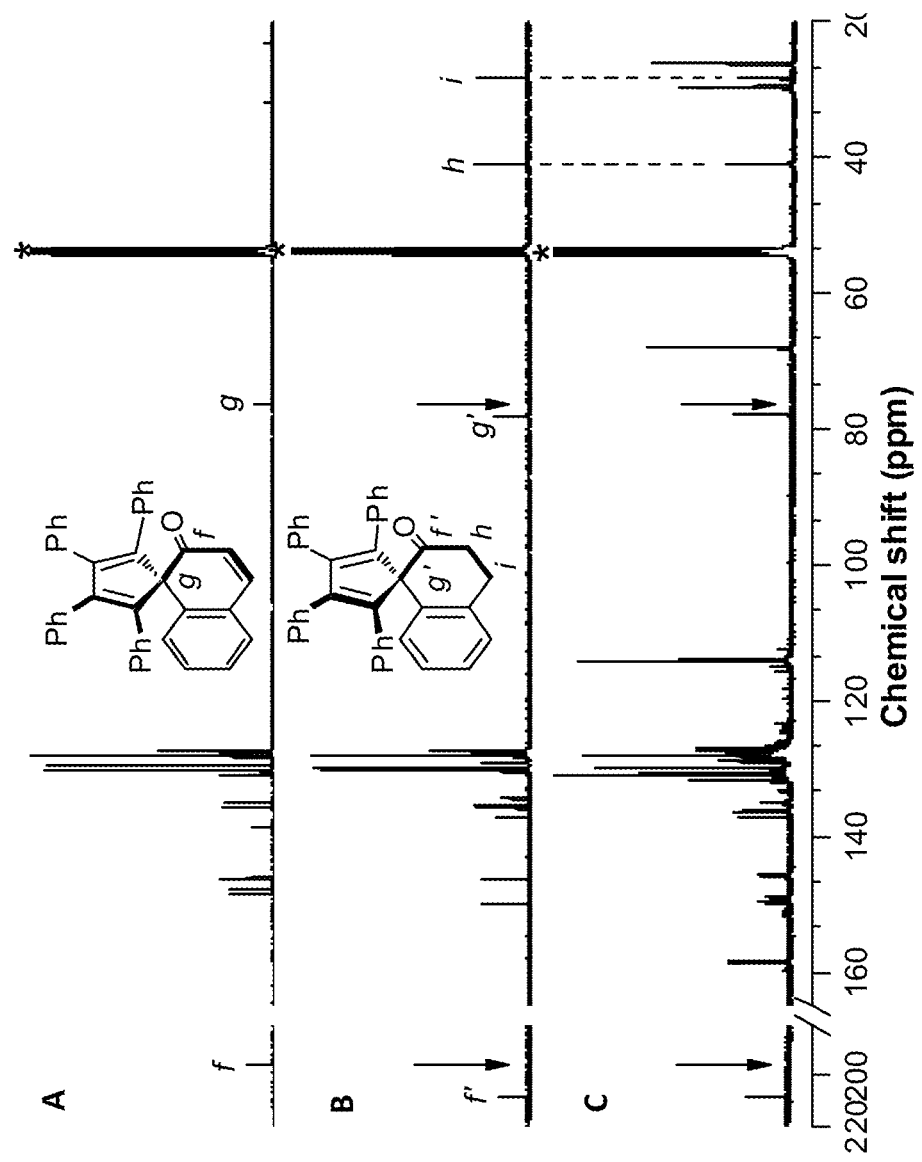
FIG. 30 depicts the $^{13}C$ NMR spectrum of (A) 4, (B) 7, and (C) P7 in $CD_2Cl_2$.
Figure 31:
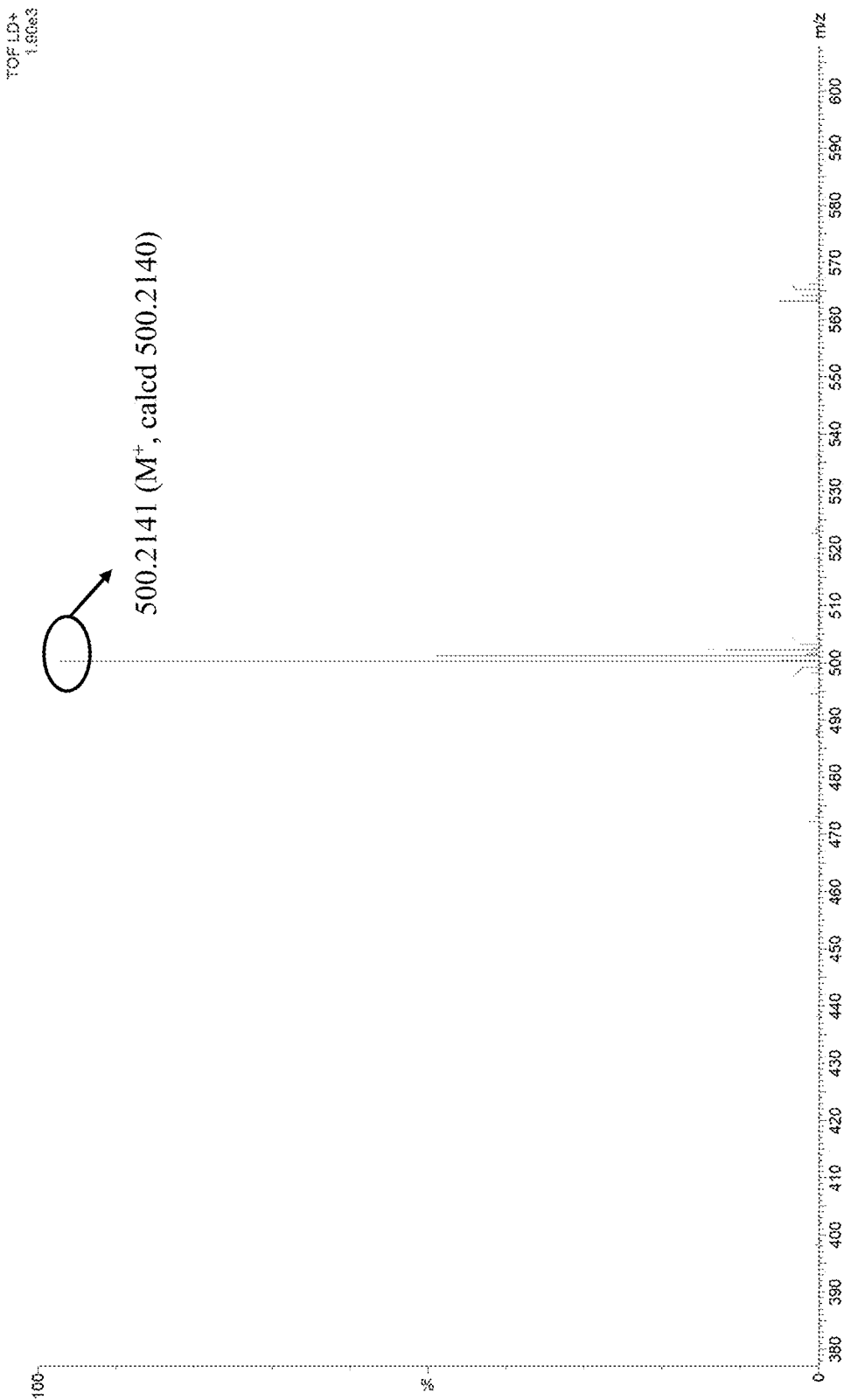
FIG. 31 depicts the HRMS (MALDI-TOF) spectrum of 7.
Figure 32:
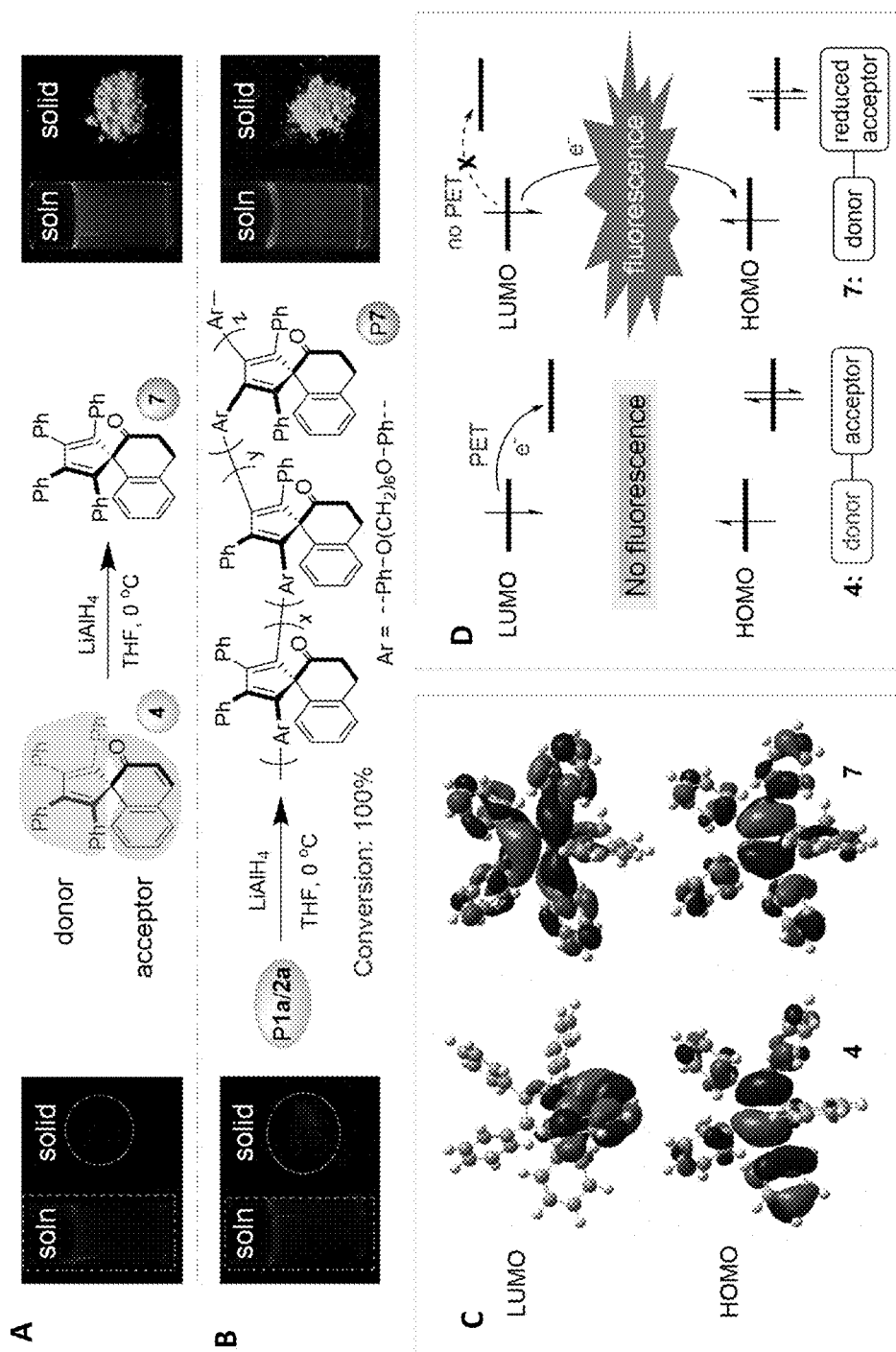
FIG. 32 depicts photophysical properties of model compounds and polymers before and after reduction with $LiAlH_4$ and the investigation on their emission mechanism. (A) Depicts the reduction reaction of model compound 4. Inset: fluorescent photographs of the THF solution and powder of 4 (left side) and 7 (right side). (B) Reduction reaction of P1a/2a. Inset: fluorescent photographs of the THF solution and powder of P1a/2a (left side) and P7 (right side). (C) Depicts the molecular orbitals of 4 and 7 in the ground state calculated by B3LYP/6-31G(d,p). (D) Schematic illustration of the modulation of fluorescence properties by the photoinduced electron transfer (PET) process in compounds 4 and 7.
Figure 33:
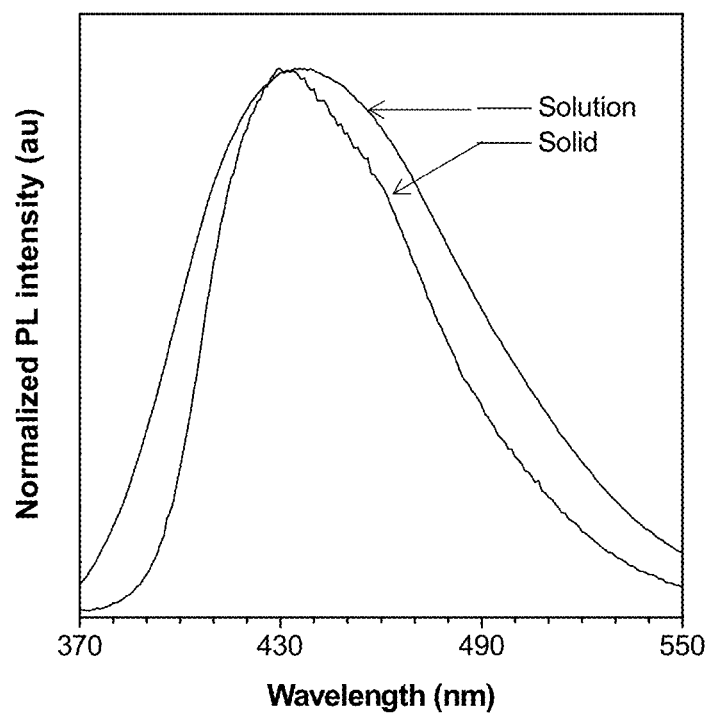
FIG. 33 depicts the normalized PL spectra of the THF solution and solid powder of 7. Excitation wavelength: 350 nm.

As for the photoluminescence (PL) properties, it was found that P1a-b/2a-c and the model compound are almost non-emissive (FIG. 28). Further investigation indicated that their faint fluorescence is may be due to photoinduced electron transfer (PET) process. To assist the mechanics study, model compound 7 was synthesized by the reduction of model compound 4 using $LiAlH_4$. The structure of 7 was confirmed by $^1H$ NMR, $^{13}C$ NMR and HRMS analysis (FIG. 29-31). As shown in FIG. 32A, once the the α,β double bond in the naphthalen-2(1H)-one moiety of 4 was reduced to a single bond, the resulting compound 7 exhibited strong blue fluorescence under UV illumination with the maximal emission wavelength ($\lambda_{em}$) at ~430 nm (FIG. 33). The frontier molecular orbitals of 4 and 7 were calculated by the density functional theory using the B3LYP/6-31G(d,p) basis set (FIG. 32B). The highest occupied molecular orbital (HOMO) of 4 is primarily localized over the upper tetraphenyl cyclopentadiene moiety, while its lowest unoccupied molecular orbital (LUMO) is mainly concentrated on the naphthalen-2(1H)-one part. These calculation results suggested that 4 or the structural repeat unit of P1a-b/2a-c possess a donor-acceptor structure. By contrast, the electron cloud distribution of the HOMO and LUMO of the reduced product (7) are similar. FIG. 32C provides a schematic illustration of the possible PET process. In model compound 4, the excited electron is easily transferred from donor to acceptor, which hinders the return of electron to the HOMO of the donor (TPA fluorophore), thus leading to the fluorescence quenching. After reduction reaction, the LUMO of the reduced donor located at a lower energy than that of the donor. Therefore, the PET process is blocked and the excited electron of 7 can undergo radiative decay to show strong fluorescence.

Figure 34:
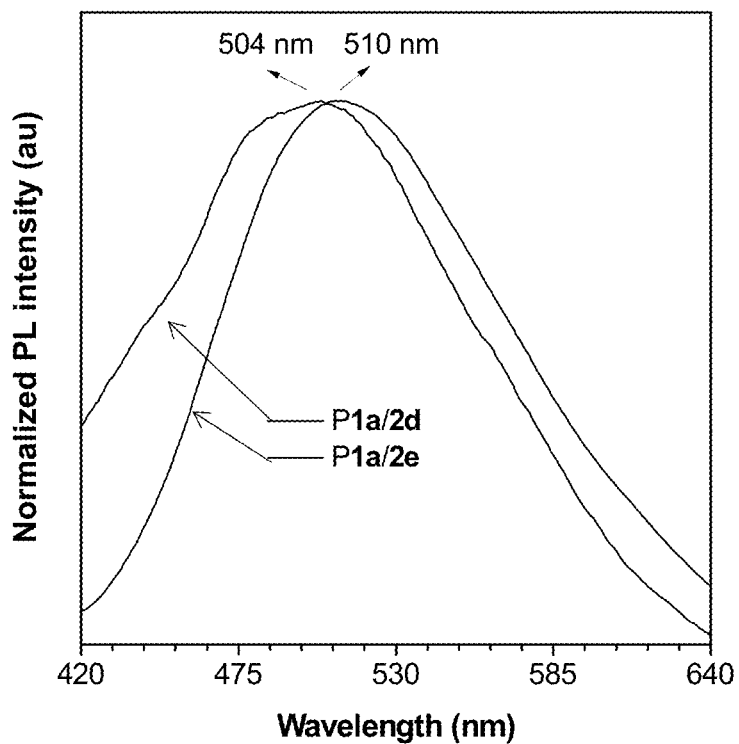
FIG. 34 depicts the normalized PL spectra of the solid powder of P1a/2d and P1a/2e. Excitation wavelength: 350 nm.
Figure 35:
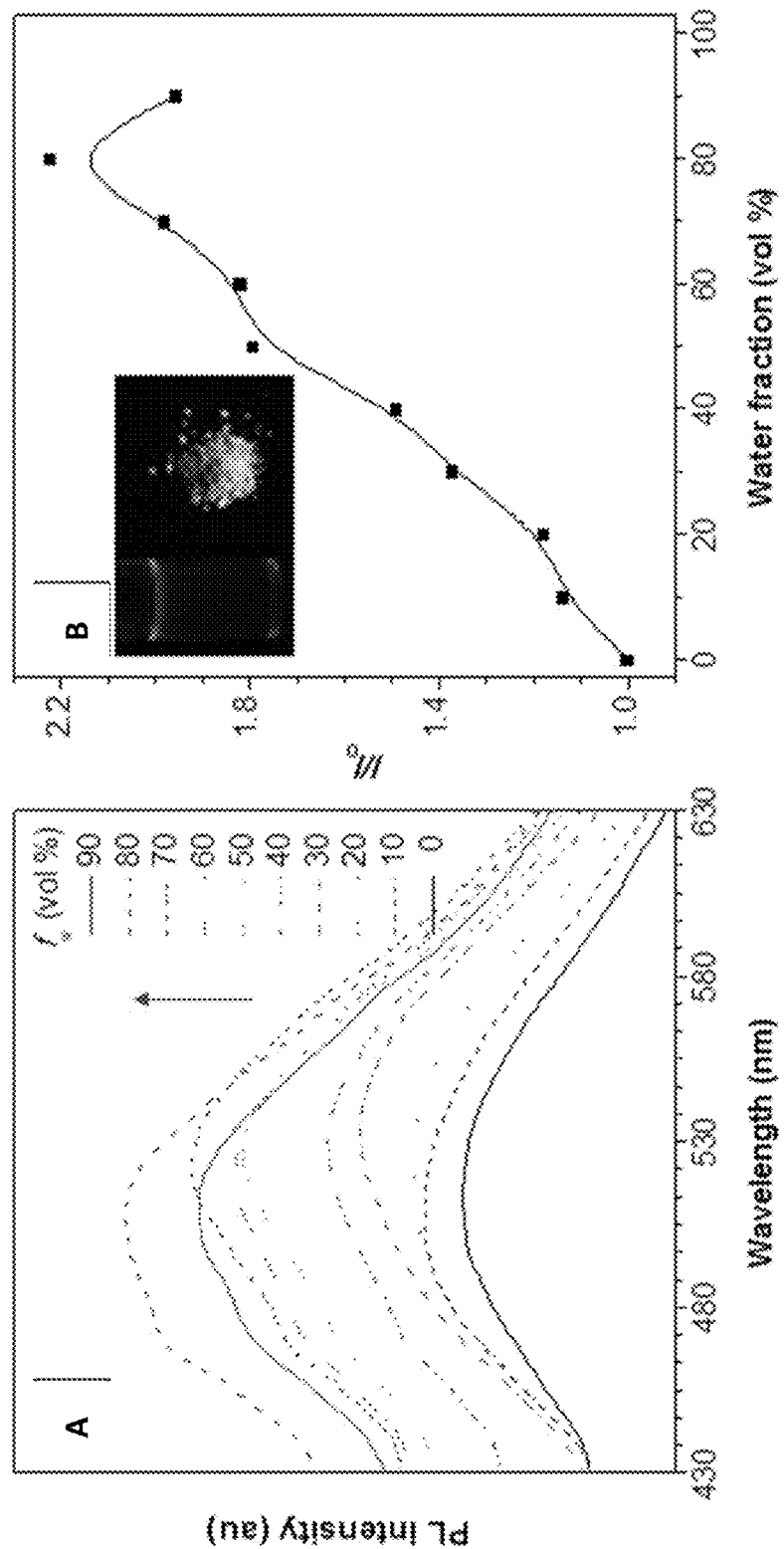
FIG. 35 depicts the (A and C) Photoluminescence (PL) spectra of (A) 7 and (C) P7 in THF and THF/water mixtures with different water fractions ($f_w$). (B and D) Plot of the relative PL intensity ($I/I_0$) versus the composition of the aqueous mixtures of (B) 7 and (D) P7. $\alpha_{AIE}=I/I_0$, where $I/I_0$=intensity at $f_w$=0%. Solution concentration: 10 µM. Excitation wavelength: 320 nm. Inset: fluorescent images of the THF solution and powder of 7 and P7 taken under a hand-held UV lamp.
Figure 35:
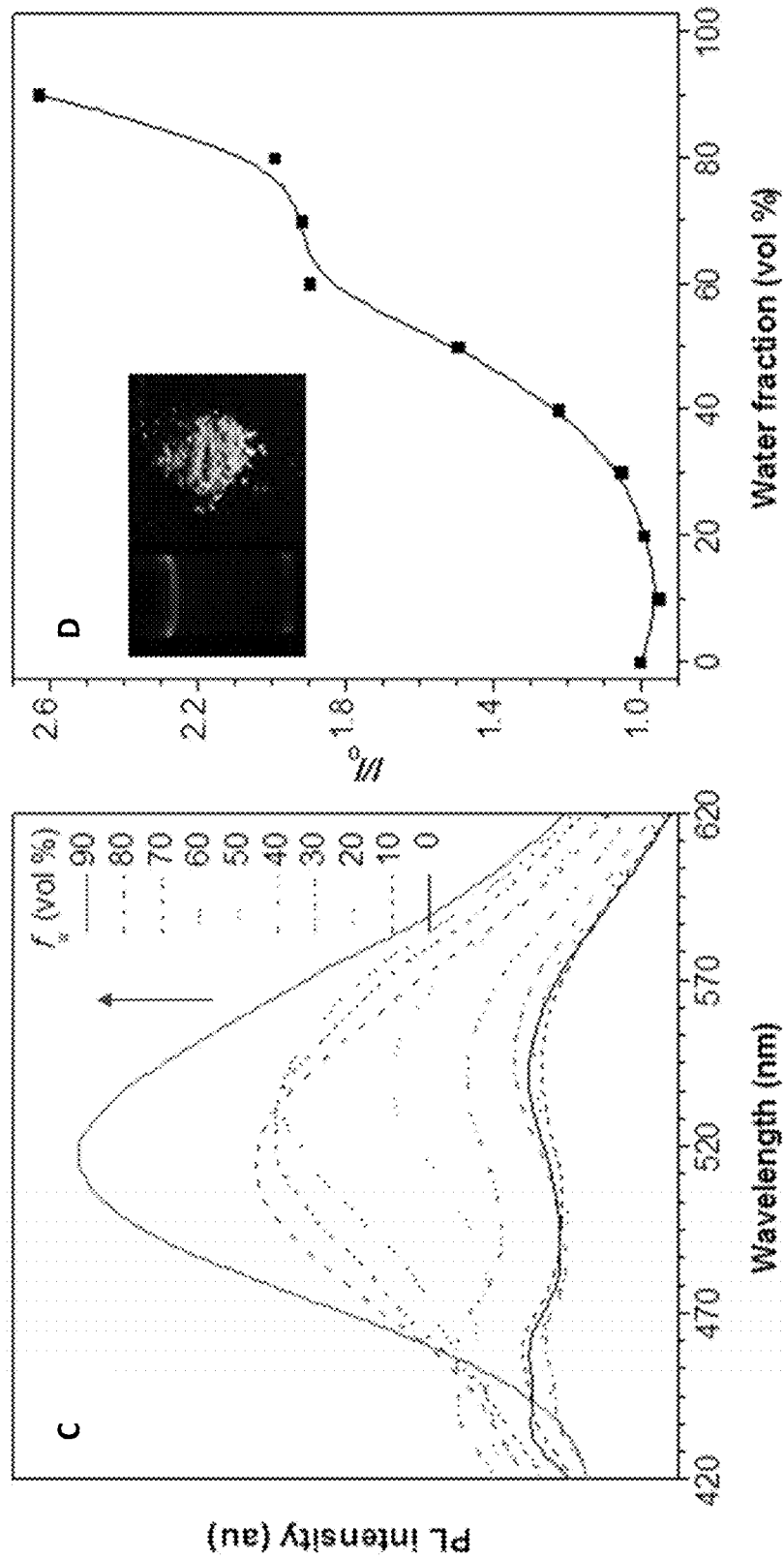

On the other hand, the solid powder of the TPE-containing polymers P1a/2d and P1a/2e showed obvious fluorescence (FIG. 28) with $\lambda_{em}$ at 504 nm and 510 nm, respectively (FIG. 34). Without wishing to be bound by theory, it is believed that this phenomenon could be explained by the suppression of the PET process due to the change in the polymer electronic structures after introducing TPE unit. Furthermore, P1a/2d-e showed an aggregation-enhanced emission (AEE) property as indicated by the results shown in FIG. 35. Their dilute THF solutions were weakly emissive under UV irradiation. However, upon addition of water, the polymer chains were induced to form aggregates and the PL intensity was gradually enhanced. The highest emission intensity of P1a/2d and P1a/2e was observed in 80 vol % and 90 vol % aqueous mixtures, respectively. Besides, the stronger fluorescence of the solid powder of P1a/2d-e than their THF solutions also demonstrated their AEE characteristics (see the inset images in FIGS. 35B and D). Without wishing to be bound by theory, it is believed that the AEE effect of these two TPE-containing polymers can be ascribed to the restriction of intramolecular motions (RIM) mechanism. In the solution state, the rotations and vibrations of the luminogens are less restricted, which will consume energy and serve as nonradiative relaxation pathways for the excited state of the luminogens. After aggregation, these motions will be largely restricted and thus the light emission is stronger in the aggregated or solid state. The AEE property enables the polymers to find potential applications as light-emitting materials and in biological fields.

Figure 36:
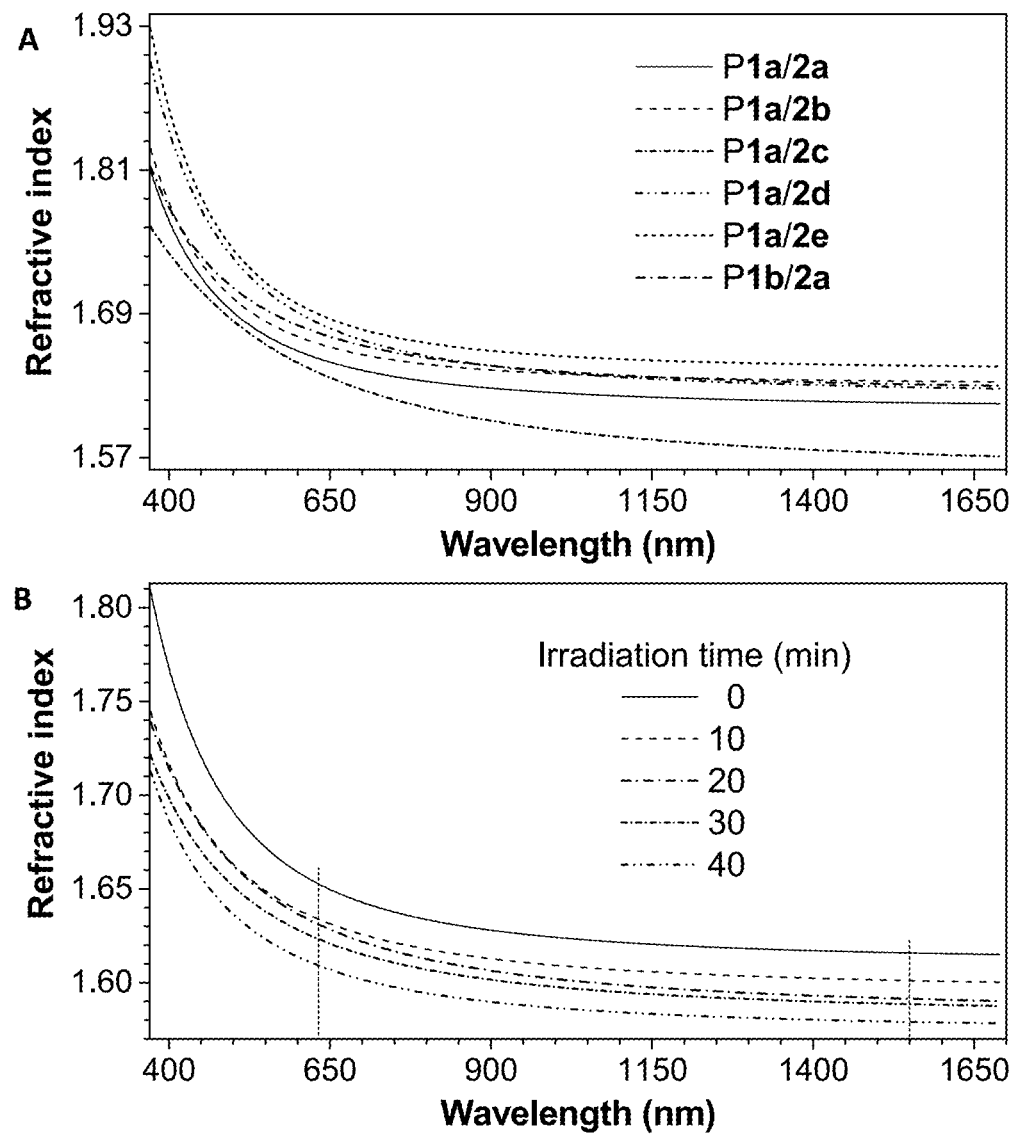
FIG. 36 depicts the (A) Wavelength dependence of refractive indices of thin films of P1/2 [samples taken from Table 7 (FIG. 10)]. (B) Change in refractive index of a thin film of P1a/2a by UV irradiation.

High-refractive-index polymers (HRIPs) are highly desirable materials for the fabrication of advanced optoelectronics due to their advantages of good processability, low cost, light weight, excellent impact resistance and dyability over inorganic glasses. As shown in FIG. 36A and Table 8 (FIG. 37) (entries 1-6), all the obtained spirocyclic polymers showed high refractive index (n) of 1.9224-1.6461 in a wavelength region of 380-890 nm. Their n values at 632.8 nm were generally over 1.66, which were much higher than those of the commercially important optical plastics. Such high refractive indices can be ascribed to the presence of numerous polarized phenyl rings in the polymer structures. The results of P1a/2a-c revealed that the n values of the polymers can be tuned by changing the spacer length. Among P1a/2a-c, the polymer with the shortest spacer length (P1a/2b) showed the highest n value (1.6782) due to its highest aromatic content. The TPE-containing polymers P1a/2d and P1a/2e showed even higher refractive indices than those of P1a/2a-c because of their higher aromatic contents. In addition to high aromatic content, heteroatom is another well-known contributor for increasing refractivity. As expected, the heterocycle-containing polymer (P1b/2a) exhibited a higher refractive index (n=1.8790-1.6744) than that of P1a/2a (n=1.7935-1.6569). Besides the high refractive index, small chromic dispersion (large Abbé number) is also desirable for practical optical applications of HRIPs. The Abbé number ($v_D$) of the obtained spirocyclic polymers were calculated to be in in the range of 19.8957-10.8955 and the corresponding chromic dispersion (D) values were in the range of 0.0918-0.0503, where D is defined as the reciprocal of VD. These results demonstrated that P1a-b/2a-e possess both high refractive index and small chromic dispersions, which make them promising coating materials in advanced optical display systems.

The light refraction properties of the obtained polymers were found to be responsive to the UV irradiation presumably due to the presence of photosensitive carbonyl groups therein. The influence of UV irradiation on the refractive index and chromatic dispersion of the thin film of P1a/2a was thus explored. High-refractive-index polymers (HRIPs) are highly desirable materials for the fabrication of advanced optoelectronics due to their advantages of good processability, low cost, light weight, excellent impact resistance and dyability over inorganic optical materials. As shown in FIG. 36A and Table 8 (entries 1-6), all of the obtained polymers exhibit high refractive index (n) ranging from 1.9282 to 1.5710 in a wide wavelength region of 370-1700 nm. Their n values at 632.8 nm ($n_{632.8}$) are in the range of 1.6407-1.6896, which are much higher than those of the commercially important optical plastics (n=~1.50-1.60). Such high refractive indices can be ascribed to the presence of numerous polarized phenyl rings in the polymer structures. The results of P1a/2a-c revealed that the n values of the polymers can be tuned by changing the spacer length. The shorter the spacer length is, the higher n value is achieved due to the increase of aromatic content. The refractive indices of the TPE-containing polymers P1a/2d and P1a/2e are even higher than those of P1a/2a-c because of their higher aromatic contents. The heterocycle-containing polymer (P1b/2a) exhibit higher n values (n=1.8181-1.6299) than P1a/2a (n=1.8096-1.6150). In addition to the high refractive index, small chromic dispersion is also required for the practical optical applications of HRIPs. The chromatic dispersion of the obtained polymers in the visible region (D) and in the IR region (D') are calculated to be in the range of 0.071-0.100 and 0.008-0.028, respectively. Detailed calculation methods can be found in Table 8. These results demonstrate that P1a-b/1a-e possess both high refractive index and small chromic dispersions, which make them promising coating materials in advanced optical display systems.

Furthermore, with the photosensitive vinyl and carbonyl groups in the polymer structures, the light refraction properties of the obtained polymers are potentially responsive to the UV irradiation. The influence of UV irradiation on the refractive index of the thin film of P1a/2a was thus investigated. As indicated in FIG. 36B and Table 8 (entries 1 and 7-9), the n values of P1a/2a gradually decreased with the increase in UV exposure time. The n value at 1500 nm ($n_{1550}$), a wavelength that is of telecommunication importance, decreased by 0.0147, 0.0245, 0.0273, and 0.0368 after UV irradiation for 10, 20, 30, and 40 min, respectively. Upon UV exposure for 40 min, the n values of P1a/2a in the same wavelength region significantly dropped from 1.8096-1.6150 to 1.7128-1.5783. The excellent tunability of the thin film refractivity by the facile UV irradiation method enables potential application of the polymers described herein in the fabrication of optical data storage devices, gradient-index optics, and integrated photonics technology. Accordingly, also provided herein are optical data storage devices, gradient-index optics, and integrated photonics technology comprising the polymers described herein.

Figure 39:
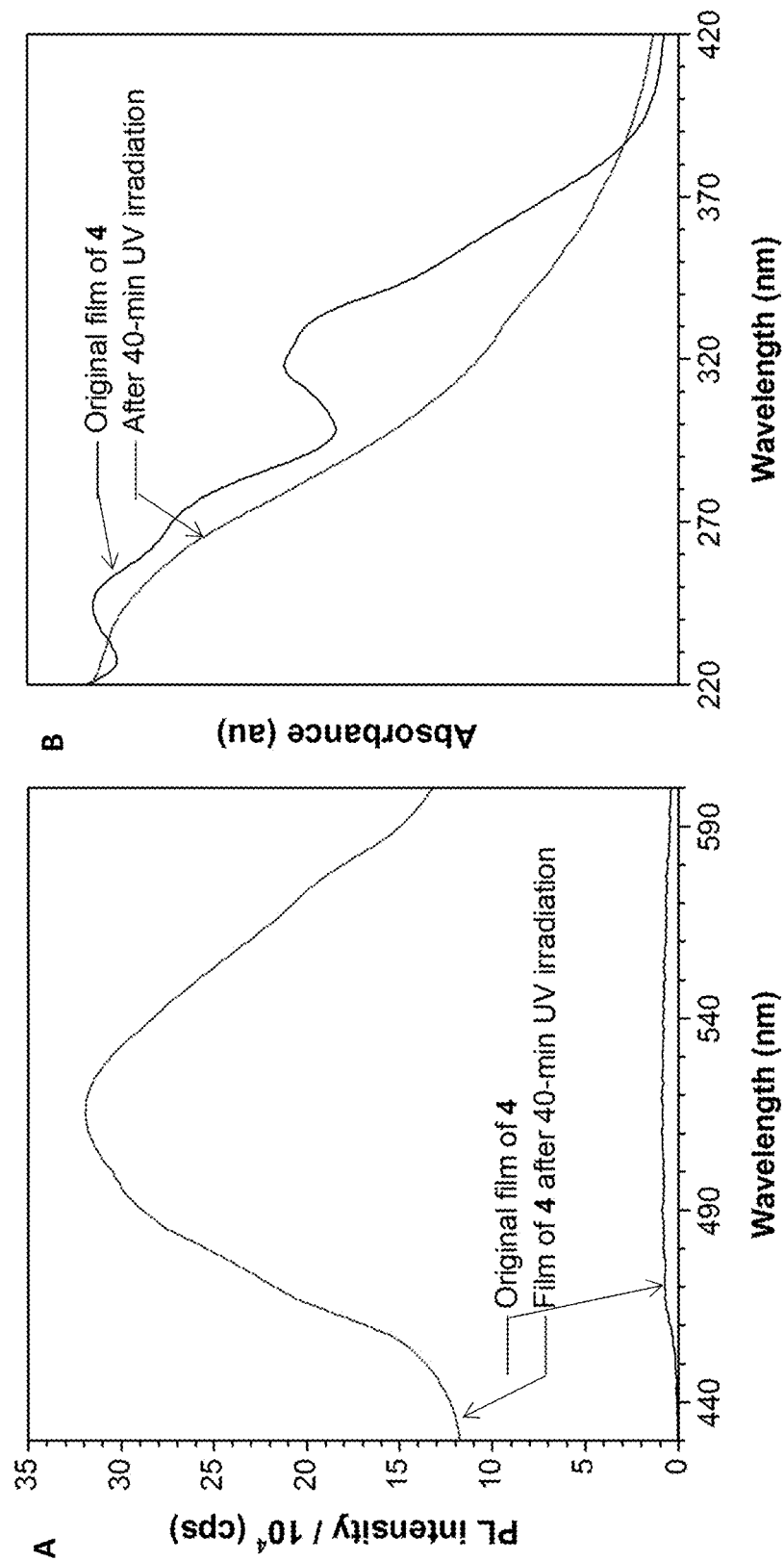
FIG. 39 depicts the (A) PL spectra and (B) UV spectra of the drop-casting thin film of model compound 4 before and after UV irradiation.
Figure 40:
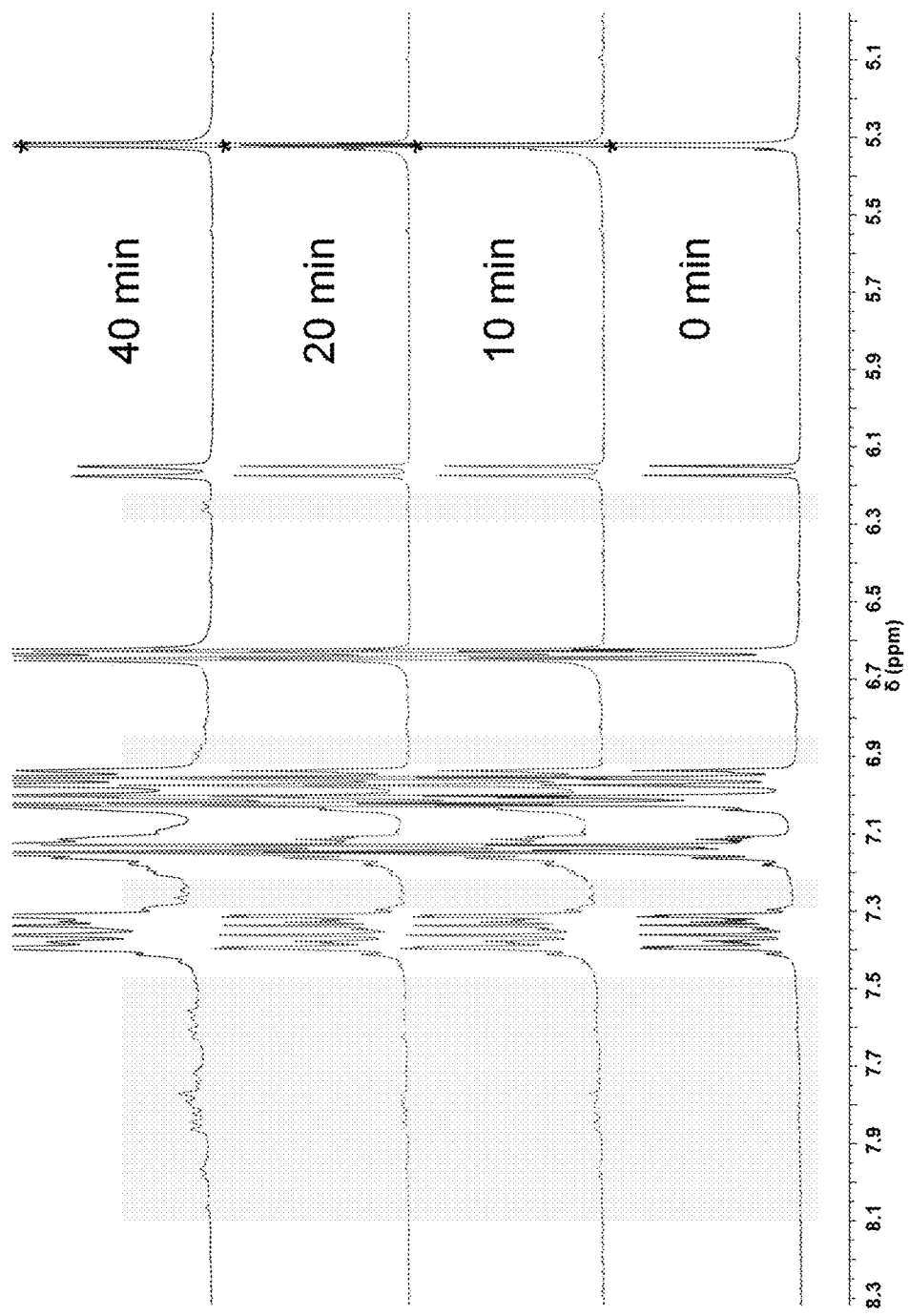
FIG. 40 depicts the $^1H$ NMR spectra of model compound 4 under different UV irradiation time in $CD_2Cl_2$.
Figure 41:
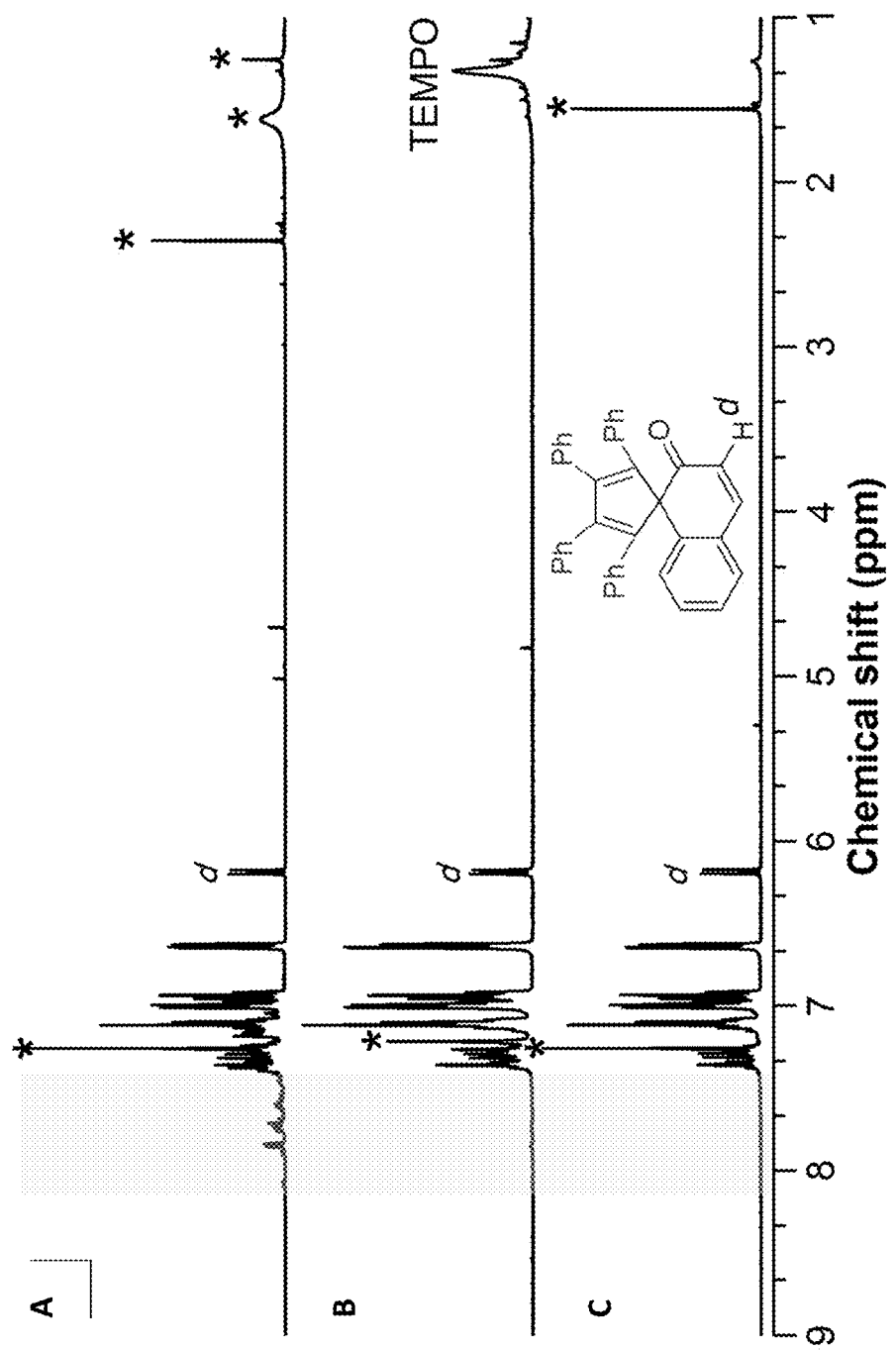
FIG. 41 depicts the $^1H$ NMR spectra of the model compound 4 (A) after irradiating its toluene solution by UV light for 3 h, (B) after irradiating its TEMPO-containing toluene solution by UV light for 3 h, and (C) without UV irradiation in $CDCl_3$. Detailed procedures: the toluene solution of 4 (5 mg/3 mL) and the toluene solution (3 mL) of model compound 4 (5 mg) and TEMPO (20 equiv., 31.3 mg) in quartz cell/quartz cuvette were simultaneously irradiated by UV light for 3 h. Afterward, the toluene solvent was removed and the solid was dissolved to measure the $^1H$ NMR.
Figure 42:
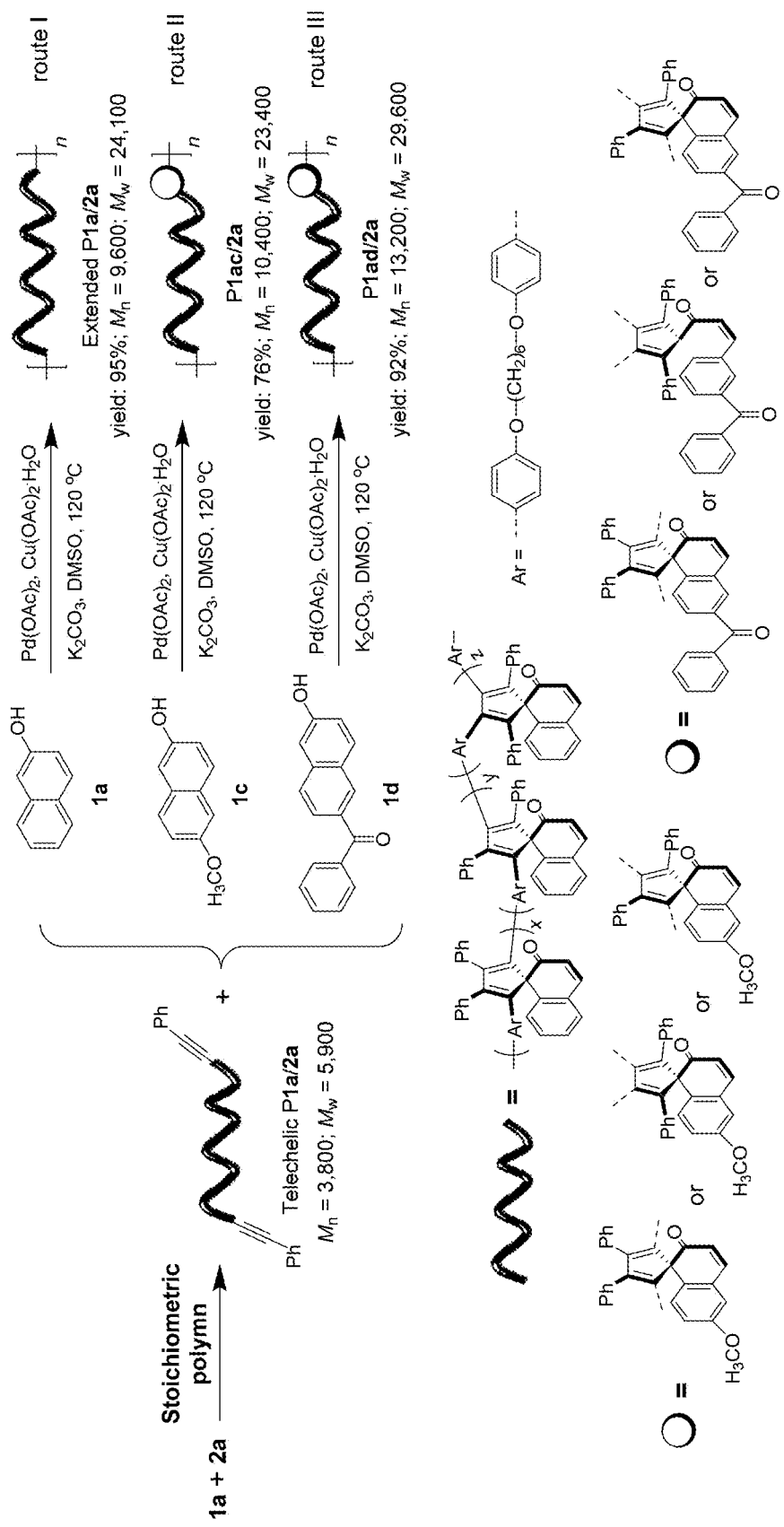
FIG. 42 depicts preparation of exemplary telechelic polymer P1a/2a under stoichiometric conditions and the polymerization of telechelic P1a/2a with 1a (route I), 1c (route II), and 1d (route III) based on the monomer-nonstoichiometry-promoted effect.
Figure 43:
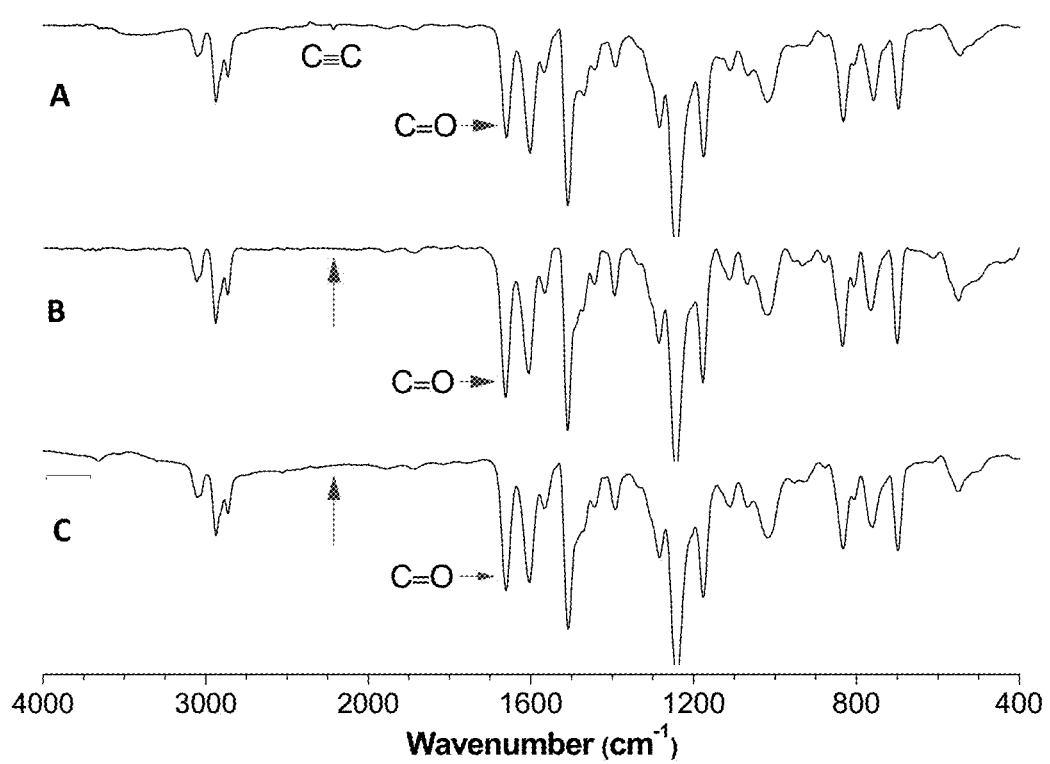
FIG. 43 depicts the IR spectra of exemplary polymers: (A) 4, (B) 7, and (C) P7.
Figure 44:
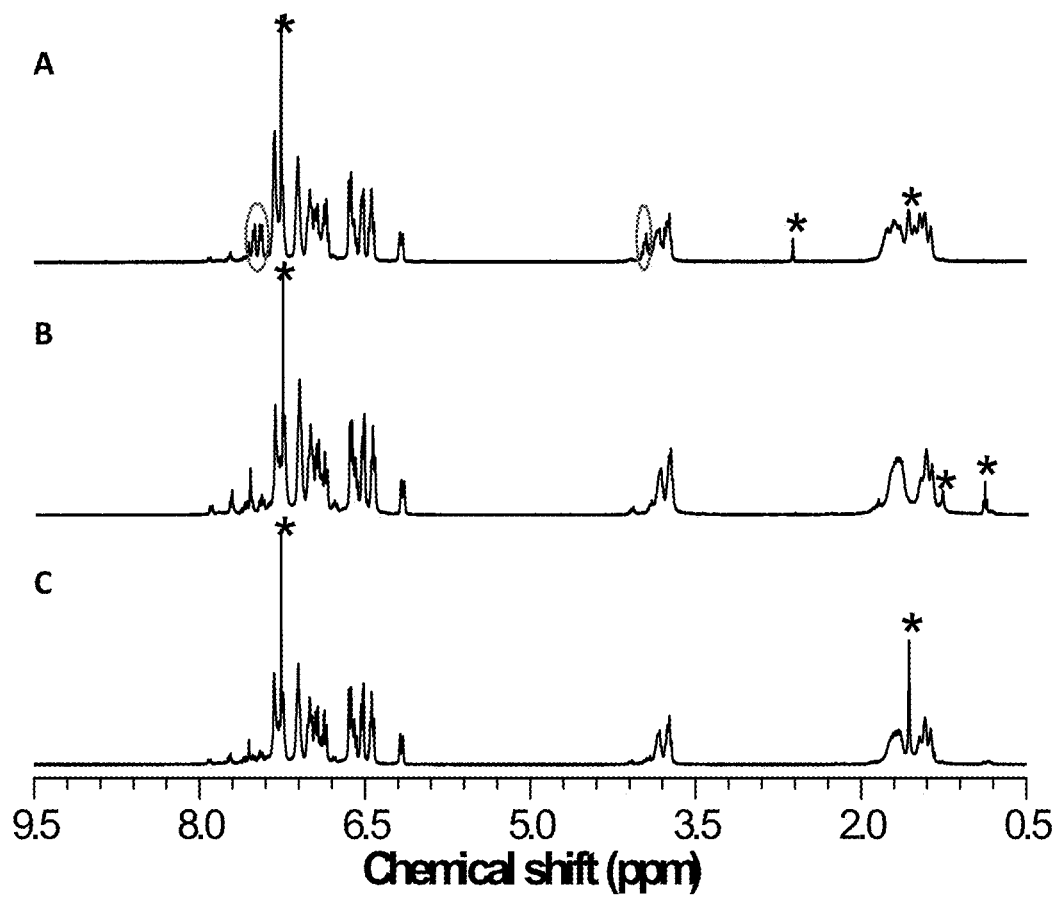
FIG. 44 depicts the $^1$H NMR spectra of exemplary polymers (A) telechelic polymer P1a/2a, (B) extended P1a/2a, and (C) P1a/2a (sample taken from Table 1, entry 6) in $CDCl_3$.
Figure 45:
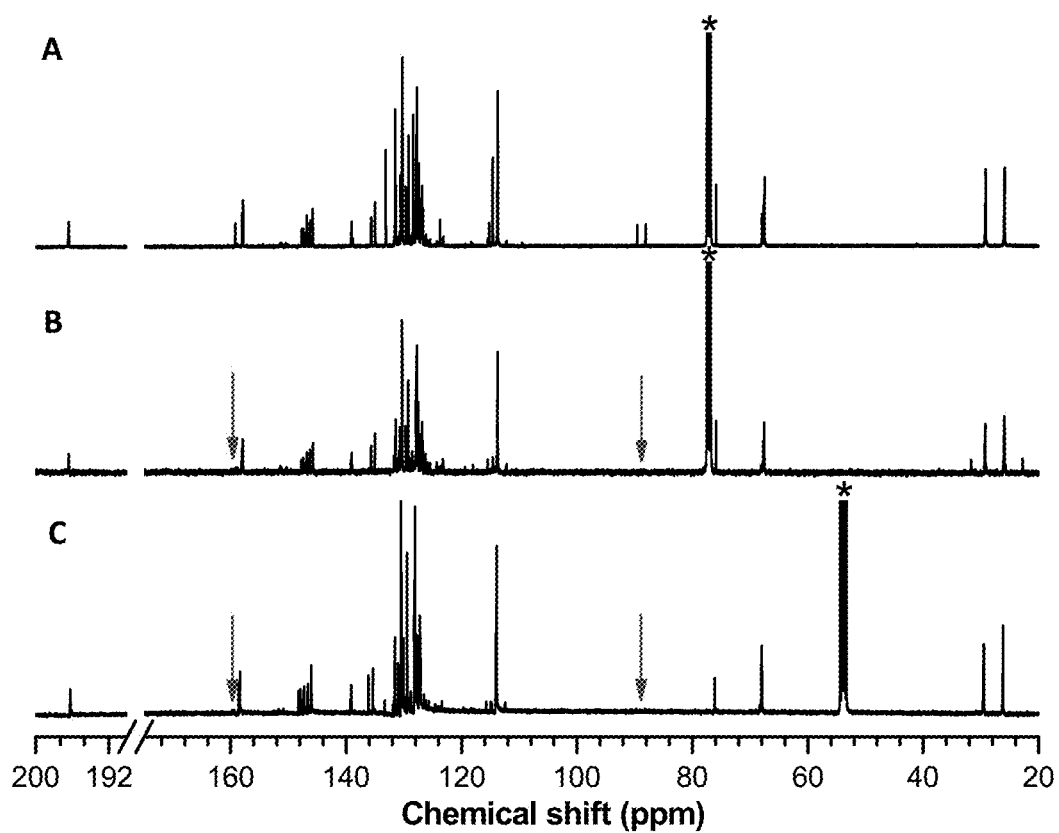
FIG. 45 depicts the $^{13}$C NMR spectra of exemplary polymers: (A) telechelic polymer P1a/2a, (B) extended P1a/2a, and (C) P1a/2a (sample taken from Table 1, entry 6) in $CDCl_3$.
Figure 46:
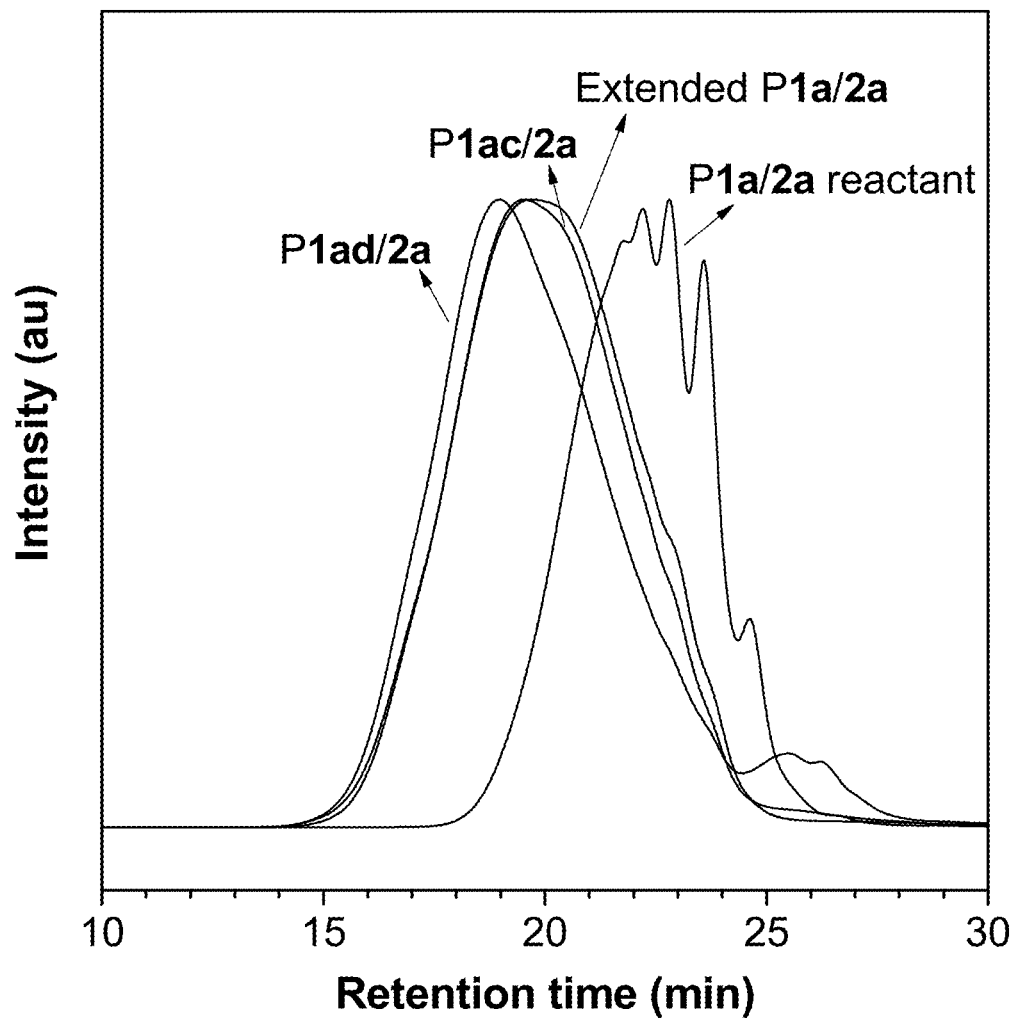
FIG. 46 depicts the GPC curves of exemplary polymers: telechelic polymer P1a/2a and its polymerization products.
Figure 47:
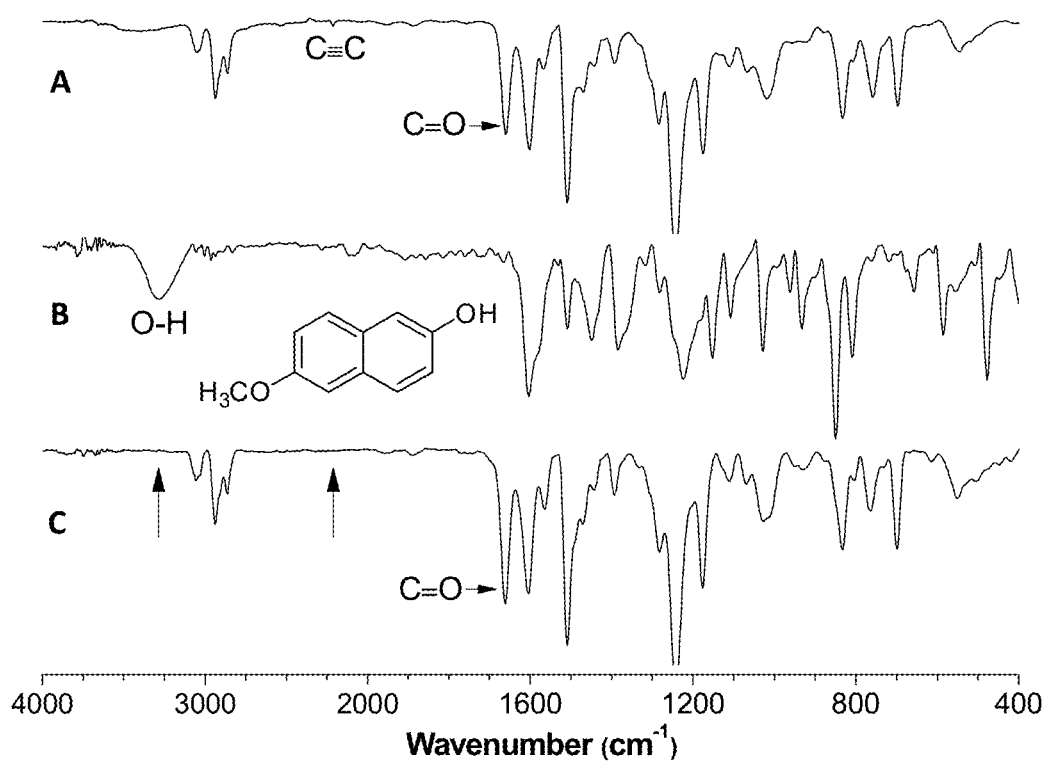
Figure 48:
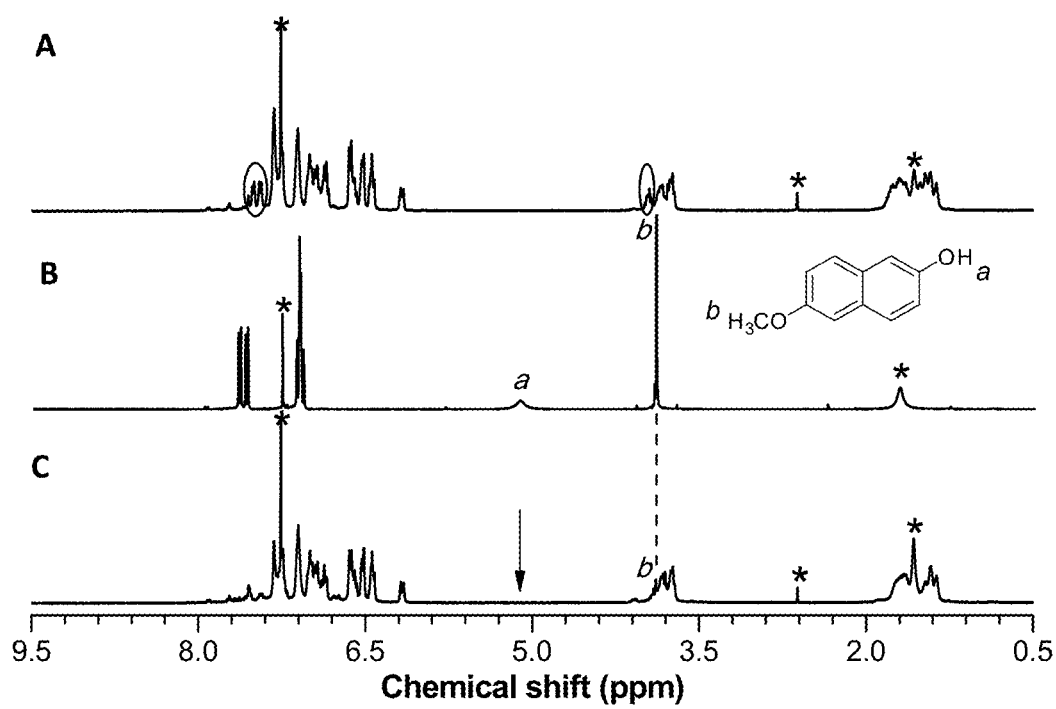
FIG. 48 depicts the $^1$H NMR spectra of exemplary polymers: (A) telechelic polymer P1a/2a, (B) 1c, and (C) P1ac/2a in $CDCl_3$.
Figure 49:
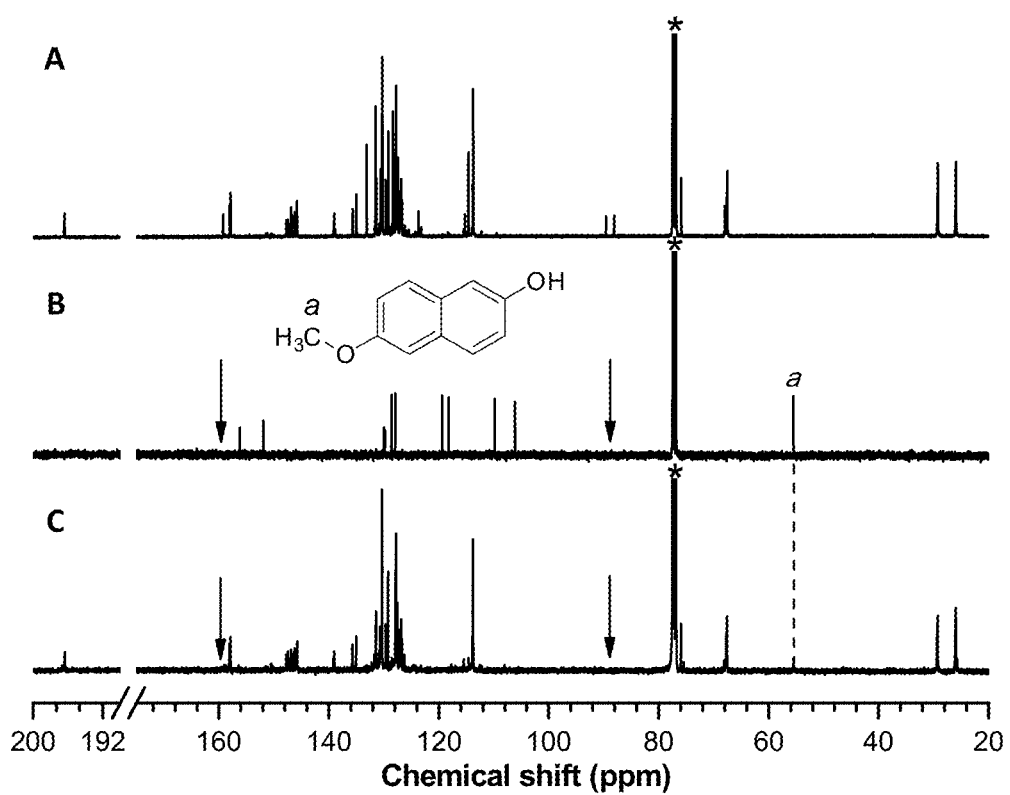
FIG. 49 depicts the $^{13}$C NMR spectra of exemplary polymers: (A) telechelic polymer P1a/2a, (B) 1c, and (C) P1ac/2a in $CDCl_3$.
Figure 50:
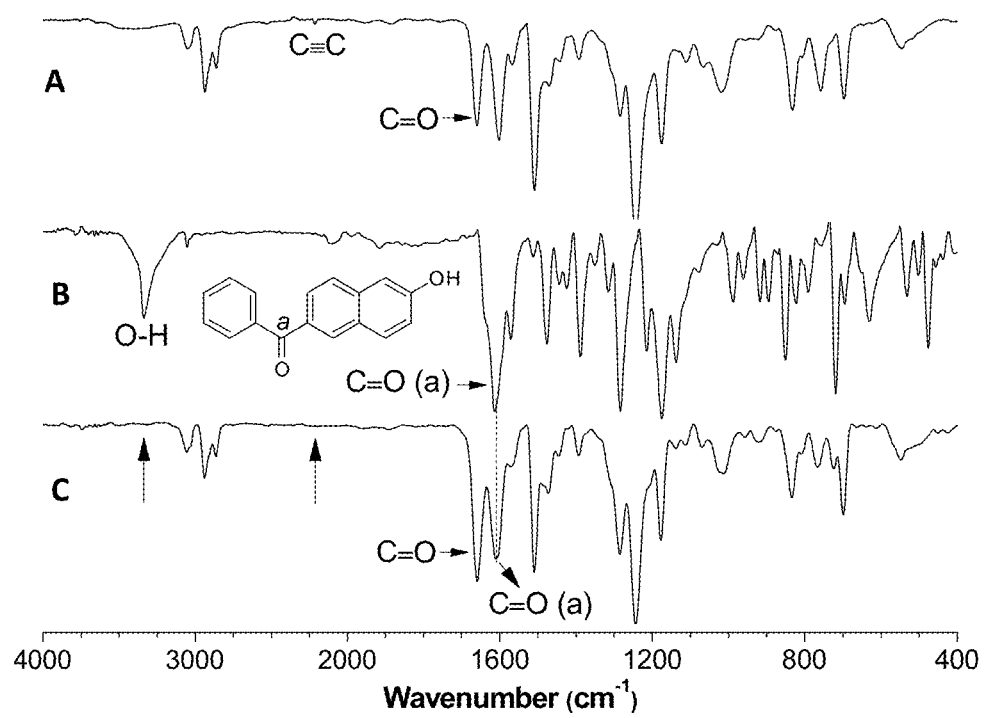
Figure 51:
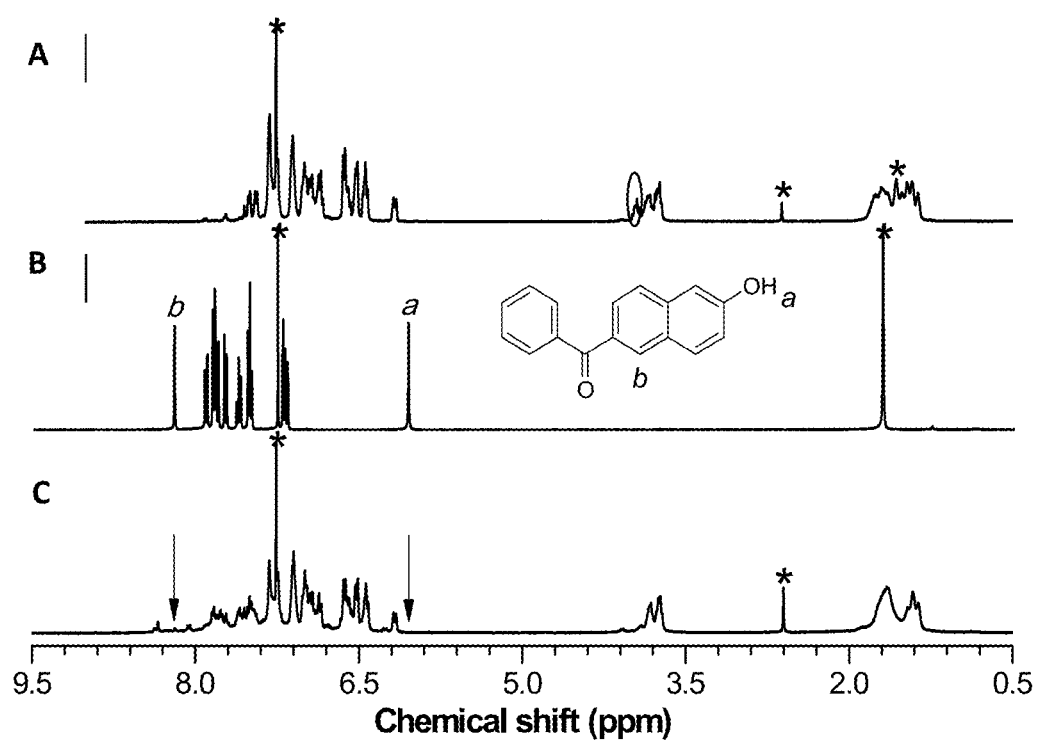
FIG. 51 depicts the $^1$H NMR spectra of exemplary polymers: (A) telechelic polymer P1a/2a, (B) 1d, and (C) P1ad/2a in $CDCl_3$.
Figure 52:
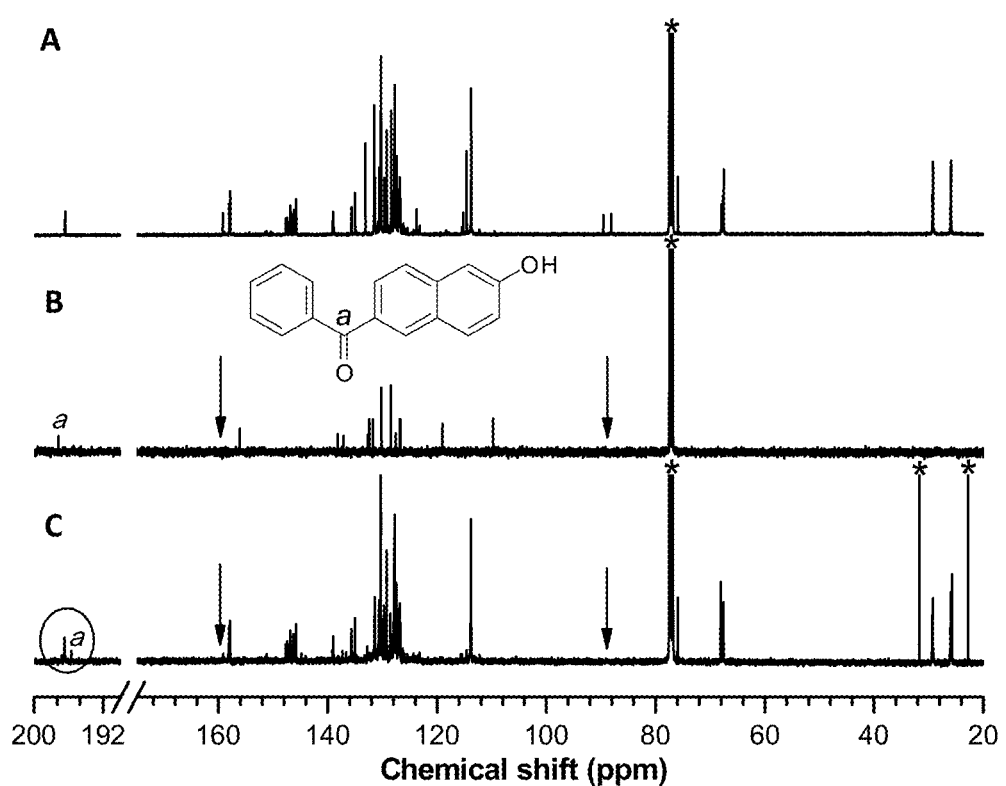
FIG. 52 depicts the $^{13}$C NMR spectra of exemplary polymers: (A) telechelic polymer P1a/2a, (B) 1d, and (C) P1ad/2a in $CDCl_3$.

The possibility of photo-crosslinking process can be excluded as the photopatterned films can be easily washed off by THF, a good solvent of the polymers. Then what is the reason of the UV-turn-on effect? We envisioned that the spirocyclic unit in the polymers might undergo some certain photochemical reactions under the strong UV irradiation. Due to the intrinsic complexity and polydispersity of polymer, the UV responsiveness of model compound 4 was investigated to assist the mechanism understanding. Thin films of 4 were prepared by drop-casting of its DCM solution onto quartz plates or silicon wafers. The PL and absorption spectra of its thin film were measured before and after UV irradiation. As shown in FIG. 39, the PL intensity of 4 was obviously enhanced and the absorption spectrum significantly changed after 40-min UV irradiation. To gain insight into the structural change, the dry films of 4 were exposed to UV light for different time and then washed by $CD_2Cl_2$ to do the $^1H$ NMR characterization. The obtained $^1H$ NMR spectra shown in FIG. 40 implied that UV irradiation changed the chemical structure of 4, because some new peaks were observed in the $^1H$ NMR spectra of the irradiated samples. Unfortunately, the exact structure of the photochemical product is still hard to be determined currently. As ketone structures are possible to undergo photochemical reactions, such as the Norrish reaction, with the generation of free radical intermediates, we employed a radical marker (2,2,6,6-tetramethylpiperidin-1-yl)oxyl, TEMPO) to test whether the photochemical reaction of the present system involved free radical intermediates. The $^1H$ NMR spectrum of the sample with the addition of TEMPO did not show the above-mentioned new peaks after UV irradiation (FIG. 41). This result indicated that the carbonyl-containing spirocyclic system may undergo a photochemical reaction with a free radical mechanism. The generated free radicals can be immediately trapped by TEMPO and thus prevent the occurrence of further reaction.

Integrated silicon photonics have become a widely used technology to enable applications in intra-datacenter optical interconnects, nonlinear and quantum photonics and lab-on-a-chip optical biosensing. As a key building block in silicon photonics, microring resonators have enabled various integrated photonic applications due to strong resonance field enhancement, narrowband wavelength selectivity and compact footprints. A microring resonator is formed by a closed loop of waveguide and allows partial light confinement through total-internal reflection. However, a major hurdle of the practical applications of microrings is that the resonant wavelengths of fabricated microrings are sensitive to the fabrication process and are not necessarily consistent with the pre-design values, which potentially leads to a significant compromise of the microring performance. Inspired by the good film-forming ability and the readily tunable refractive index (RI) under UV irradiation of our synthesized polymer system, a UV irradiation method to tune the microring resonant wavelengths is demonstrated.

Figure 53:
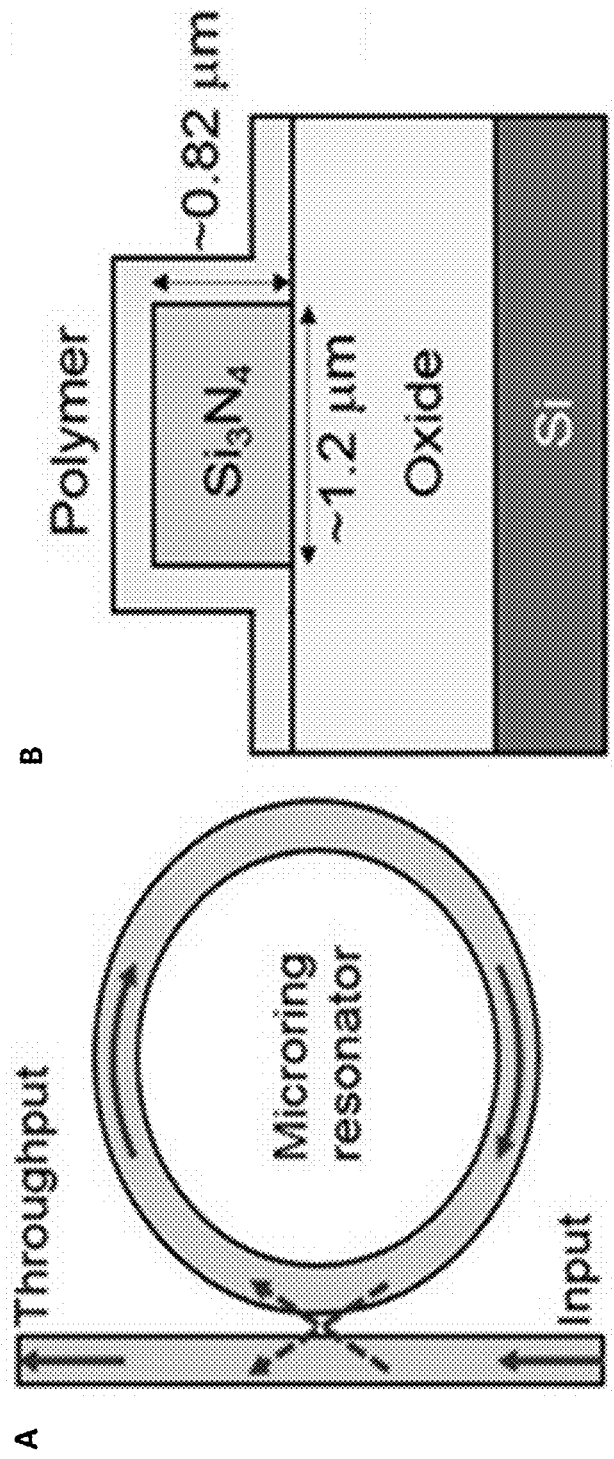
FIG. 53 depicts (A) an exemplary schematic of a microring resonator evanescently coupled with a bus waveguide. (B) Exemplary schematic of the cross section of a polymer-coated $Si_3N_4$ waveguide. (C and D) FEM-simulated mode-field amplitude distribution with (C) TM polarization and (D) TE polarization. (E) Measured RI of spin-coated polymer on bare silicon wafers upon different exposure time. (F and G) Measured throughput transmission spectra of a representative polymer-coated microring resonator upon different exposure time for (F) TM polarization and (G) TE polarization. (H and I) Extracted wavelength shifts of six microring resonators near 1550 nm wavelength as a function of polymer exposure time for (H) TM polarization and (I) TE polarization.
Figure 53:
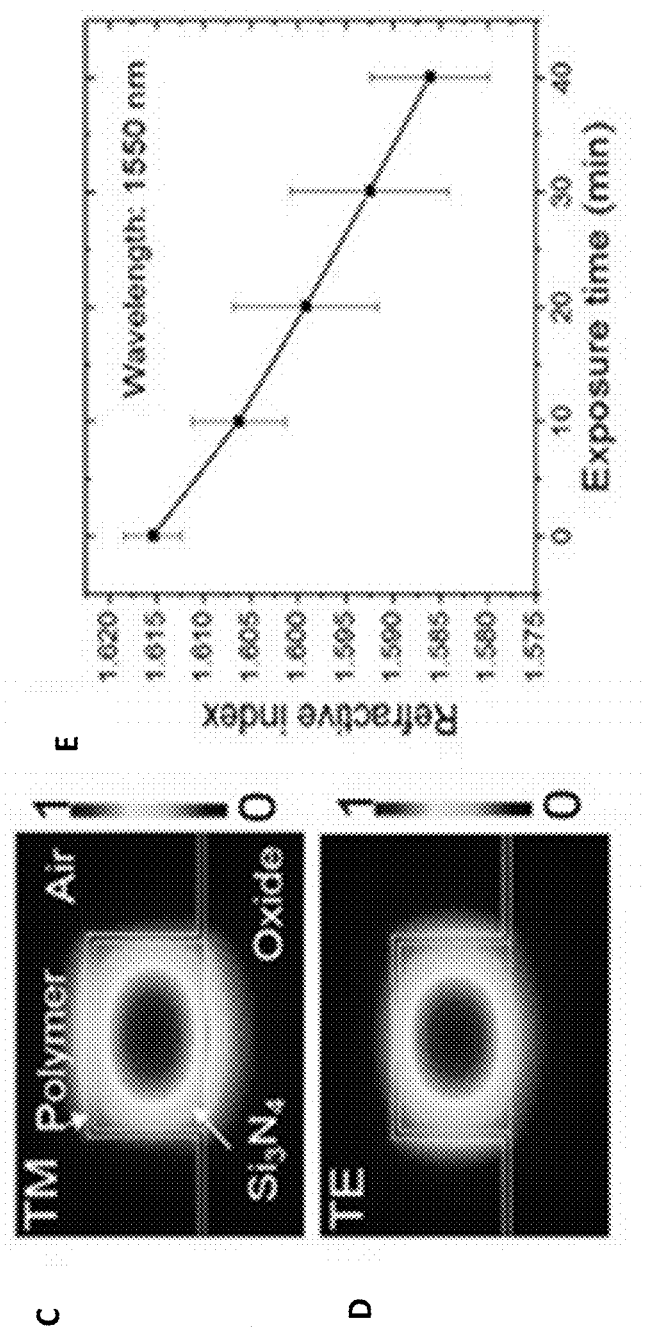
Figure 53:
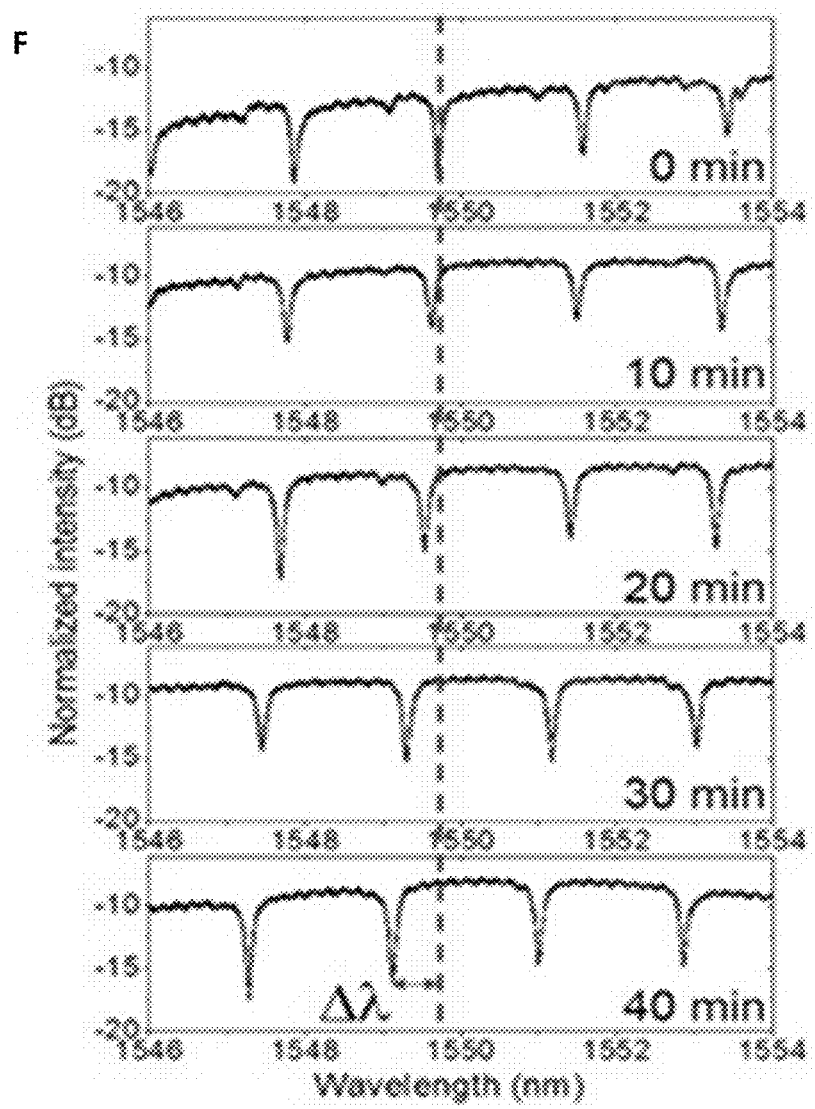
Figure 53:
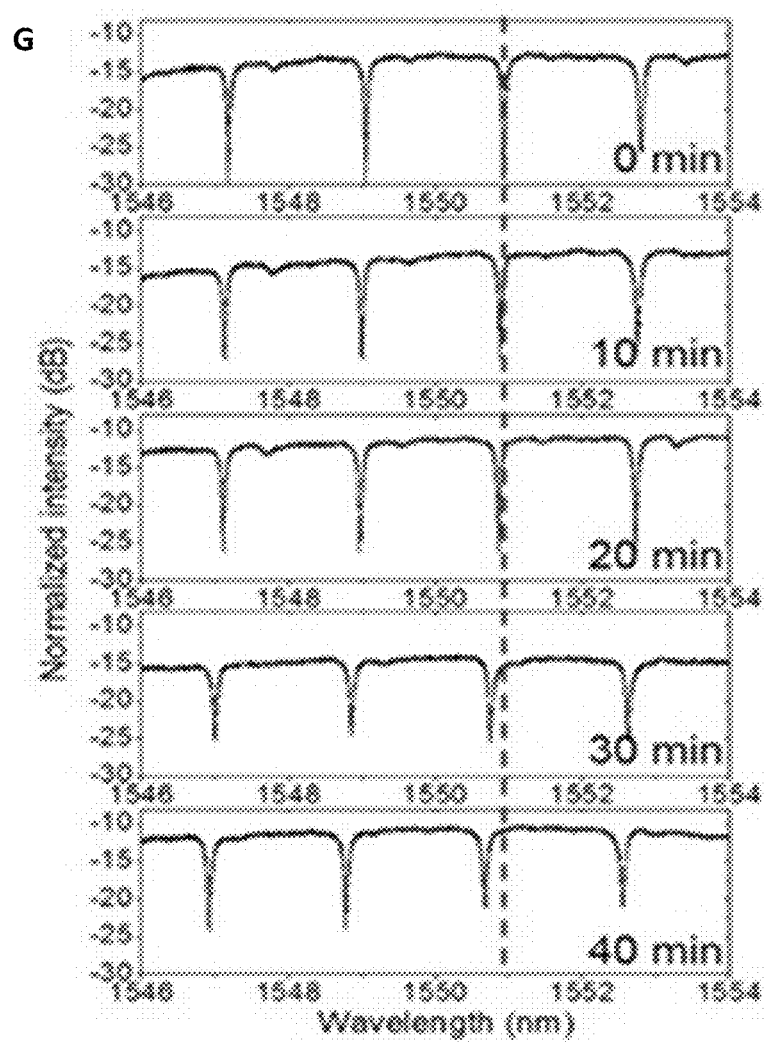
Figure 53:
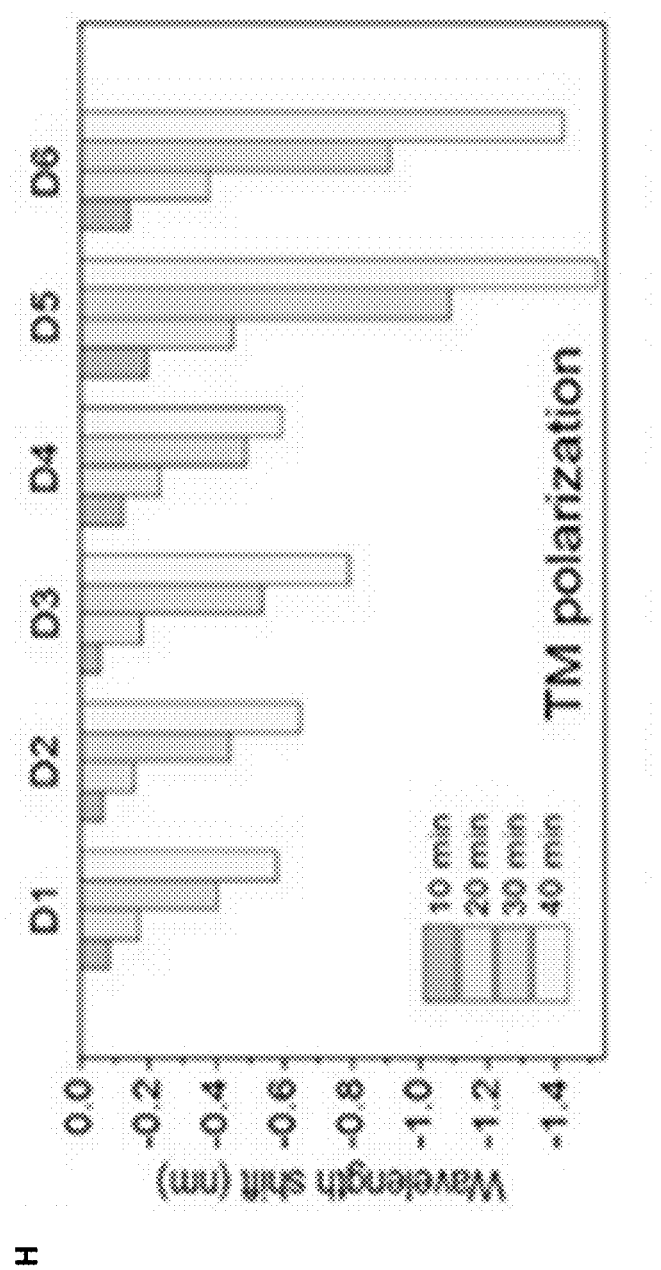
Figure 53:
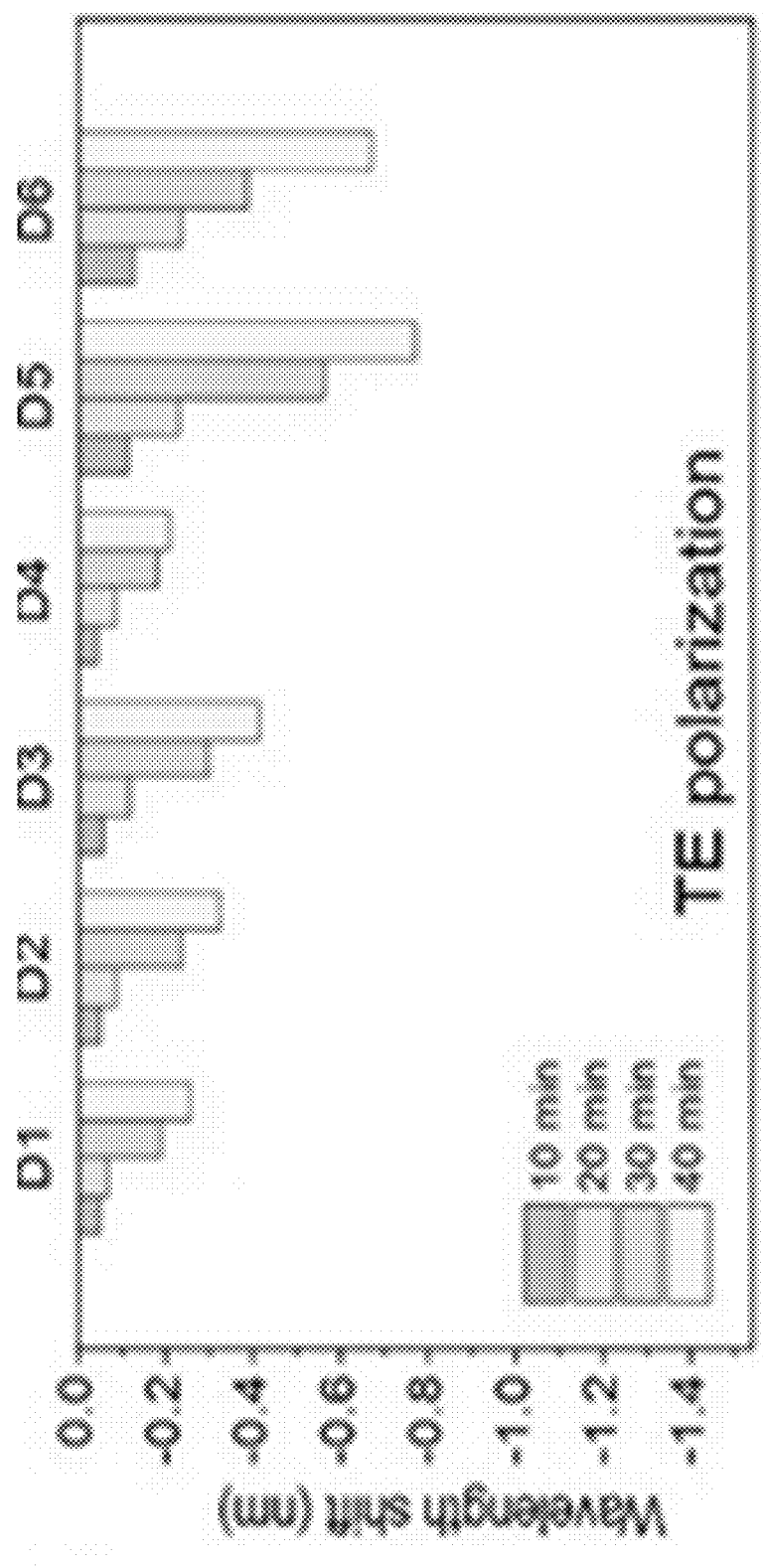
Figure 54:
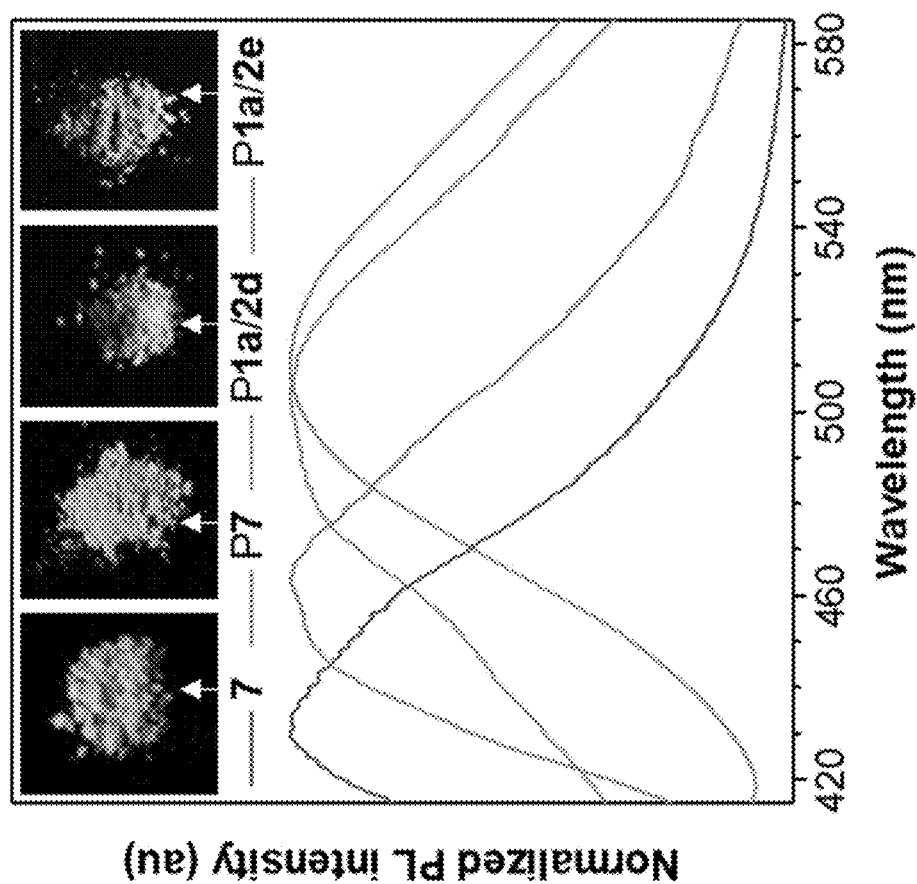
FIG. 54 depicts normalized PL spectra of the powder of 7, P7, P1a/2d and P1a/2e and their associated fluorescent photographs. Excitation wavelength: 320 nm (for 7 and P7); 350 nm (for P1a/2d and P1a/2e). All fluorescent photographs were taken under UV irradiation at 365 nm.

FIG. 53A is a schematic of an exemplary microring resonator evanescently coupled with a bus waveguide. The resonant wavelength of a microring is determined as $n_{eff}L=m\lambda_m$, where $n_{eff}$ is the effective refractive index of the optical mode, L is the round trip-length of the microring, $\lambda_m$ is the m-th order resonant wavelength, and m is the integer azimuthal mode number. Therefore, the resonant wavelength can be adjusted by tuning the $n_{eff}$ using various means. Currently, thermo-optic (TO) and electro-optic (EO) effects are the most commonly used strategies for changing the $n_{eff}$ to tune the resonance wavelengths of microrings. Herein, it is demonstrated that the $n_{eff}$ can be tuned by coating the polymers described herein on the microrings. As the n values of the polymer layer can be modulated by UV irradiation, the microring resonance wavelengths can be tuned by controlling the UV exposure time of the polymer-coated devices. To verify this hypothesis, polymer P1a/2a was coated on the surface of a $Si_3N_4$ waveguide as illustrated in FIG. 53B. FIGS. 53C and 53D show the finite-element method (FEM)-simulated mode field distribution upon transverse-magnetic (TM) polarization and transverse-electric (TE) polarization, respectively. These simulated results suggested that the light field remain mainly distributed within the $Si_3N_4$ waveguide, and the field amplitude also distributes in the polymer coating layer. Thus, the light field of the whole device can be affected by the optical properties of the polymer layer. We measured the refractive index of three different films comprising polymers described herein coated on a bare silicon wafer with different UV exposure time varying from 0 to 40 min at 1550 nm wavelength (FIG. 53E). FIGS. 53F and 53G show the experimentally measured transmission spectra of a representative polymer-coated microring resonator with different UV exposure time in TM and TE polarizations. For both cases, we observe that a longer UV exposure time consistently results in larger blue shifting of the resonant wavelength. The strength of the wavelength response could be finely modulated by controlling the light irradiation time. Longer UV exposure time resulted in blue-shifts of the resonant wavelength, which is consistent with the reduced polymer RI upon a longer irradiation time. FIGS. 53H and 53I show the extracted resonant wavelength shifts from six tested microring resonators near 1550 nm wavelength as a function of polymer exposure time for TM and TE polarizations. In all cases, the wavelength gradually blue-shifted and the shift value increased as the exposure time increased from 0 to 40 min. The different sensitivity of these devices was possibly due to the different film thickness. According to the simulated results, the $n_{eff}$ increases with a thicker polymer film and the sensitivity of $n_{eff}$ to polymer RI increases with a thicker polymer film. We observed TM-polarized resonance modes exhibited larger resonant-wavelength blue shifts, suggesting the TM-polarized resonance modes were more sensitive to the polymer RI change compared with TE-polarized resonance modes, possibly due to the difference in film thickness. Therefore, this work provides a proof-of-concept study of the potential application of such photomodulatable polymer materials in photonics IC and meanwhile provides a new strategy for tuning the refractive index of ring resonators and achieving the goal of adjusting the resonance wavelength of the pre-designed ring resonator by UV irradiation.

The generation of complex micro- and nano-patterns on polymeric surfaces or thin films is important for the development of biological sensing and probing systems, optical writing and reading, anti-counterfeiting applications, and the construction of optical display devices. Light-driven techniques for patterning process have the advantage of simple operation, good precision, and excellent temporal and positional controllability. The good film-forming ability and photosensitivity of the polymers described herein are advantageous for photopatterning. Polymer thin films with good quality were first fabricated by spin-coating 1,2-dichloroethane solutions of the compounds described herein on silicon wafers. By simply exposing these thin films to UV light in air for 20 min at room temperature through a negative copper photomask, well-resolved two-dimensional fluorescent patterns with both "positive" and "negative" image readout capability could be readily generated and clearly visualized.

Figure 38:
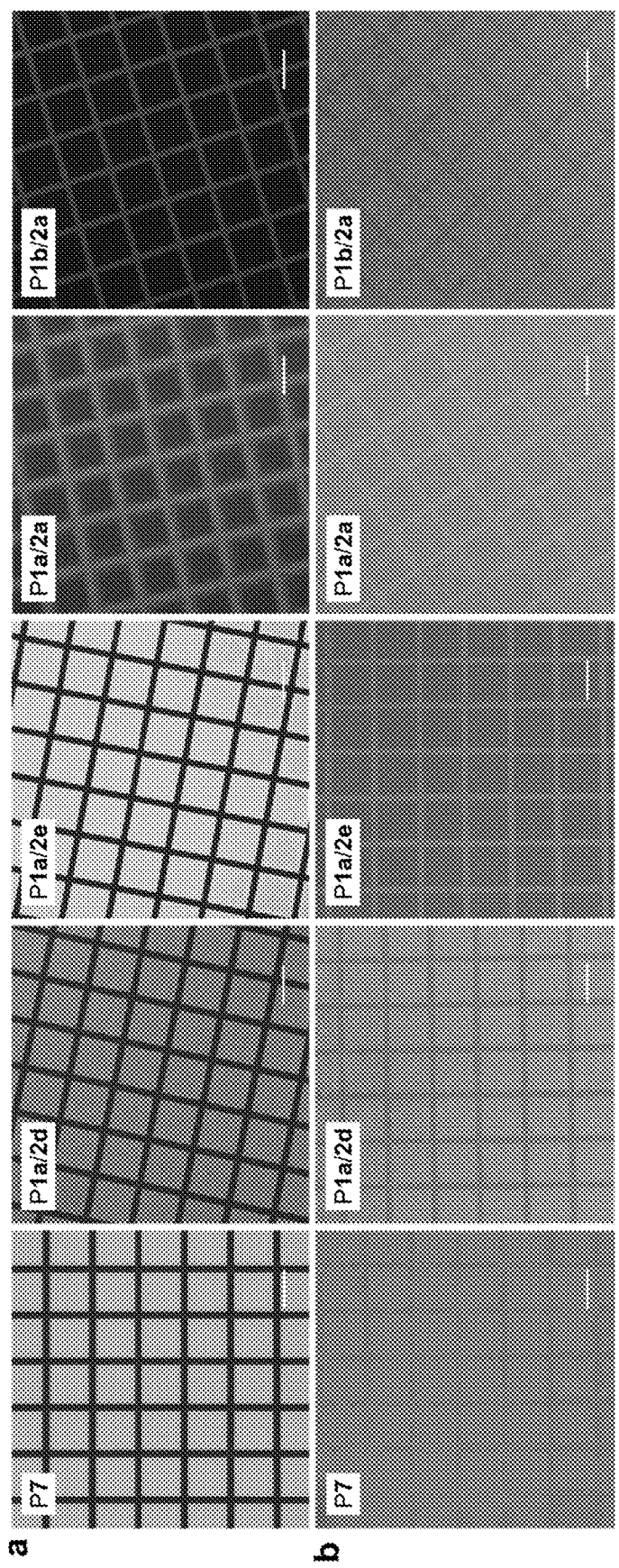
FIG. 38 depicts (A) fluorescent images of the photopatterns taken under 330-380 nm UV illumination using a fluorescent microscope. (B) Photographs of the photopatterns taken under normal room light using an optical microscope. Scale bar=100 µm. (C) A flower-like photomask used for the photopatterning process. (D & E) Fluorescent photopatterns of (D) P1a/2a and (E) P7 taken by a camera under 365 nm UV irradiation using the flow-like photomask (C).
Figure 38:
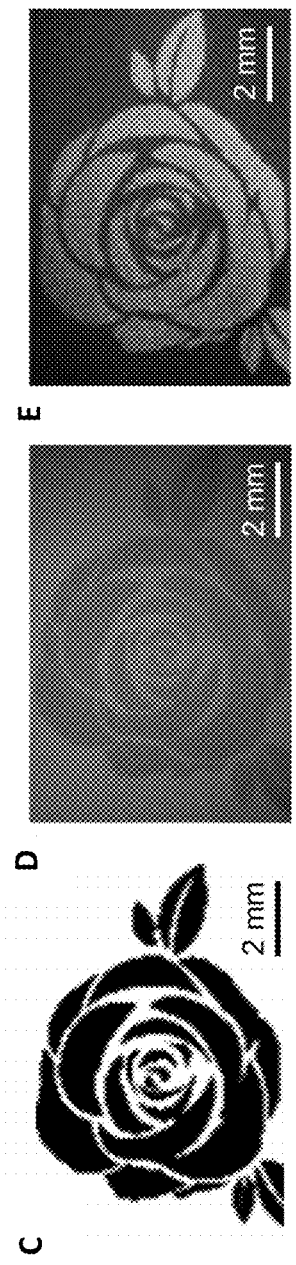

As shown in FIG. 38A, because of the AEE features of the P7, P1a/2d and P1a/2e, their as-prepared thin films showed obvious light emission. After the photolithography process, the unexposed square parts of the thin films remain blue or green emissive while the emission of the exposed lines is quenched to give a clear "turn-off"-type (positive) 2D photopattern. Without wishing to be bound by theory, it is believed that the fluorescence quenching could be attributed to the possible occurrence of strong photo-oxidative bleaching process. Different from the AEE-active polymers, P1a/2a and P1b/2a showed an interesting phenomenon of UV-activated fluorescence. After the photolithography treatment, well-resolved "turn-on"-type (negative) 2D photopatterns. It is worth noting that these patterns can also be clearly observed under room light (FIG. 38b) possibly due to the remarkable change in the thin film refractivity upon UV irradiation. In addition to the grid pattern, other patterns with different size and contents can also be readily generated and clearly visualized. As shown in FIG. 38D-E, different types of flower patterns are fabricated using the same photomask based on the "photobleaching" and "photoactivation" process of P7 and P1a/2a, respectively. These patterns are stable and the detected contrasts remain constant even after storage under ambient conditions/normal room light for more than six months. These results suggested that these polymers are promising photosensitive materials that can be used in the preparation of data-encoding-reading, anti-counterfeiting, and organic display devices, etc, comprising the same.

Experimental Procedures

All the polymerization reactions were carried out under nitrogen using the standard Schlenk technique. A typical polymerization procedure is given below as an example [Table 3 (FIG. 6), entry 5]. A 10 mL Schlenk tube with a stirring bar was added 2-naphthol (115.3 mg, 0.8 mmol), internal diyne 2a (94.1 mg, 0.2 mmol), $Pd(OAc)_2$ (9.0 mg, 0.04 mmol), $Cu(OAc)_2 \cdot H_2O$ (167.7 mg, 0.84 mmol), and $K_2CO_3$ (110.6 mg, 0.8 mmol) in 1 mL DMSO. The reaction mixture was stirred under nitrogen in a sealed Schlenk tube at 120° C. for 24 h and then cooled to room temperature. To remove the catalytic species, especially the copper salt, the resulting mixture was first dissolved with THF and centrifuged for several times. Then the supernatant solution was allowed to pass through a simple column filled with neutral $Al_2O_3$ powder and added dropwise to hexane/chloroform mixture (7:1 v/v) of 160 mL under vigorous stirring. The precipitates were collected by filtration, and then washed with hexane and dried in vacuum at room temperature to a constant weight.

Structural Characterization

Model Reactions

Figure 11:
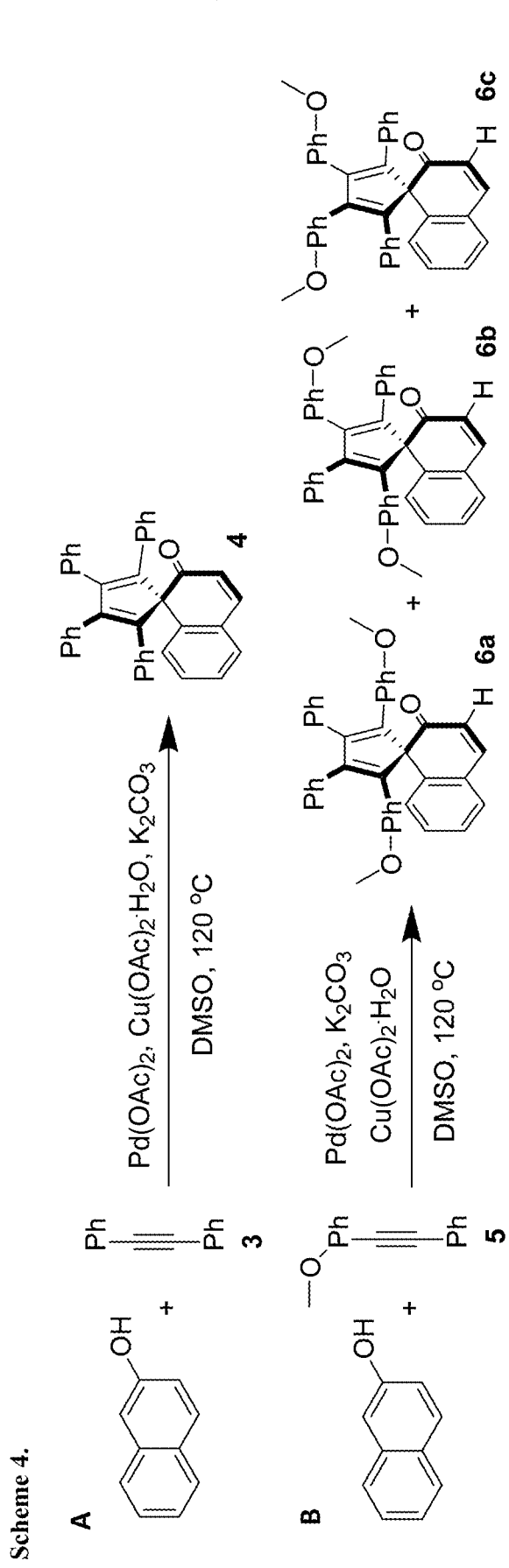
FIG. 11 depicts Scheme 4 showing the synthetic route to model compounds 4 and 6.
Figure 12:
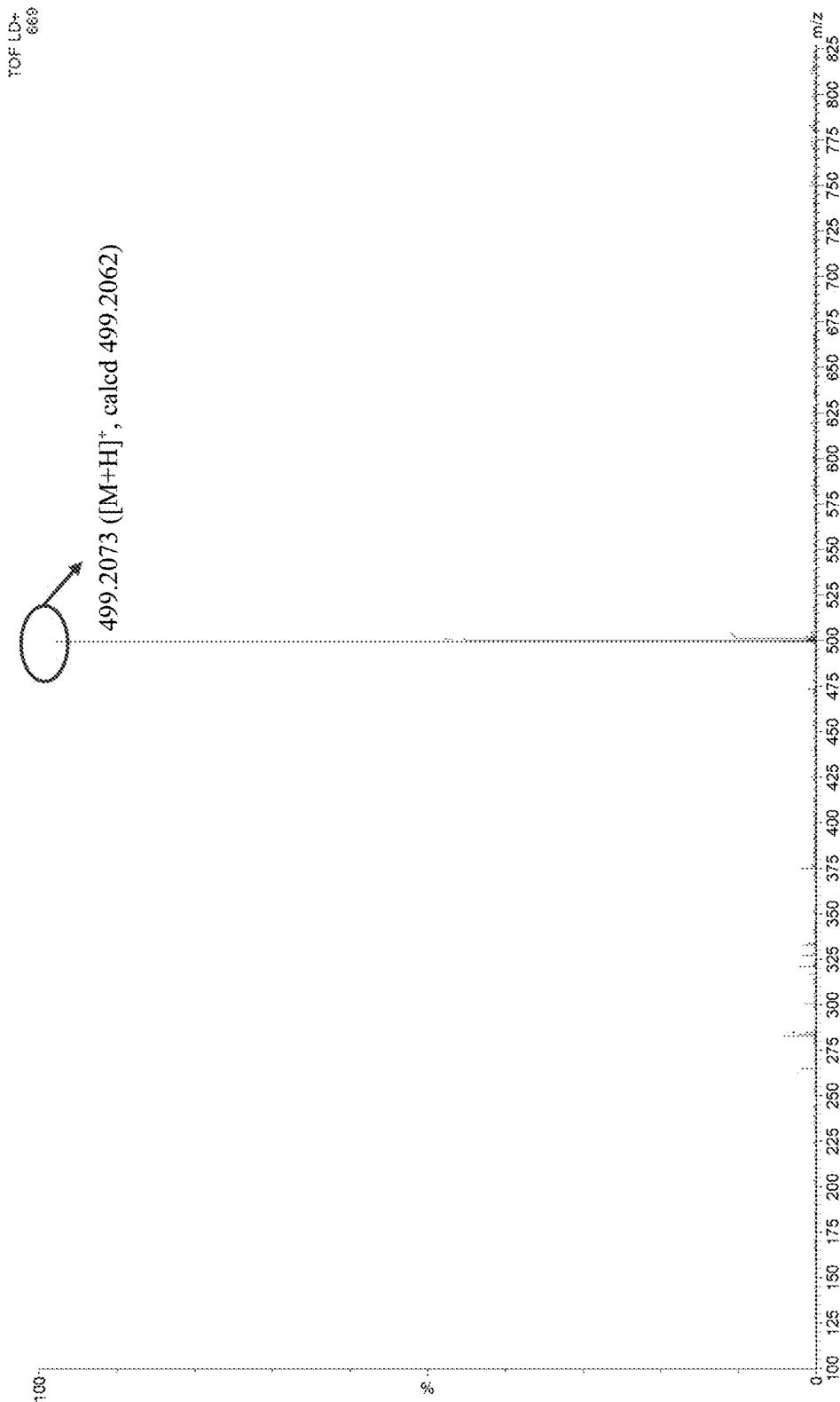
FIG. 12 depicts the high resolution mass spectrum (HRMS) (MALDI-TOF) of spectrum of 4.
Figure 13:
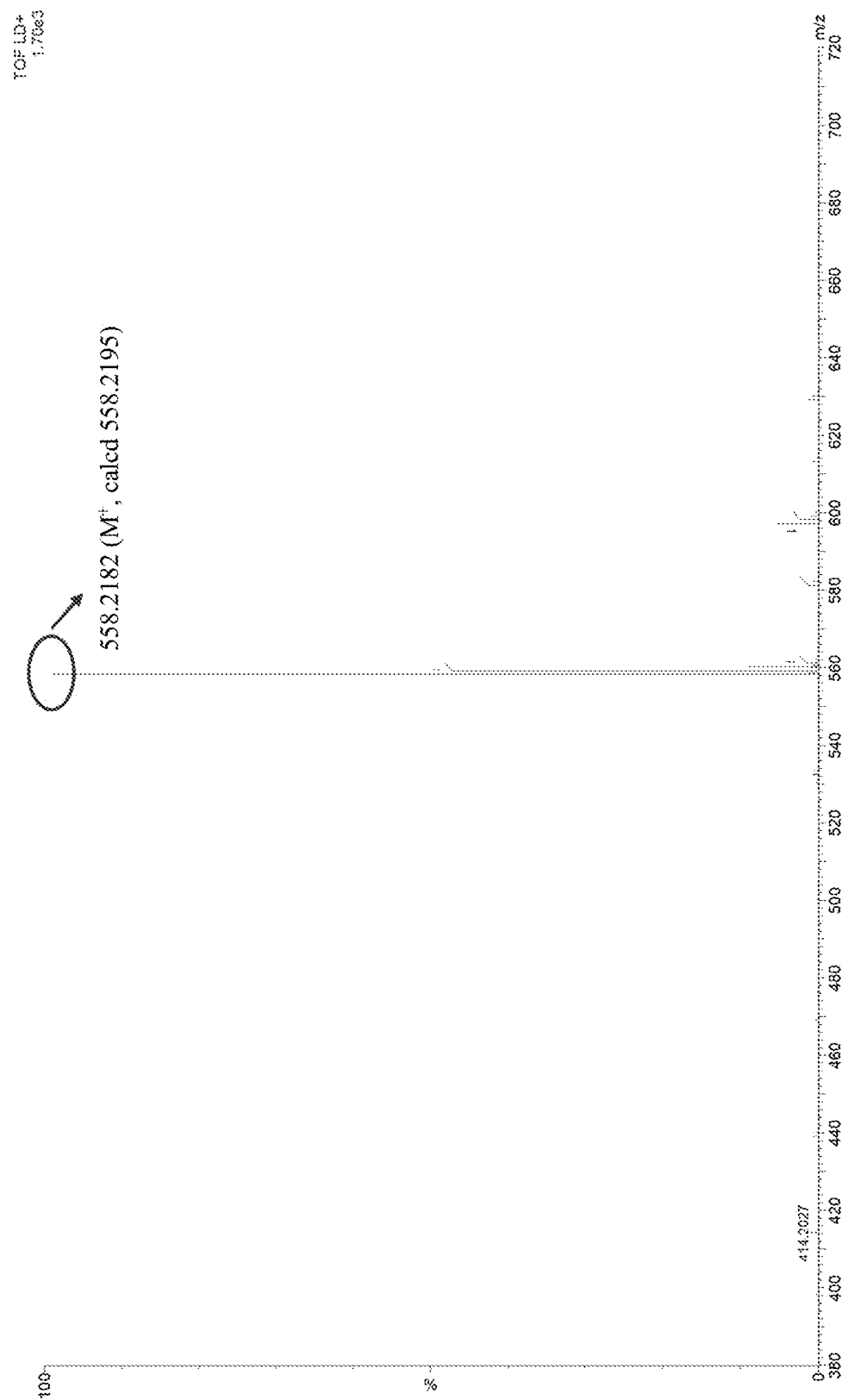
FIG. 13 depicts the HRMS (MALDI-TOF) of spectrum of 6.

To assist the structural characterization and property investigation of the obtained polymers, model compounds 4 was prepared through the coupling reaction of 2-naphthol and diphenylacetylene (3) under similar conditions to the polymerization reactions [Scheme 4A (FIG. 11)]. With the aim of investigating the regioselectivity of this polymerization, we also conducted a model reaction using 2-naphthol and an asymmetrical internal diyne (5) as the starting materials [Scheme 4B (FIG. 11)]. Unfortunately, a mixture of three isomers (6a-c) was obtained, which was hard to be separated by column chromatography because of their similar physical properties. The structures of 4 and 6 were confirmed by HRMS (FIGS. 12 and 13), IR and NMR analysis. The detailed synthetic procedures and characterization data of model compounds 4 and 6 are given as follows.

A 50 mL Schlenk tube equipped with a stirring bar was charged with 2-naphthol (1a, 288.3 mg, 2.0 mmol), diphenylacetylene (3, 2.23 g, 5.0 mmol), $Pd(OAc)_2$ (22.5 mg, 0.1 mmol), $Cu(OAc)_2 \cdot H_2O$ (838.5 mg, 4.2 mmol), and $K_2CO_3$ (552.8 mg, 4.0 mmol), and then sealed with a rubber stopper. After evacuated under vacuum and purged with dry nitrogen for three times, the tube was injected with 20 mL DMSO.

The reaction mixture was heated at 120° C. for 48 h, and then cooled down to room temperature. Water was added to the mixture, followed by sequential extraction with ethyl acetate, and then dried over anhydrous MgSO$_4$. After solvent evaporation, the crude product was subjected to a silica-gel column using hexane/ethyl acetate mixture (10:1, v/v) as eluent. The desired model compound 4 was collected as a yellow solid; yield: 20.1%. IR (KBr), σ (cm$^{-1}$): 3051, 3025, 1659, 1621, 1596, 1565, 1489, 1442, 1393, 1233, 1199, 1073, 1029, 844, 808, 764, 731, 699. $^1$H NMR (400 MHz, CD$_2$Cl$_2$), δ (ppm): 7.40-7.31 (m, 5H), 7.18-7.11 (m, 6H), 7.04-7.00 (m, 6H), 6.97-6.93 (m, 4H), 6.64 (d, J=8.0 Hz, 4H), 6.16 (d, J=8.0 Hz, 1H). $^{13}$C NMR (100 MHz, CD$_2$Cl$_2$), δ (ppm): 195.83, 148.52, 147.65, 146.11, 138.64, 135.79, 135.05, 131.09, 130.91, 130.41, 130.18, 129.47, 128.22, 128.10, 127.69, 127.44, 127.41, 127.34, 76.38. HRMS (MALDI-TOF): m/z 499.2073 ([M+H]$^+$, calcd 499.2062).

Through a similar experiment procedure, Model compound 6 was prepared by the oxidative coupling of 1a (43.3 mg, 0.3 mmol) and methoxyl-substituted internal alkyne 5 (250.0 mg, 1.2 mmol) in the presence of Pd(OAc)$_2$ (6.7 mg, 0.03 mmol), Cu(OAc)$_2$.H$_2$O (125.8 mg, 0.63 mmol), and K$_2$CO$_3$ (82.9 mg, 0.6 mmol) in DMSO (3 mL) at 120° C. for 48 h. A mixture of 6a-c was collected as a yellow solid; yield: 41.6%. $^1$H NMR (400 MHz, CDCl$_3$), δ (ppm): 7.34-7.24 (m, 6H), 7.14-7.10 (m, 2H), 7.03-6.88 (m, 7H), 6.66-6.62 (m, 4H), 6.55 (d, J=8.0 Hz, 2H), 6.47 (d, J=8.0 Hz, 2H), 6.20-6.16 (m, 1H), 3.74-3.64 (m, 6H). $^{13}$C NMR (100 MHz, CDCl$_3$), δ (ppm): 196.38, 158.53, 158.36, 150.60, 149.13, 147.68, 147.01, 146.75, 146.39, 145.81, 138.99, 135.67, 134.99, 133.79, 132.32, 131.99, 131.50, 131.43, 130.65, 130.59, 130.33, 130.08, 129.71, 129.25, 128.75, 128.65, 128.32, 128.23, 127.93, 127.87, 127.79, 127.59, 127.47, 127.20, 127.10, 126.91, 126.76, 124.79, 124.33, 113.83, 113.33, 113.27, 75.93, 55.49, 55.14, 55.05. HRMS (MALDI-TOF): m/z 558.2182 (M$^+$, calcd 558.2195).

Characterization Data of the Obtained Polymers

P1a/2a: light yellow solid; yield ~100% [Table 3 (FIG. 6), entry 5]. M$_w$ 21,300; M$_w$/M$_n$ 1.8 (GPC, polystyrene calibration). IR (KBr), ν (cm$^{-1}$): 3053, 2938, 2864, 1661, 1604, 1508, 1393, 1284, 1242, 1176, 1018, 833, 761, 698. $^1$H NMR (400 MHz, CD$_2$Cl$_2$), δ (ppm): 7.37-7.30, 7.15, 7.02-6.94, 6.91-6.87, 6.64, 6.46, 6.16, 3.84, 3.76, 1.70, 1.43. $^{13}$C NMR (100 MHz, CD$_2$Cl$_2$), δ (ppm): 196.23, 158.62, 158.43, 148.29, 147.95, 147.69, 147.34, 147.27, 146.68, 146.60, 146.05, 139.25, 139.13, 139.01, 136.13, 135.38, 133.34, 131.61-127.09, 113.95, 76.16, 68.06, 29.53, 26.20.

P1a/2b: light yellow solid; yield 95%. M$_w$ 24,400; M$_w$/M$_n$ 1.9 (GPC, polystyrene calibration). IR (KBr), ν (cm$^{-1}$): 3051, 2946, 2872, 1660, 1604, 1508, 1393, 1284, 1242, 1176, 1018, 833, 761, 698. $^1$H NMR (400 MHz, CDCl$_3$), δ (ppm): 7.32-7.22, 7.09, 7.00-6.84, 6.64-6.51, 6.41, 6.16, 3.86, 3.77, 1.80. $^{13}$C NMR (100 MHz, CDCl$_3$), δ (ppm): 196.33, 157.96, 157.77, 147.74, 147.45, 147.22, 146.94, 146.83, 146.77, 146.33, 146.28, 145.77, 139.11, 139.00, 138.88, 135.65, 135.00, 131.70-126.75, 113.75, 75.93, 67.15, 26.06.

P1a/2c: light yellow solid; yield 42%. M$_w$ 14,300; M$_w$/M$_n$ 1.5 (GPC, polystyrene calibration). IR (KBr), ν (cm$^{-1}$): 3053, 2929, 2853, 1661, 1604, 1509, 1393, 1285, 1243, 1175, 1020, 832, 761, 697. $^1$H NMR (400 MHz, CDCl$_3$), δ (ppm): 7.32-7.24, 7.11, 7.02-6.85, 6.65-6.59, 6.53, 6.44, 6.17, 3.83, 3.74, 1.71, 1.64, 1.27. $^{13}$C NMR (100 MHz, CDCl$_3$), δ (ppm): 196.38, 158.19, 158.01, 147.80, 147.51, 147.18, 146.90, 146.34, 146.27, 145.73, 139.23, 139.11, 135.78, 135.73, 135.09, 133.17, 131.58-126.73, 113.79, 75.97, 67.86, 29.58, 29.46, 29.37, 26.14.

P1a/2d: yellow solid; yield 87%. M$_w$ 7,300; M$_w$/M$_n$ 1.5 (GPC, polystyrene calibration). IR (KBr), ν (cm$^{-1}$): 3054, 3025, 1664, 1597, 1566, 1493, 1442, 1397, 1235, 1200, 1110, 1071, 1024, 841, 758, 697. $^1$H NMR (400 MHz, CDCl$_3$), δ (ppm): 7.31-6.26, 6.13. $^{13}$C NMR (100 MHz, CDCl$_3$), δ (ppm): 195.95, 148.01, 147.80, 147.22, 146.85, 145.69, 143.79, 143.61, 143.48, 142.33, 141.92, 140.91, 140.65, 140.49, 138.69, 135.28, 135.03, 134.60, 133.49, 132.68, 131.66-126.07, 123.43, 75.93.

P1a/2e: yellow solid; yield 87%. M$_w$ 5,500; M$_w$/M$_n$ 1.4 (GPC, polystyrene calibration). IR (KBr), ν (cm$^{-1}$): 3055, 3027, 1664, 1597, 1566, 1494, 1443, 1397, 1235, 1199, 1111, 1072, 1023, 843, 758, 697. $^1$H NMR (400 MHz, CDCl$_3$), δ (ppm): 7.31-6.27, 6.13. $^{13}$C NMR (100 MHz, CDCl$_3$), δ (ppm): 195.87, 148.01, 147.73, 147.28, 146.98, 145.78, 143.68, 143.35, 142.18, 141.36, 141.06, 140.70, 138.71, 135.33, 134.64, 132.86, 131.69-126.50, 123.43, 75.97.

P1b/2a: light yellow solid; yield 95%. M$_w$ 10,300; M$_w$/M$_n$ 1.9 (GPC, polystyrene calibration). IR (KBr), ν (cm$^{-1}$): 3051, 2938, 2865, 1665, 1604, 1570, 1508, 1470, 1445, 1385, 1285, 1245, 1177, 1109, 1019, 834, 760, 699. $^1$H NMR (400 MHz, CDCl$_3$), δ (ppm): 8.54, 7.58-7.43, 7.31-7.22, 7.12, 6.99, 6.85, 6.62, 6.51-6.41, 3.95, 3.85, 3.77, 1.71, 1.46. $^{13}$C NMR (100 MHz, CDCl$_3$), δ (ppm): 195.38, 159.27, 158.28, 158.17, 149.37, 149.12, 147.52, 146.94, 146.58, 145.87, 135.24, 134.56, 133.16, 131.57, 131.46, 131.39, 130.21, 129.12, 128.43, 128.03, 127.14, 126.51, 124.36, 123.76, 115.28, 114.65, 114.02, 113.90, 75.21, 68.00, 29.25, 26.00.

What is claimed is:

1. A polymer comprising at least one repeating unit selected from the group consisting of:

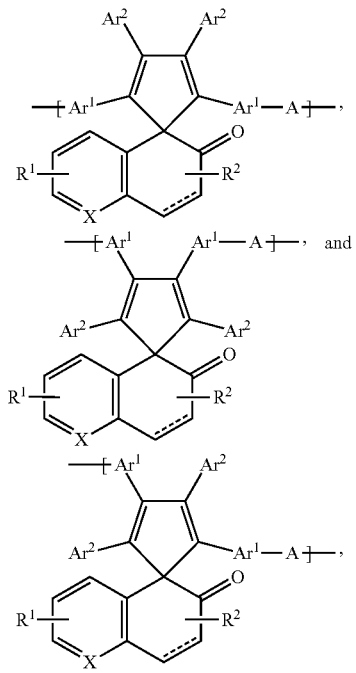

or a salt thereof, wherein
A is selected from the group consisting of:
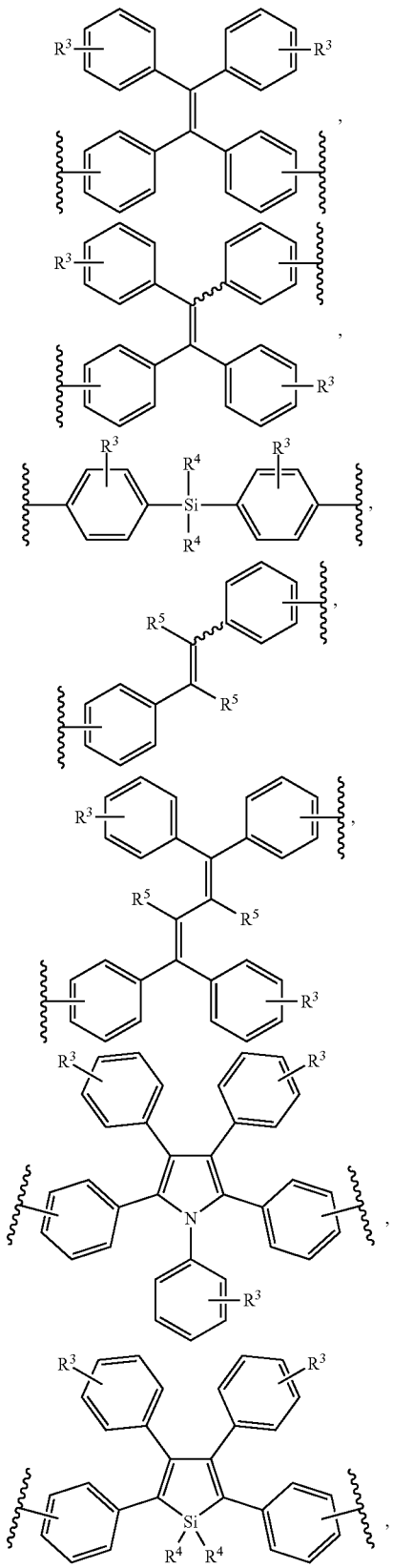
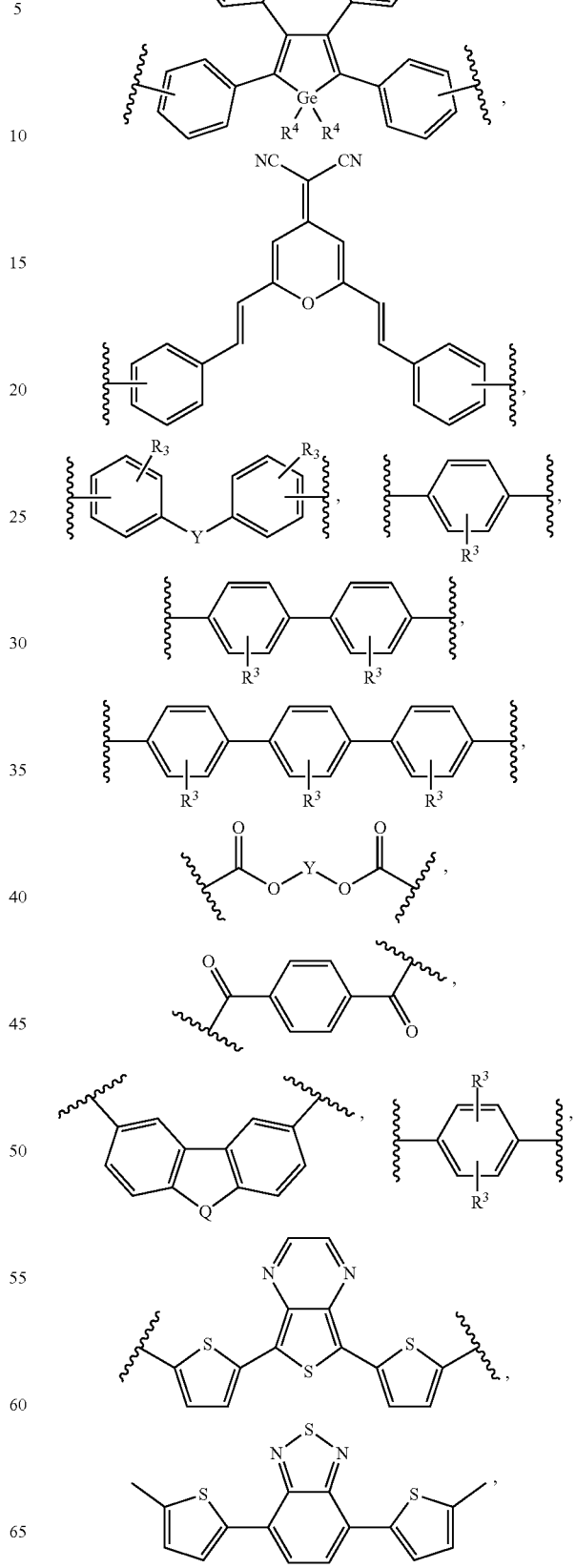

-continued

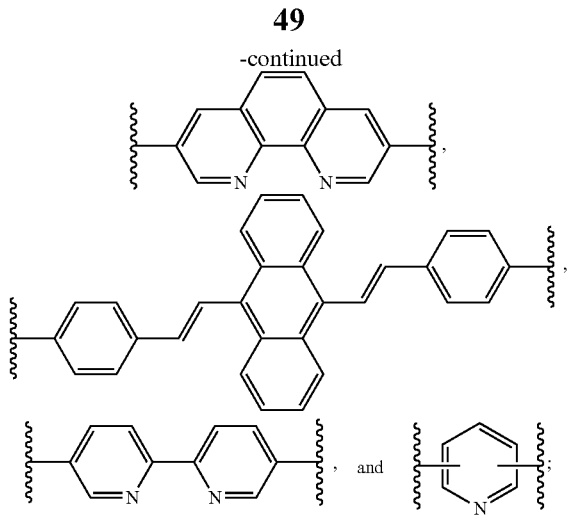
, and

X is N or CR$^1$;

Y is —(CH$_2$)$_m$—, —(CH$_2$)$_m$O—, or —O(CH$_2$)$_m$O—, wherein m is a whole number selected from 1-10;

Q is —CH$_2$—, —O—, —S—, —(C=O)—, —N(R')—;

Ar$^1$ and Ar$^2$ are independently aryl or heteroaryl;

R$^1$ is selected from the group consisting of H, halide, nitro, cyano, —OR$^4$, —SR$^4$, —N(R$^4$)$_2$, —CHO, —CO$_2$R$^4$, —CON(R$^4$)$_2$, alkyl, perhaloalkyl, alkene, alkyne, cycloalkyl, heterocyclyl, aryl, and heteroaryl;

R$^2$ is selected from the group consisting of H, halide, nitro, cyano, —OR$^4$, —SR$^4$, —N(R$^4$)$_2$, —CHO, —CO$_2$R$^4$, —CON(R$^4$)$_2$, alkyl, perhaloalkyl, alkene, alkyne, cycloalkyl, heterocyclyl, aryl, and heteroaryl;

R$^3$ for each instance is independently H, halide, nitro, cyano, —OR$^4$, —SR$^4$, —SO$_2$R$^4$, —N(R$^4$)$_2$, —CHO, —CO$_2$R$^4$, —CON(R$^4$)$_2$, alkyl, alkene, alkyne, cycloalkyl, heterocyclyl, aryl, heteroaryl, diphenylamine, 4-(4-diphenylamino)-phenyl; and R$^4$ for each instance is independently H, alkyl, cycloalkyl, heterocyclyl, aryl, or heteroaryl; or 2 two instances of R$^4$ taken together with the nitrogen to which they are attached form a 3-6 membered heterocyclyl.

2. The polymer of claim 1, wherein the at least one repeating unit is selected from the group consisting of:

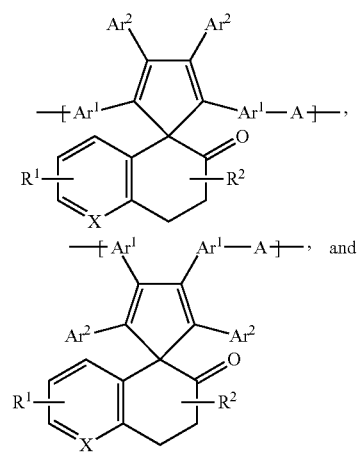

-continued

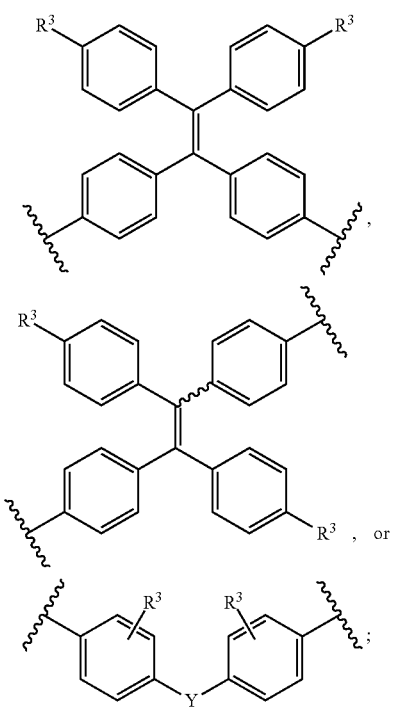

3. The polymer of claim 1, wherein Ar$^1$ and Ar$^2$ are independently aryl.

4. The polymer of claim 1, wherein R$^1$ is H, halide, nitro, cyano, —OR$^4$, —CO$_2$R$^4$, alkyl, cycloalkyl, heterocyclyl, aryl, and heteroaryl.

5. The polymer of claim 1, wherein A is:

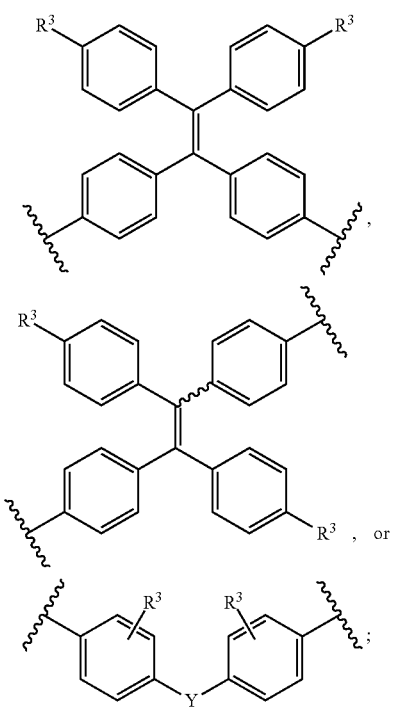

and

R$^3$ for each instance is independently selected from the group consisting of H, halide, nitro, cyano, —OR$^4$, —SR$^4$, —SO$_2$R$^4$, —N(R$^4$)$_2$, —CHO, —CO$_2$R$^4$, alkyl, cycloalkyl, heterocyclyl, aryl, or heteroaryl.

6. The polymer of claim 1, wherein the polymer comprises the repeating unit:

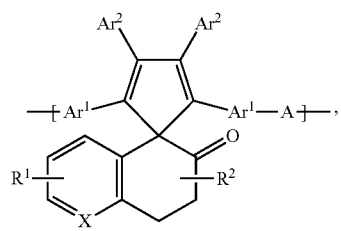

-continued

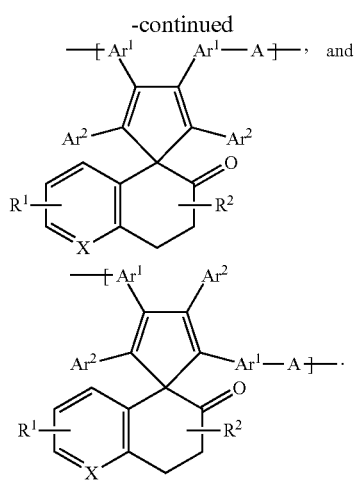
and

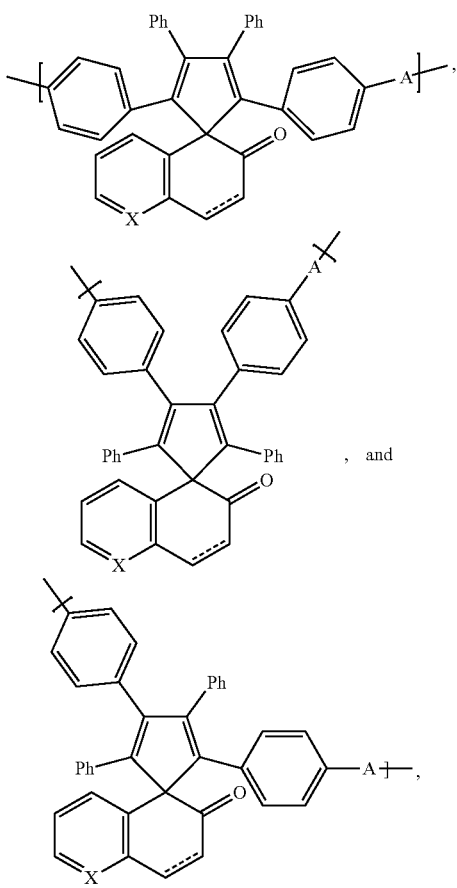

7. The polymer of claim 6, wherein $R^2$ is H; A is:

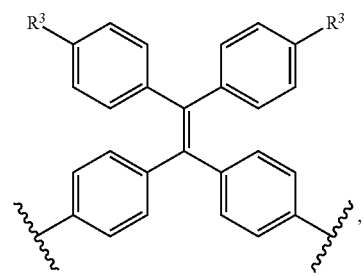

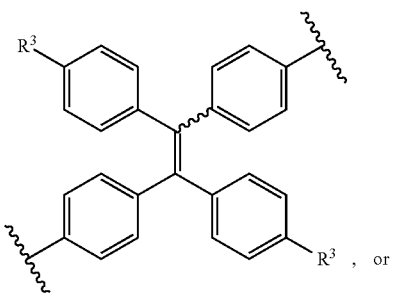, or

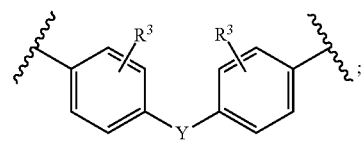;

and $R^3$ for each instance is independently selected from the group consisting of H, halide, nitro, cyano, —OR$^4$, —SR$^4$, —SO$_2$R$^4$, —N(R$^4$)$_2$, —CHO, —CO$_2$R$^4$, alkyl, cycloalkyl, heterocyclyl, aryl, or heteroaryl.

8. The polymer of claim 7, wherein Ar$^2$ is aryl and R$^1$ is H, halide, nitro, cyano, alkyl, cycloalkyl, heterocyclyl, aryl, and heteroaryl.

9. The polymer of claim 1, wherein the polymer comprises the repeating unit:

wherein
X is N or CH;
A is

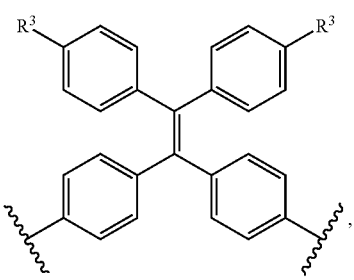

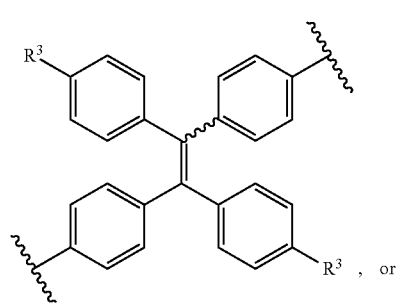, or

-continued

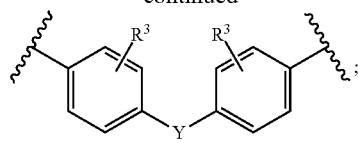

and

R[3] for each instance is independently selected from the group consisting of H, halide, nitro, cyano, —OR[4], —SR[4], —SO$_2$R[4], —N(R[4])$_2$, —CHO, —CO$_2$R[4], alkyl, cycloalkyl, heterocyclyl, aryl, or heteroaryl.

10. The polymer of claim 9, wherein R[3] is H.

11. The polymer of claim 1, wherein the polymer has an average molecular weight of 2,000 to 100,000 amu.

12. A two-dimensional fluorescent photopattern comprising at least one polymer of claim 1.

13. A method of preparing a polymer of claim 1 comprising:

a. contacting a compound of Formula IA:

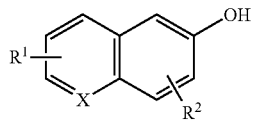

IA or a conjugate salt thereof, wherein

X is N or CR[1];

R[1] is selected from the group consisting of H, halide, nitro, cyano, —OR[4], —SR[4], —N(R[4])$_2$, —CHO, —CO$_2$R[4], —CON(R[4])$_2$, alkyl, alkene, alkyne, cycloalkyl, heterocyclyl, aryl, and heteroaryl;

R[2] is selected from the group consisting of H, halide, nitro, cyano, —OR[4], —SR[4], —N(R[4])$_2$, —CHO, —CO$_2$R[4], —CON(R[4])$_2$, alkyl, perhaloalkyl, alkene, alkyne, cycloalkyl, heterocyclyl, aryl, and heteroaryl; and R[4] for each instance is independently H, alkyl, cycloalkyl, heterocyclyl, aryl, or heteroaryl; or 2 two instances of R[4] taken together with the nitrogen to which they are attached form a 3-6 membered heterocyclyl;

with a compound of Formula IB:

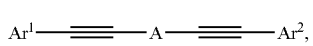

IB wherein

A is selected from the group consisting of:

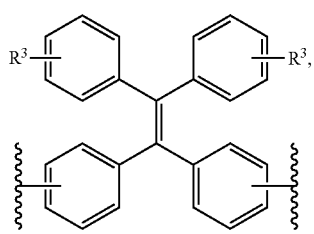

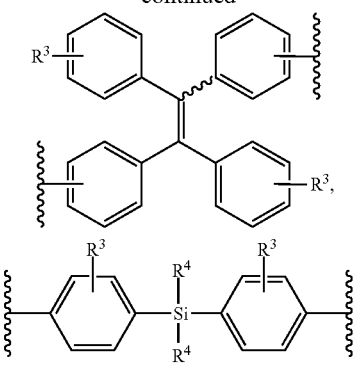

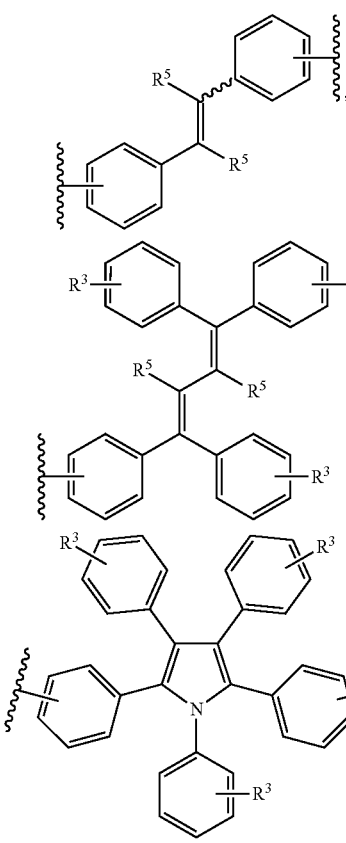

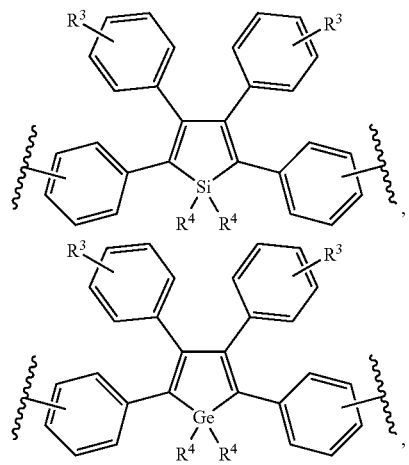

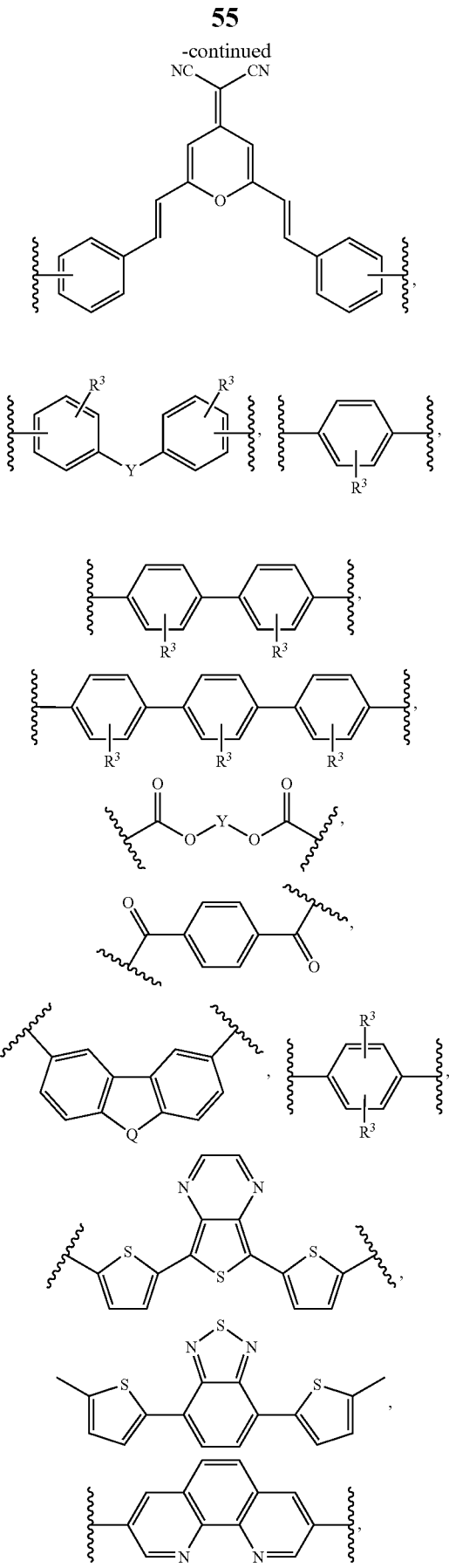

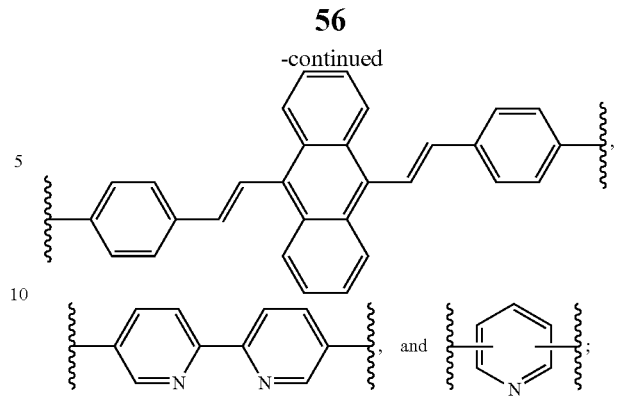

Y is —(CH$_2$)$_m$—, —(CH$_2$)$_m$O—, or —O(CH$_2$)$_m$O—, wherein m is a whole number selected from 2-10;

Ar$^1$ and Ar$^2$ are independently aryl or heteroaryl; and

R$^3$ for each instance is independently H, halide, nitro, cyano, —OR$^4$, —SR$^4$, —SO$_2$R$^4$, —N(R$^4$)$_2$, —CHO, —CO$_2$R$^4$, —CON(R$^4$)$_2$, alkyl, alkene, alkyne, cycloalkyl, heterocyclyl, aryl, heteroaryl, diphenylamine, 4-(4-diphenylamino)-phenyl; and a palladium species thereby forming an unsaturated spirocyclic polymer; and b. optionally contacting the unsaturated spirocyclic polymer with a reducing agent thereby forming a polymer of claim 1.

14. The method of claim 13, wherein A is:

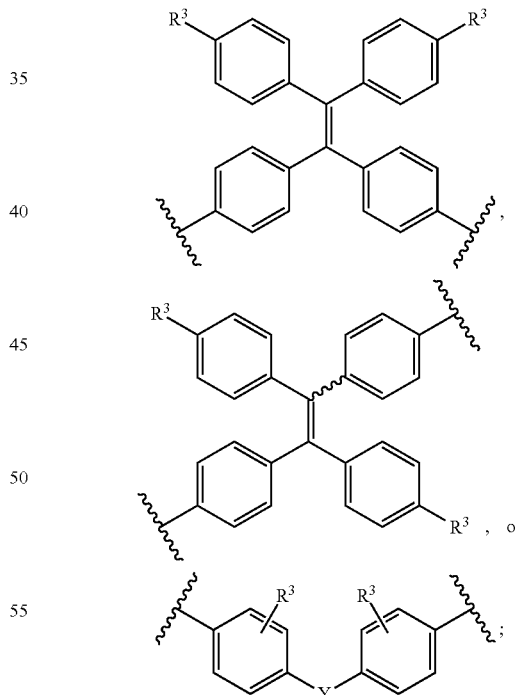

and

R$^3$ for each instance is independently selected from the group consisting of H, halide, nitro, cyano, —OR$^4$, —SR$^4$, —SO$_2$R$^4$, —N(R$^4$)$_2$, —CHO, —CO$_2$R$^4$, alkyl, cycloalkyl, heterocyclyl, aryl, or heteroaryl.

15. The method of claim 14, wherein Ar$^1$ and Ar$^2$ are independently aryl.

16. The method of claim 15, wherein the compound of Formula IB is 2-naphthol or 6-hydroxyquinoline or a conjugate salt thereof.

17. The method of claim 13, wherein the step of contacting the compound of Formula IA, Formula IB, and the palladium species occurs in the presence of a base.

18. The method of claim 13, wherein the palladium species is present in a catalytic amount and the step of contacting the compound of Formula IA, Formula IB, and the palladium species occurs in the presence of an oxidant.

19. The method of claim 13, wherein the compound of Formula IA is present in a molar excess relative to the compound of Formula IB.

20. The method of claim 19, wherein the compound of Formula IA and the compound of Formula IB are present in a molar ratio of 2:1 to 10:1.

* * * * *